US012183775B2

(12) United States Patent
Huang et al.

(10) Patent No.: US 12,183,775 B2
(45) Date of Patent: Dec. 31, 2024

(54) INTEGRATED CIRCUIT WITH FEOL RESISTOR

(71) Applicant: TAIWAN SEMICONDUCTOR MANUFACTURING COMPANY, LTD., Hsinchu (TW)

(72) Inventors: Tien-Chien Huang, Hsinchu (TW); Ruey-Bin Sheen, Hsinchu (TW); Chih-Hsien Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/448,111

(22) Filed: Aug. 10, 2023

(65) Prior Publication Data

US 2023/0402495 A1    Dec. 14, 2023

Related U.S. Application Data

(62) Division of application No. 17/167,624, filed on Feb. 4, 2021.

(60) Provisional application No. 63/016,714, filed on Apr. 28, 2020.

(51) Int. Cl.
| | |
|---|---|
| *H01L 23/64* | (2006.01) |
| *G06F 30/392* | (2020.01) |
| *H01L 49/02* | (2006.01) |
| *H01L 27/02* | (2006.01) |

(52) U.S. Cl.
CPC ............ *H01L 28/24* (2013.01); *G06F 30/392* (2020.01); *H01L 23/647* (2013.01); *H01L 27/0207* (2013.01); *H01L 28/20* (2013.01)

(58) Field of Classification Search
CPC ... H01L 28/24; H01L 23/647; H01L 23/5228; H01L 27/0629; G06F 30/392
See application file for complete search history.

(56) References Cited

U.S. PATENT DOCUMENTS 9,293,452 B1 *  3/2016  Zin .................... H01L 27/0266
9,570,571 B1 *  2/2017  Basker ................ H01L 29/0649
(Continued)

FOREIGN PATENT DOCUMENTS

TW    201926717    7/2019
TW    201937694    9/2019

*Primary Examiner* — Jarrett J Stark
(74) *Attorney, Agent, or Firm* — Hauptman Ham, LLP

(57) ABSTRACT

A method includes forming a shallow trench isolation (STI) region in a semiconductor substrate thereby defining an active region and a passive region in the semiconductor substrate and spaced apart from each other by the STI region, forming a first sacrificial gate structure over the active region and a second sacrificial gate structure over the passive region, forming first source/drain regions in the active region and second source/drain regions in the passive region, after forming the first and second source/drain regions, replacing the first sacrificial gate structure with a metal gate structure and the second sacrificial gate structure with a metal resistor structure, the metal resistor structure corresponding to a dummy gate, forming a first gate contact over the metal gate structure, and a pair of resistor contacts over the metal resistor structure, and electrically coupling a set of metal lines with the metal resistor structure by the pair of resistor contacts.

20 Claims, 65 Drawing Sheets

(56) References Cited

U.S. PATENT DOCUMENTS

| | | | |
|---|---|---|---|
| 2002/0123202 A1* | 9/2002 | Amishiro | H01L 27/0802 |
| | | | 257/E27.047 |
| 2007/0267685 A1* | 11/2007 | Ishibashi | H01L 28/20 |
| | | | 257/E27.035 |
| 2011/0156162 A1* | 6/2011 | Richter | H01L 27/0629 |
| | | | 438/238 |
| 2011/0284966 A1* | 11/2011 | Wen | H01L 21/823493 |
| | | | 257/E27.06 |
| 2013/0049168 A1* | 2/2013 | Yang | H01L 27/0629 |
| | | | 257/E27.024 |
| 2013/0049924 A1* | 2/2013 | Yang | H01L 27/0629 |
| | | | 257/E21.004 |
| 2013/0178039 A1* | 7/2013 | Ko | H01L 21/20 |
| | | | 257/E21.004 |
| 2013/0249010 A1* | 9/2013 | Ng | H01L 29/66545 |
| | | | 257/E21.639 |
| 2013/0277754 A1* | 10/2013 | Liang | H01L 27/0629 |
| | | | 257/379 |
| 2014/0010027 A1* | 1/2014 | Fujiwara | G11C 7/12 |
| | | | 365/189.09 |
| 2014/0210014 A1* | 7/2014 | Ma | H01L 21/823475 |
| | | | 257/379 |
| 2017/0221821 A1* | 8/2017 | Hu | H10B 43/27 |
| 2019/0088769 A1* | 3/2019 | Matsushita | H01L 27/0664 |
| 2020/0066712 A1 | 2/2020 | Hafez et al. | |
| 2020/0105906 A1 | 4/2020 | Yeoh et al. | |
| 2021/0028164 A1* | 1/2021 | Shin | H01L 29/42392 |
| 2021/0335991 A1* | 10/2021 | Huang | G06F 30/392 |
| 2022/0068378 A1* | 3/2022 | Chih | G11C 13/003 |

* cited by examiner

INTEGRATED CIRCUIT WITH FEOL RESISTOR

PRIORITY CLAIM

This application is a divisional of U.S. application Ser. No. 17/167,624, filed Feb. 4, 2021, which claims the benefit of U.S. Provisional Application No. 63/016,714, filed Apr. 28, 2020, which is incorporated herein by reference in its entirety.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1F-1L illustrate cross-sectional views of intermediate stages in the formation of the integrated circuit in accordance with some embodiments of the present disclosure.

DETAILED DESCRIPTION

Figure 1A:
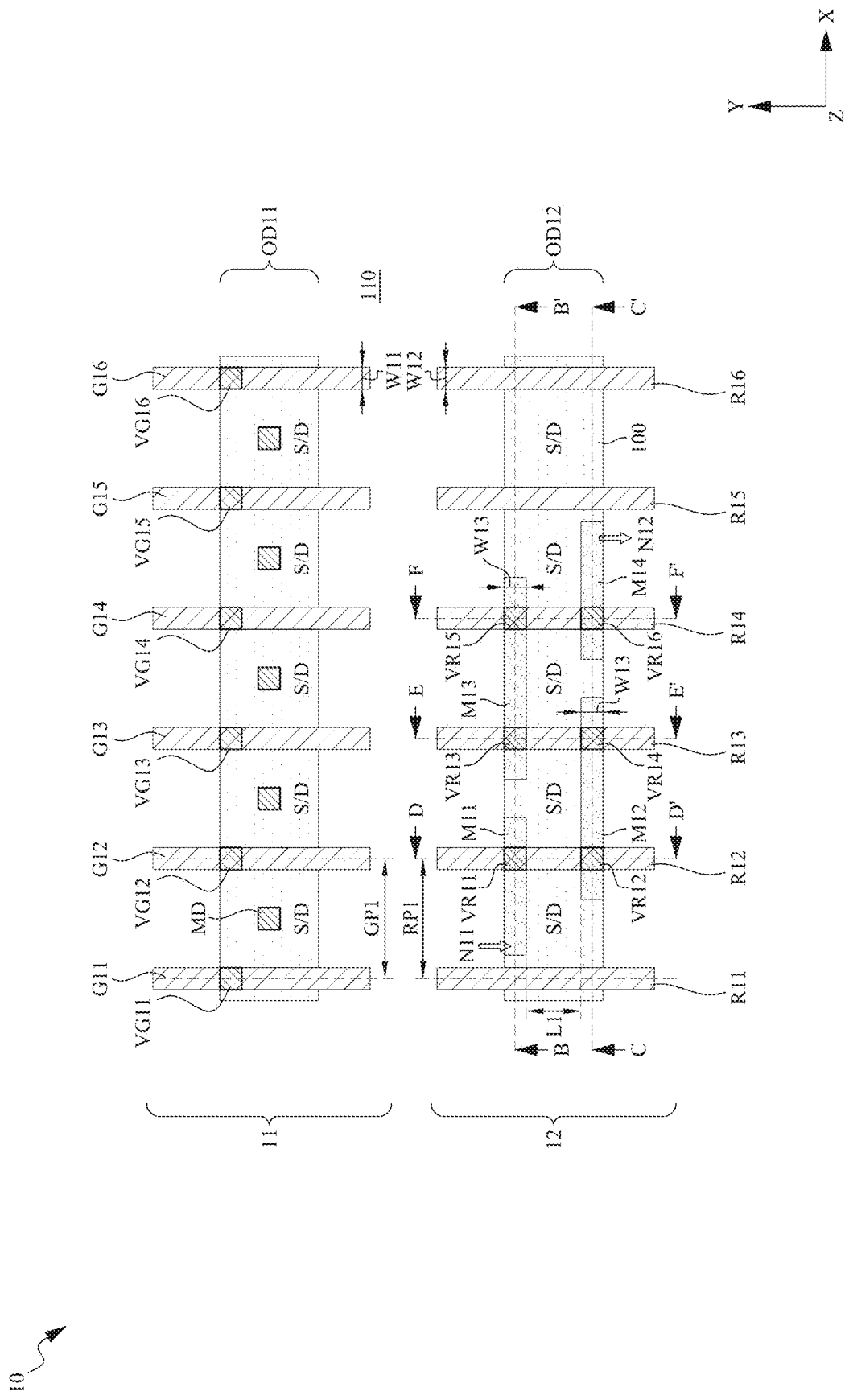
FIGS. 1A-1C illustrate different views of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

TiN resistors can be formed on a semiconductor substrate in addition to the CMOS devices. However, fabrication of such TiN resistors may use additional processes (e.g., additional photolithography, deposition and/or etching processes) in the front-end-of-line (FEOL) process.

The present disclosure in various embodiments provides dummy metal gates (i.e., metal gates not functioning that do not create channels in underlying regions of semiconductor substrate) to serve as metal resistors. In some embodiments, the dummy gates are part of corresponding dummy transistors. In some embodiments, a dummy transistor is a non-functional transistor. In some embodiments, a non-functional transistor is a transistor with a non-functional channel. In some embodiments, a non-functional transistor is a transistor without drain or source contacts in the source or drain regions. For example, in some embodiments, the dummy gate is a gate-like structure disposed between two doped semiconductor regions, wherein the doped semiconductor regions are free of any metal contact. In this way, the dummy gate and the contact-free doped semiconductor regions form a non-functional or dummy transistor (i.e., a transistor-like structure not functioning and thus does not create a channel under the dummy gate and between the contact-free doped semiconductor regions). These dummy metal gates can be fabricated simultaneously with functional metal gates (i.e., metal gates functioning and thus create channels in underlying regions of semiconductor substrate) in a same gate replacement process, and thus fabrication of the metal resistors will not result in additional processes and hence additional cost compared to other approaches. Therefore, at least one advantage of various embodiments of the present disclosure is that metal resistors can be formed together with (i.e., simultaneously with) the metal gate structures in a same gate replacement process, and thus fabrication of the metal resistors of the present disclosure uses less process steps and hence reducing cost. Another advantage of some embodiments of the present disclosure is that a total resistance of resistor circuit can be tuned flexibly by designing dummy metal gate layout patterns or structure, dummy gate via layout patterns or structure and/or metal line patterns or structure, so that the total resistance value of the resistor circuit may be up to several KΩ, which is not practical or achievable with TiN resistors of other approaches. Yet another advantage of some embodiments of the present disclosure is that the resistance to electro-migration can be tuned by designing the dummy gate via layout patterns or structures and/or metal line patterns or structures. Moreover, one or more dummy metal gates can be connected in series and/or in parallel to serve as a resistor circuit by using dummy gate vias formed over the corresponding dummy metal gates, and metal lines formed over the dummy gate vias. In this way, a total resistance of the resistor circuit can be tuned by designing dummy metal gate layout patterns, dummy gate via layout patterns and/or metal line patterns.

Figure 1B:
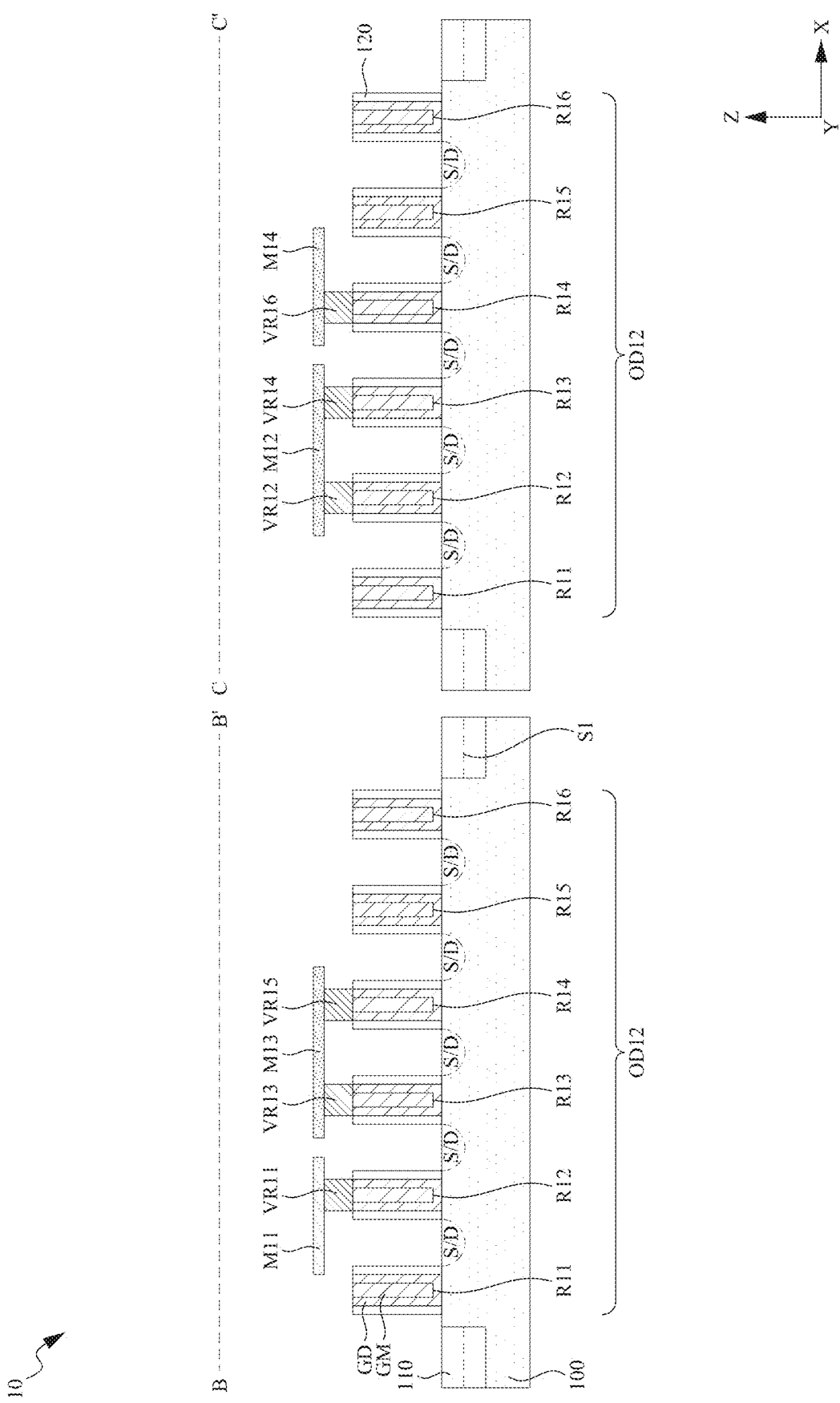
Figure 1C:
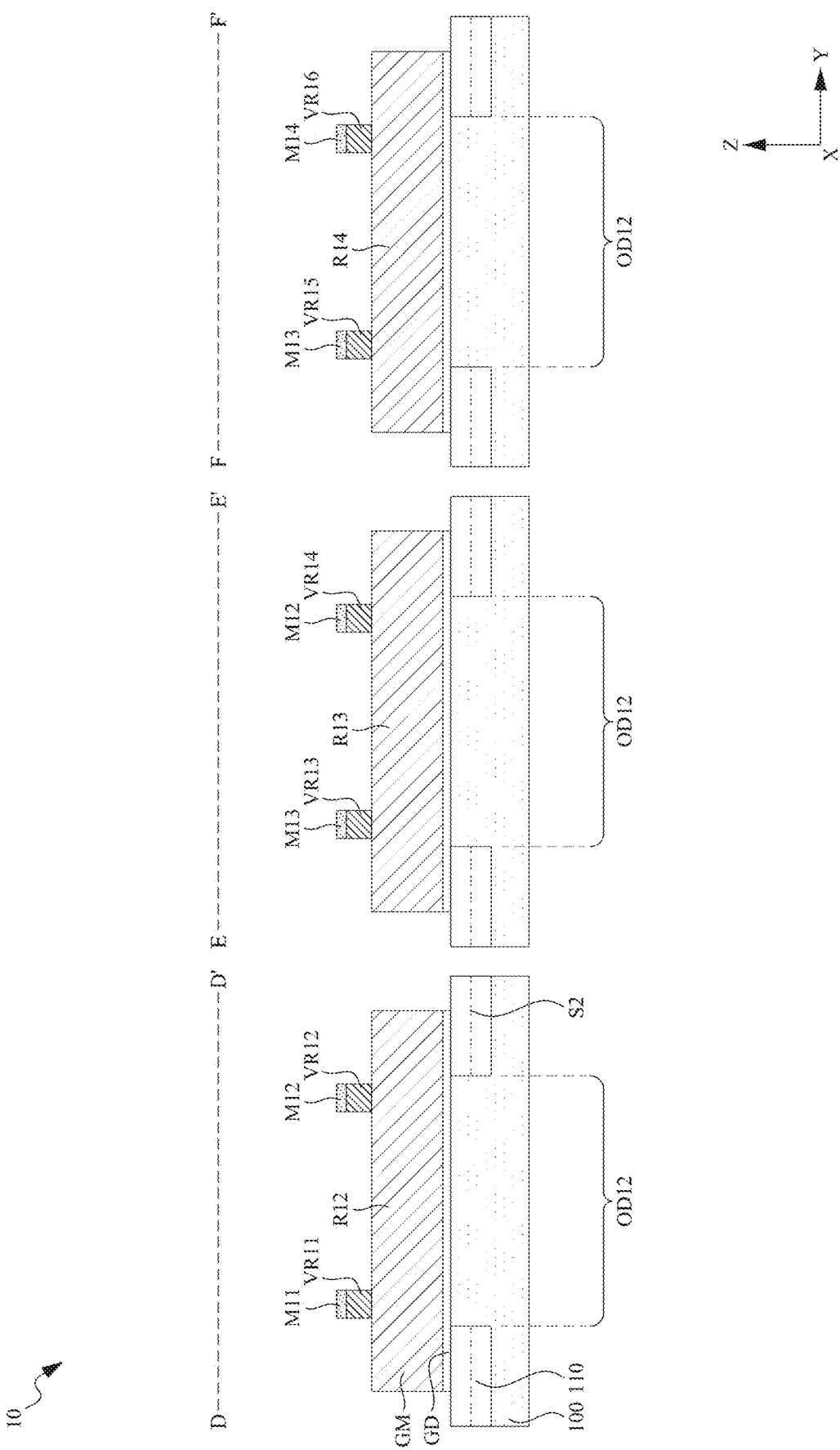

FIGS. 1A-1C illustrate a resistor circuit including dummy gate contacts (also called resistor contacts in this context) overlapping passive region, in accordance with some embodiments. FIG. 1A illustrates a top view of an exemplary integrated circuit 10 having a transistor region 11 and a resistor region 12 in accordance with some embodiments of the present disclosure. FIG. 1B illustrates a cross-sectional view of the integrated circuit 10 in accordance with some embodiments, wherein the cross-sectional view combines a cross-sectional view obtained from the vertical plane containing line B-B' in FIG. 1A and a cross-sectional view obtained from the vertical plane containing line C-C' in FIG. 1A. FIG. 1C illustrates a cross-sectional view of the integrated circuit 10 in accordance with some embodiments, wherein the cross-sectional view combines a cross-sectional view obtained from the vertical plane containing line D-D' in FIG. 1A, and a cross-sectional view obtained from the vertical plane containing line E-E' in FIG. 1A and a cross-sectional view obtained from the vertical plane containing line F-F' in FIG. 1A. The integrated circuit 10 is a non-limiting example for facilitating the illustration of the present disclosure.

Reference is made to FIGS. 1A-1C. The integrated circuit 10 includes a substrate 100. The substrate 100 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 100 may include an epitaxial layer (epi-layer), which may be strained for performance enhancement, and/or may include a silicon-on-insulator (SOI) structure.

The substrate 100 includes an active region OD11 extending along the X-direction within the transistor region 11 and a passive region OD12 extending along the X-direction within the resistor region 12. In some embodiments, the passive region OD12 is an active region of a dummy transistor device that is in resistor region 12. For example, in some embodiments, the passive region OD12 is similar to the active region OD11, but is part of a passive device, and similar detailed description is omitted. In some embodiments, the X-direction is a horizontal direction of the top view of the integrated circuit 10. In some embodiments, the X-direction is a direction other than horizontal direction. The transistor region 11 may include a variety of active devices, such as P-channel field effect transistors (PFETs), N-channel field effect transistors (NFETs), metal-oxide semiconductor field effect transistors (MOSFETs), complementary metal-oxide semiconductor transistors (CMOSs), bipolar transistors, high voltage transistors, high frequency transistors, and/or combinations thereof formed on the active region OD11. The resistor region 12 may include a variety of passive devices in various embodiments, such as resistors and other passive devices such as capacitors, inductors, fuses, or other suitable passive devices formed on the passive region OD12. In certain embodiments of the present disclosure, the integrated circuit 10 includes metal gate transistors formed over the active region 11 and metal resistors formed over the passive region 12.

The integrated circuit 10 further includes one or more isolation regions, such as a shallow trench isolation (STI) region 110 formed in the semiconductor substrate 100 to define and electrically isolate the active region OD11 and the passive region OD12. Formation of the STI region 110 includes patterning the semiconductor substrate 100 to form one or more trenches in the substrate 100 by using suitable photolithography and etching techniques, depositing one or more dielectric materials (e.g., silicon oxide) to completely fill the trenches in the substrate 100, followed by a planarization process (e.g., chemical mechanical polish (CMP) process) to level the STI region 110 with the active region OD11 and the passive region OD12. The dielectric materials of the STI region 110 may be deposited using a high density plasma chemical vapor deposition (HDP-CVD), a low-pressure CVD (LPCVD), sub-atmospheric CVD (SACVD), a flowable CVD (FCVD), spin-on coating, and/or the like, or a combination thereof. After the deposition, an anneal process or a curing process may be performed, especially when the STI region 110 is formed using flowable CVD. Although the cross-sections of the STI region 110 illustrated in FIGS. 1B-1C have vertical sidewalls, they may have tapered sidewalls due to nature of etching processes.

In the depicted embodiment, the active region OD11 and passive region OD12 have top surfaces substantially level with a top surface of the STI region 110. In some other embodiments, the STI region 110 is further recessed (e.g., by an etch back process) to fall below the top surfaces of the active region OD11 and the passive region OD12, such that the active region OD11 and the passive region OD12 protrude above the top surface of the recessed STI region 110 (as indicated by the dash lines S1 in FIG. 1B and dash lines S2 in FIG. 1C) to form fin-like structures, which in turn allows for forming fin-type field effect transistors (FinFETs) over the active region OD11.

The integrated circuit 10 further includes metal gate structures G11, G12, G13, G14, G15 and G16 extending within the transistor region 11 and across the active region OD11 along the Y-direction perpendicular to the X-direction, and metal resistor structures R11, R12, R13, R14, R15 and R16 extending within the resistor region 12 and across the passive region OD12 along the Y-direction. The metal gate structures G11-G16 have a strip shape from top view and are thus interchangeably referred to as metal gate strips in this context. Similarly, the metal resistor structures R11-R16 can be interchangeably referred to as metal resistor strips in this context. In some embodiments as illustrated in FIG. 1A, the metal gate structures G11-G16 are arranged in a first row along the X-direction, and the metal resistor structures R11-R16 are arranged in a second row along the X-direction. The metal resistor structures R11-R16 and metal gate structures G11-G16 are on same level height. The metal resistor structures R11-R16 are formed simultaneously with the metal gate structures G11-G16, and thus the metal resistor structures R11-R16 can be formed without using additional processes and hence additional cost. Moreover, because of simultaneous formation of the metal resistors and metal gates, the metal resistor structures R11-R16 are formed of same material(s) as the metal gate structures G11-G16, without additional metal materials.

In some embodiments, the metal gate structures G11-G16 are functional high-k metal gate (HKMG) gate structures functioned to create channels in the active region OD11, and the metal resistor structures R11-R16 are dummy HKMG gate structure not functioning and do not create channels in the passive region OD12. Both the functional HKMG gate structures G11-G16 and the dummy HKMG structures R11-R16 are formed using a same gate-last process flow (interchangeably referred to as gate replacement flow), which will be explained in greater detail below. As a result of the gate-last process flow, each of the metal gate structures G11-G16 and the metal resistor structures R11-R16 includes one or more gate metals GM and a gate dielectric layer GD lining a bottom surface and sidewalls of the one or more gate metals GM, so that the gate dielectric layer GD has a U-shaped cross section as illustrated in FIG. 1B. In some embodiments, the gate dielectric layer GD includes a stack of an interfacial dielectric material and a high-k dielectric material. In some embodiments, the interfacial dielectric material includes silicon dioxide. Exemplary high-k gate dielectric materials include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. The gate metal(s) is formed over the gate dielectric. Exemplary gate metal(s) GM is a single layer structure or a multi-layer structure including, for example, copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

In the depicted embodiment as illustrated in FIG. 1A, the metal gate structures G11-G16 are equidistantly arranged along the X-direction at a gate pitch GP1 (i.e., center-to-center spacing between neighboring gate structures), and the metal resistor structures R11-R16 are equidistantly arranged along the X-direction at a resistor pitch RP1 (i.e., center-to-center spacing between neighboring metal resistor structures). In some embodiments, the resistor pitch RP1 is substantially equal to the gate pitch GP1 for reducing pattern loading effect during fabricating the metal gate structures G11-G16 and metal resistor structures R11-R16 (e.g. loading effect (e.g., dishing) occurring in a CMP process used to remove excessive gate metal materials). In some other embodiments where the integrated circuit has more relaxed requirements about the loading effect in fabrication of the metal gate structures G11-G16 and metal resistor structures R11-R16, the resistor pitch RP1 may be greater or less than the gate pitch GP1.

In the depicted embodiment as illustrated in FIG. 1A, the metal gate structures G11-G16 each have a gate width W11 measured in the X-direction, and the metal resistor structures R11-R16 each have a resistor width W12 measured in the X-direction and substantially equal to the gate width W11. Same width of metal gates and metal resistors also aids in preventing pattern loading effect during their fabrication processes. In some other embodiments where the integrated circuit has more relaxed concern about the loading effect in fabrication of the metal gate structures G11-G16 and metal resistor structures R11-R16, the resistor width W12 may be greater or less than the gate width W11.

In the depicted embodiment as illustrated in FIG. 1A, the metal resistor structures R11-R16 are respectively aligned with the metal gate structures G11-G16 in the Y-direction. In this configuration, the metal resistor structures R11-R16 and the corresponding metal gate structures G11-G16 can be formed by using a gate cut process. By way of example and not limitation, fabrication of the metal resistor structure R11 and the metal gate structure G11 may include forming as a single continuous HKMG strip extending along the Y-direction from top view, followed by etching the single continuous HKMG strip to break it into separate strips that respectively serve as the metal resistor structure R11 and the metal gate structure G11. Although FIG. 1A illustrates an alignment arrangement, in some other embodiments the metal resistor structures R11-R16 can be misaligned with each of the metal gate structures G11-G16 in the Y-direction.

The integrated circuit 10 further includes a plurality of source/drain regions S/D in the active region OD11 and the passive region OD12. The source/drain regions S/D are doped semiconductor regions located on opposite sides of the corresponding metal gate structures G11-G16 and metal resistor structures R11-R16. In some embodiments, the source/drain regions S/D include p-type dopants or impurities such as boron for forming functional p-type FETs in the active region OD11 and non-functional or dummy p-type FETs in the passive region OD12. In some other embodiments, the source/drain regions S/D include n-type dopants or impurities such as phosphorus for forming functional n-type FETs in the active region OD11 and non-functional or dummy FETs in the passive region OD12.

In the depicted embodiment as illustrated in FIG. 1A, the integrated circuit 10 further includes a plurality of source/drain contacts MD landing on the respective source/drain regions S/D within the active region OD11. In some embodiments, one or more of the source/drain regions S/D within the passive region OD22 do not include source/drain contacts landing on the corresponding one or more source/drain regions S/D within the passive region OD12. In some embodiments, the source/drain regions S/D in the passive region OD12 are not electrically coupled to the metal line(s) in the overlying interconnect structure. Therefore, the source/drain regions S/D within the passive region OD12 are electrically floating while the source/drain regions S/D within the active region OD11 are electrically coupled to metal lines in overlying interconnect structure (not shown for the sake of clarity) by using the source/drain contacts MD. As a result, the source/drain regions S/D in the active region OD11 form functional transistors (i.e., transistors functioned to create channels in the active region OD11) with the corresponding metal gate structures G11-G16, while the electrically floating source/drain regions S/D in the passive region OD12 form non-functional or dummy transistors (i.e., transistor-like structures not functioned to create channels in the passive region OD12) with the metal resistor structures R11-R16. In some embodiments, the source/drain contacts MD includes suitable one or more metals, such as W, Cu the like or combinations thereof.

In some embodiments, the source/drain regions S/D may be epitaxially grown regions. For example, gate spacers 120 may be formed alongside sacrificial gate structures (which will be replaced with the metal gate structures G11-G16 and the metal resistor structures R11-R16) by depositing a spacer material and anisotropically etching the spacer material, and subsequently, the source/drain regions S/D may be formed self-aligned to the gate spacers 120 by first etching the active region OD11 and the passive active region OD12 to form recesses, and then depositing a crystalline semiconductor material in the recesses by a selective epitaxial growth (SEG) process that may fill the recesses in the active region OD11 and the passive region OD12 and may extend further beyond the original surface of the active region OD11 and the passive region OD12 to form raised source/drain epitaxy structures in some embodiments. The crystalline semiconductor material may be an elemental semiconductor (e.g., Si, or Ge, or the like), or an alloy semiconductor (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of n-type or p-type dopants may be introduced into source/drain regions S/D either in situ during SEG, or by an ion implantation process performed after the SEG, or by a combination thereof.

The integrated circuit 10 further includes a plurality of gate contacts VG11, VG12, VG13, VG14, VG15 and VG16 over the corresponding metal gate structures G11-G16, respectively. The integrated circuit 10 further includes dummy gate contacts (interchangeably referred to as resistor contacts in this context) VR11 and VR12 over the metal resistor structure R12, resistor contacts VR13 and VR14 over the metal resistor structure R13, and resistor contacts VR15 and VR16 over the metal resistor structure R14. The resistor contacts VR11-VR16 are formed simultaneously with the gate contacts VG11-VG16, and thus the resistor contacts VR11-VR16 are formed of same material(s) as the gate contacts VG11-VG16. In some embodiments, the resistor contacts VR11-VR16 and the gate contacts VG11-VG16 include a conductive material such as, for example, copper (Cu), tungsten (W) cobalt (Co) or other suitable metals. In some embodiments, the resistor contacts VR11-VR16 and the gate contacts VG11-VG16 are formed of W and/or Cu without TiN, which in turn results in a reduced resistance in a resistor circuit comprising the resistor contacts VR11-VR16. Moreover, because the gate contacts (e.g., gate contacts VG11-VG16) are formed of W and/or Cu without TiN, the resistor contacts VR11-VR16 formed of W and/or Cu without TiN can be fabricated simultaneously with the gate contacts, so that the resistor contacts VR11-VR16 can be formed without additional cost. Moreover, in specific embodiments the resistor contacts VR11-VR16 and the gate contacts VG11-VG16 are formed of W without Cu, because the sheet resistance of W is about five times more than the sheet resistance of Cu.

Formation of the resistor contacts VR11-VR16 and the gate contacts VG11-VG16 includes, for example, etching contact openings in an interlayer dielectric (ILD) layer (not shown) over the metal gate structures G11-G16 and metal resistor structures R11-R16, depositing one or more conductive materials in the contact openings, and planarizing the one or more conductive materials by using, for example, a CMP process.

The integrated circuit 10 further includes a plurality of metal lines M11, M12, M13 and M14 on a level above the gate contacts VG11-VG16 and resistor contacts VR11-VR16. In some embodiments, the metal lines M11-M14 are on a metal 0 (M0) layer or metal 1 (M1) layer. Other metal layers are within the scope of the present disclosure. The metal lines M11-M14 extend along the X-direction perpendicular to the Y-direction along which the metal resistor structures R11-R16 extend. The metal line M11 extends across an upper section of the metal resistor structure R12. The resistor contact VR11 is located where the metal line M11 overlaps the metal resistor structure R12, thus providing an electrical connection between the metal line M11 and the metal resistor structure R12. The metal line M12 extends across both lower sections of the metal resistor structures R12 and R13, and is electrically connected to the metal resistor structure R12 by the resistor contact VR12, and to the metal resistor structure R13 by the resistor contact VR14. The metal line M13 extends across both upper sections of the metal resistor structures R13 and R14, and is electrically connected to the metal resistor structure R13 by the resistor contact VR13 and to the metal resistor structure R14 by the resistor contact VR15. The metal line M14 extends across a lower section of the metal resistor structure R14, and is electrically connected to the metal resistor structure R14 by the resistor contact VR16.

Figure 1D:
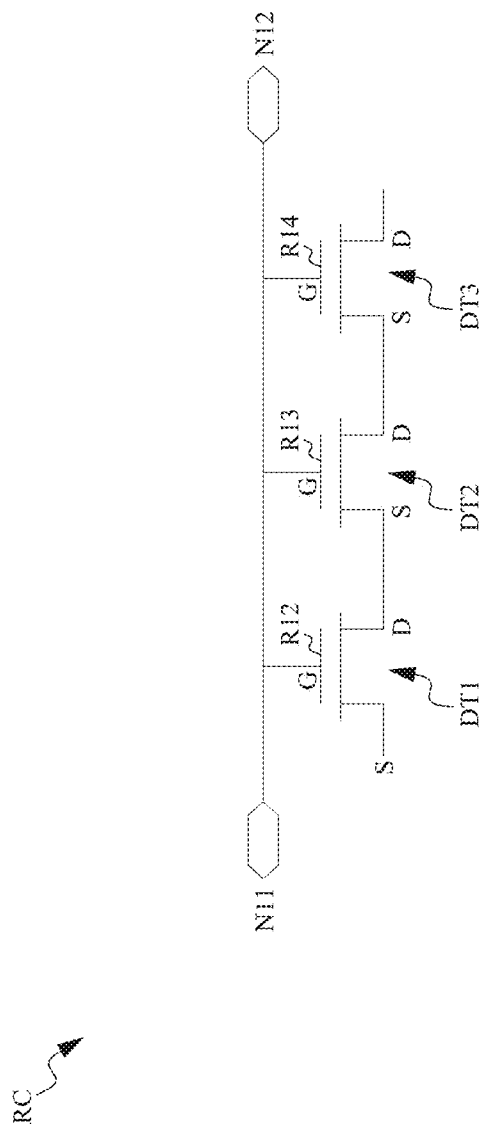
FIG. 1D is a schematic diagram illustrating a relationship between a resistor circuit and dummy transistors in accordance with some embodiments of the present disclosure.
Figure 1E:
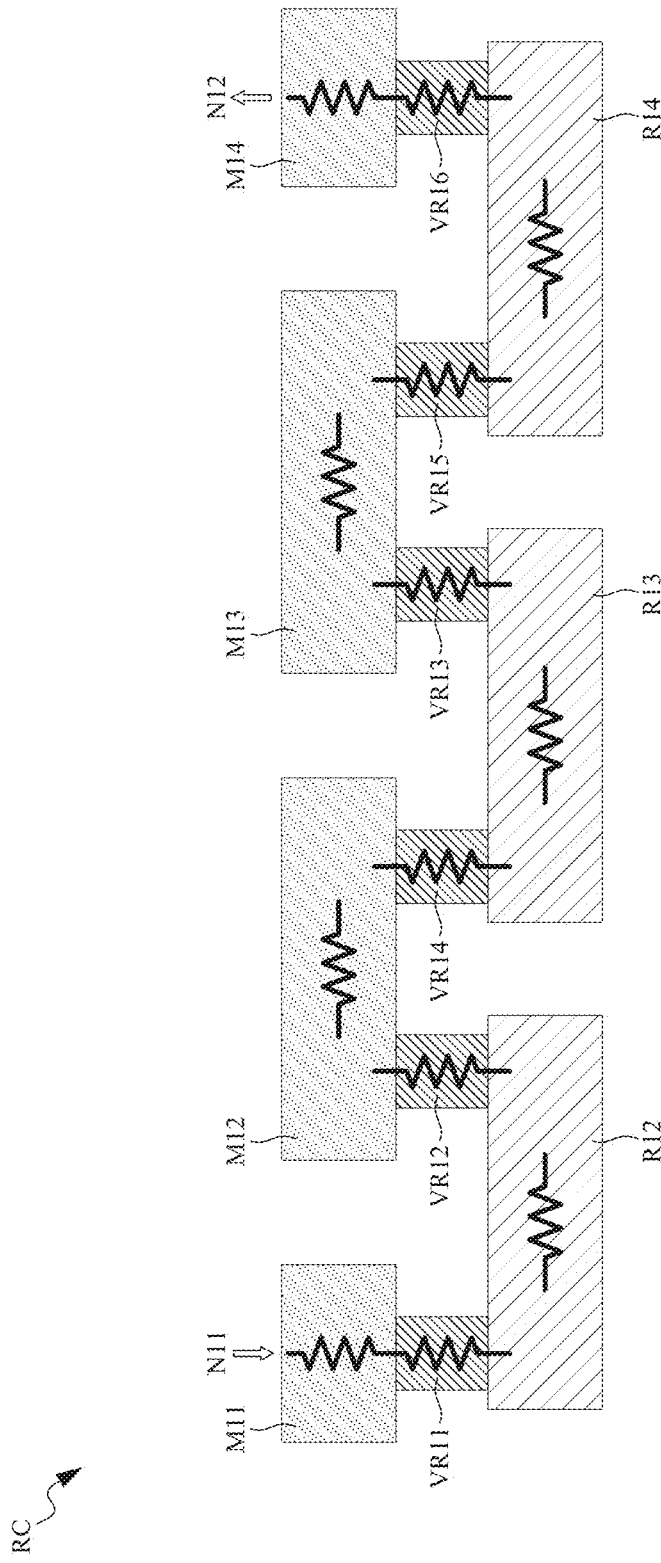
FIG. 1E is a schematic circuit diagram of the resistor circuit in accordance with some embodiments of the present disclosure.

The metal resistor structures R12-R14, the resistor contacts VR11-VR16, and the metal lines M11-M14 are connected to form a resistor circuit RC having a first node N11 at an end of the metal line M11 and a second node N12 at an end of the metal line M14. FIG. 1D is a schematic diagram illustrating the relationship between the resistor circuit RC and dummy transistors DT1-DT3. FIG. 1E is a schematic circuit diagram of the resistor circuit RC of FIG. 1D. As illustrated in FIG. 1D, the resistor circuit RC includes the metal resistor structures R12-R14 connected in series between the first node N11 and the second node N12, wherein the metal resistor structures R12-R14 are respectively dummy gates of the dummy transistors DT1-DT3 each having electrically floating source/drain regions. By way of example and not limitation, the resistor circuit RC includes a series connection of the metal line M11, the resistor contact VR11, the metal resistor structure R12, the resistor contact VR12, the metal line M12, the resistor contact VR14, the metal resistor structure R13, the resistor contact VR13, the metal line M13, the resistor contact VR15, the metal resistor structure R14, the resistor contact VR16, and the metal line M14. As a result, a total resistance of the resistor circuit RC (i.e., the resistance between the first and second nodes N11 and N12) is the sum of the resistances of the metal lines M11-M14, the resistances of the resistor contacts VR11-VR16, and the resistances of the metal resistor structures R12-R14. In some embodiments, the resistance of each metal resistor structure is in a range from about 0.1 times the resistance of TiN resistor to about 1000 times the resistance of TiN resistor, and the resistance of each resistor contact is in a range from about 0.1 times the resistance of TiN resistor's via to about 1000 times the resistance of TiN resistor's via. If the resistance of the metal resistor structure or the resistor contact is excessively low (less than the above range), unwanted leakage current might occur. If the resistance of the metal resistor structure or the resistor contact is excessively high (greater than the above range), a parallel circuit of numerous metal resistor structures and/or resistor contacts is used to achieve low target resistance value.

The total resistance of the resistor circuit RC can be tuned by adjusting one or more of the resistances of the metal lines M11-M14, the resistances of the resistor contacts VR11-VR16, and/or the resistances of the metal resistor structures R12-R14. By way of example and not limitation, the resistances of the metal resistor structures R12-R14 are in positive correlation with the Y-directional distance L1 between upper-row resistor contacts VR11, VR13, VR15 and the corresponding lower-row resistor contacts VR12, VR14, VR16, and thus the Y-directional distance L1 can be selected depending on a desired total resistance of the resistor circuit RC. For example, in some embodiments, the Y-directional distance L1 between the upper-row resistor contacts and the lower-row resistor contacts is in a range from about 5% of the resistor pitch RP1 (i.e., gate pitch GP1) to about 1400% of the resistor pitch RP1. Excessively short Y-directional distance L1 might lead to increased challenge on the lithography process of forming resistor contacts VR11-VR16 and metal lines M11-M14 with low manufacturing yield. Excessively small resistor pitch RP1 might lead to increased challenge on the lithography process of forming sacrificial gates that are to be replaced with the metal resistor structures R12-R16 with low manufacturing yield.

Moreover, the resistances of the metal lines M11-M14 are in negative correlation with the line width W13 of the metal lines M11-M14, and thus the metal line width W13 can be selected depending on a desired total resistance of the resistor circuit RC. By way of example and not limitation, the metal line width W13 is in a range from about 8% of the resistor pitch RP1 to about 200% of the resistor pitch RP1. Excessively small line width W13 might lead to increased challenge on the lithography process of forming metal lines M11-M14 with low manufacturing yield. Moreover, in some embodiments where the passive region OD12 is a fin structure protruding above the STI region 110, central portions of the metal resistor structures R11-R16 (also called "on-OD portions" hereinafter) wrapping around three sides of the passive region OD12 may have increased topography than periphery portions (also called "on-STI portions" hereinafter) of the metal resistor structures R11-R16 overlapping the STI region 110. In some embodiments, such topography differences result in on-OD portions of the metal resistor structures R11-R16 having a different resistance than on-STI portions of the metal resistor structures R11-R16. For example, in some embodiments, where the passive region OD12 is a fin structure protruding above the STI region 110, the on-OD portions of the metal resistor structures R11-R16 have a greater resistance than the on-STI portions of the metal resistor structures R11-16. Therefore, the locations of the resistor contacts can be selected depending on desired resistances of the metal resistor structures R11-R16. For example, in some embodiments, for the resistor circuit of FIG. 1A where the passive region OD12 is a fin structure protruding above the STI region 110, the resistor contacts VR11, VR12 overlap the on-OD portion of the metal resistor structure R12, the resistor contacts VR13, VR14 overlap the on-OD portion of the metal resistor structure R13, and the resistor contacts VR15, VR16 overlap the on-OD portion of the metal resistor structure R14, such that the on-OD portions of the metal resistor structures R12-R14 also function as part of the resistor circuit RC and can provide a higher resistance for the resistor circuit RC than approaches without fin structures.

FIGS. 1F-1L illustrate cross-sectional views of intermediate stages in the formation of the integrated circuit 10 in accordance with some embodiments of the present disclosure. The cross-sectional views illustrated in FIGS. 1F-1L correspond to the cross-sectional view illustrated in FIG. 1B that combines a cross-sectional view obtained from a vertical plane corresponding to line B-B' in FIG. 1A and a cross-sectional view obtained from a vertical plane corresponding to line C-C' in FIG. 1A. It is understood that additional operations can be provided before, during, and after the processes shown by FIGS. 1F-1L, and some of the operations described below can be replaced or eliminated, for additional embodiments of the method. The order of the operations/processes may be interchangeable.

Figure 1F:
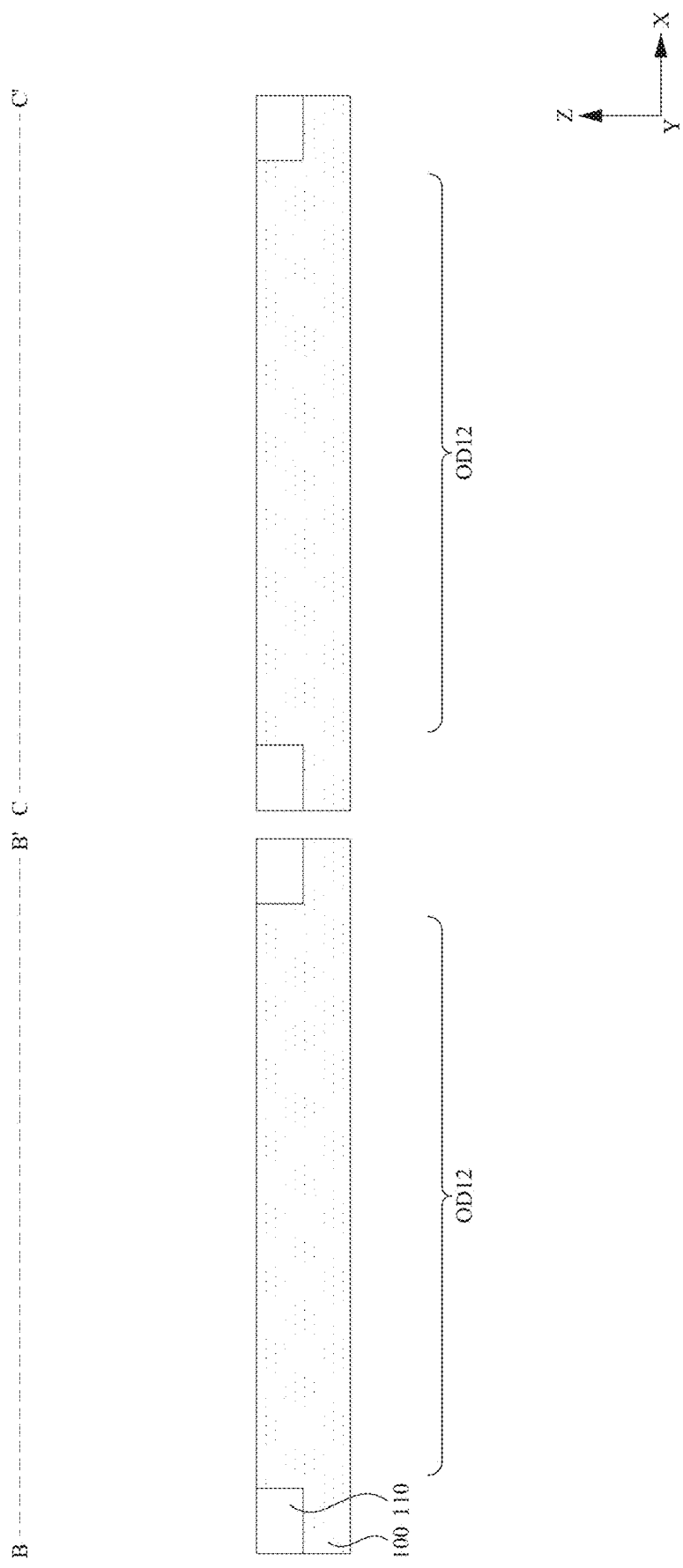

As illustrated in FIG. 1F, one or more STI regions 110 are formed in the substrate 100 to define the passive region OD 12 and the active region OD11 (as shown in FIG. 1A). Formation of the STI regions includes, by way of example and not limitation, etching the substrate 100 to form one or more trenches that define the passive region OD12 and the active region OD11, depositing one or more dielectric materials (e.g., silicon oxide) to overfill the trenches in the substrate 100, followed by a CMP process to planarize the one or more STI regions 110 with the substrate 100.

Figure 1G:
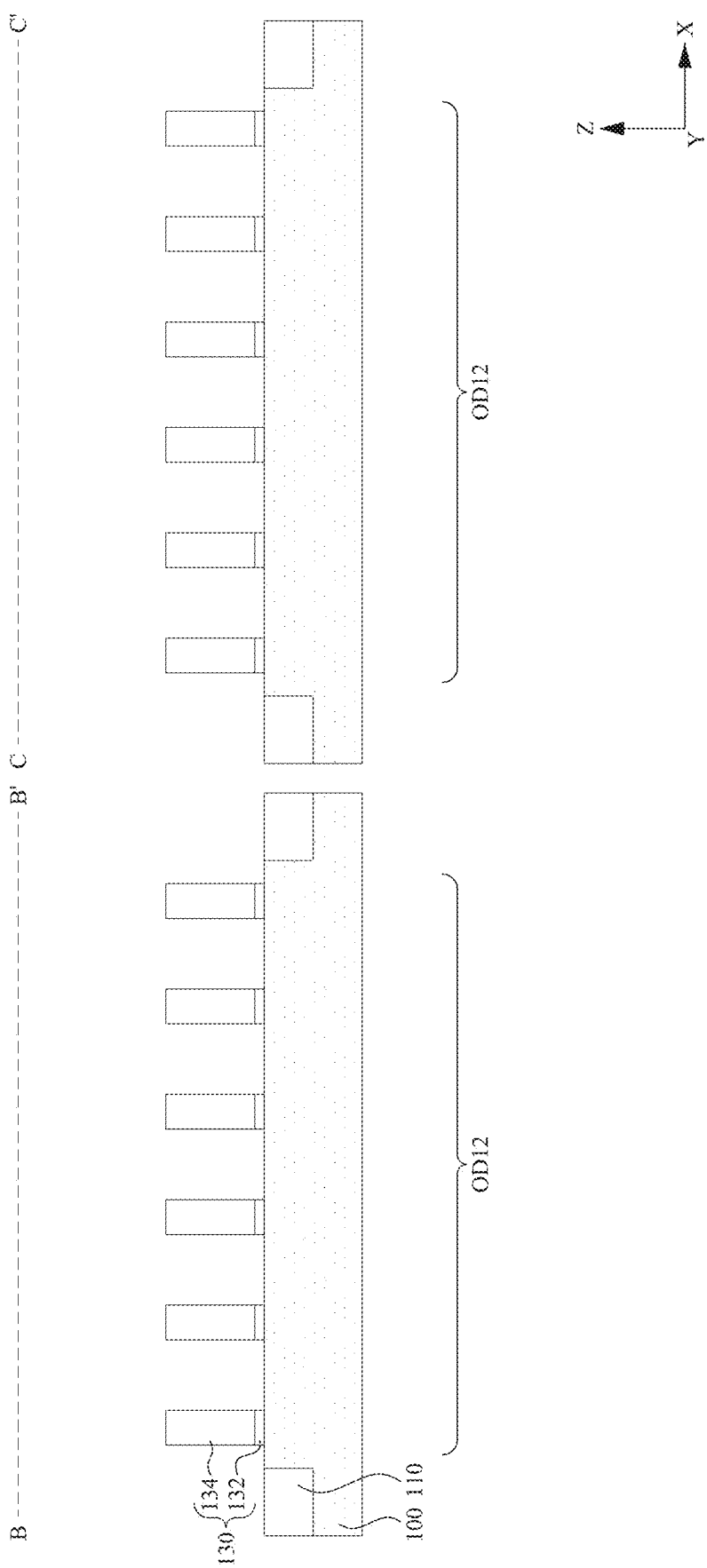

After forming the one or more STI regions 110, sacrificial gate structures 130 are formed over the passive region OD12 and the active region OD11 (as shown in FIG. 1A). The resulting structure is illustrated in FIG. 1G, in accordance with some embodiments. The sacrificial gate structures 130 may include a sacrificial gate dielectric layer 132, and a sacrificial gate 134 over the sacrificial gate dielectric layer 132. In some embodiments, by way of example and not limitation, a sacrificial gate dielectric material (e.g., silicon oxide, silicon nitride, or the like) may be deposited over the substrate 100, a sacrificial gate material (e.g., doped or un-doped polysilicon) may be deposited over the dummy gate dielectric material and then planarized (e.g., by CMP), and the sacrificial gate material and sacrificial gate dielectric material are then patterned by using suitable photolithography and etching techniques, resulting in sacrificial gate structures 130 each including sacrificial gate dielectric material and sacrificial gate material to serve as its corresponding sacrificial gate dielectric layer 132 and sacrificial gate 134.

Figure 1H:
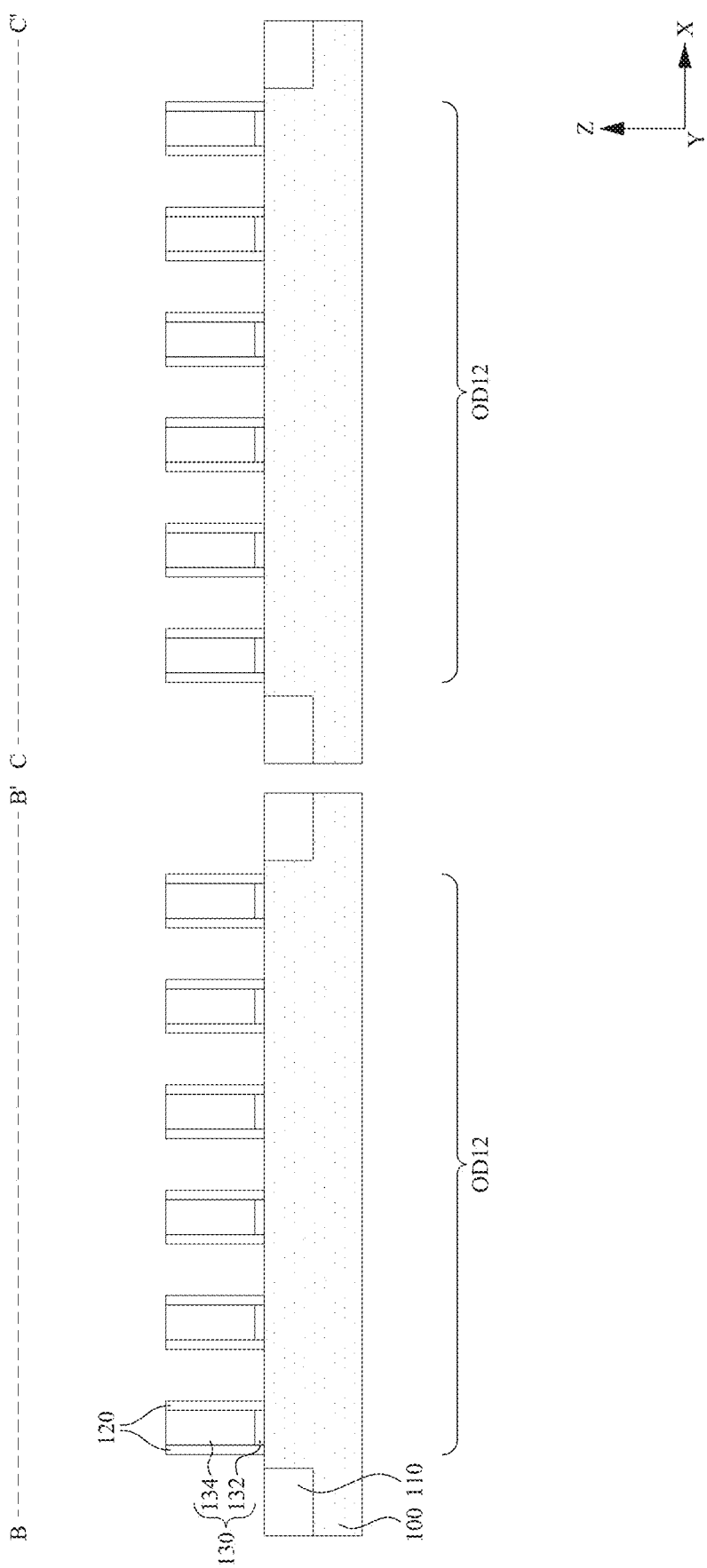
Figure 11:
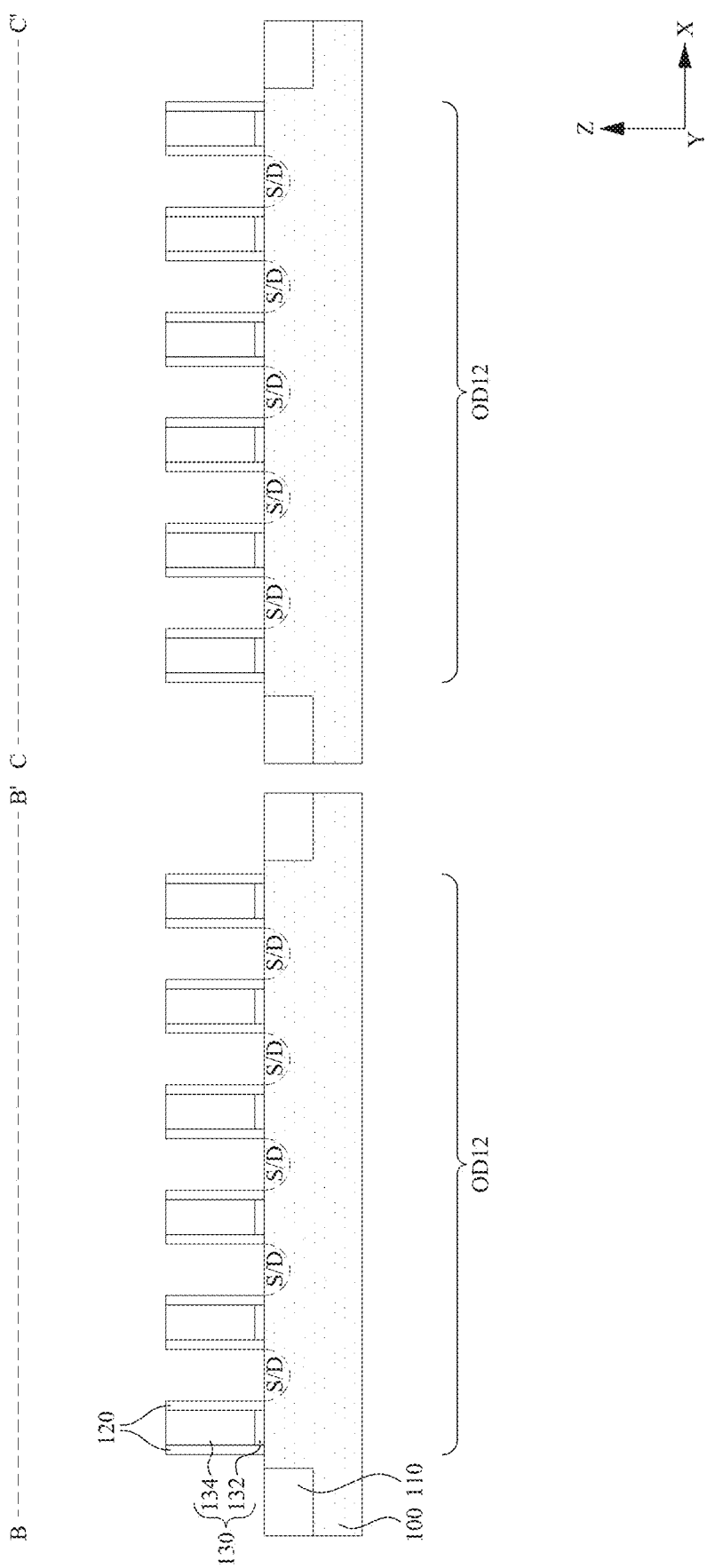
FIGS. 11A-11C illustrate different views of an integrated circuit in accordance with some embodiments of the present disclosure.

Gate spacers 120 are then formed on opposite sidewalls of each sacrificial gate structure 130. The resulting structure is illustrated in FIG. 1H. In some embodiments, gate spacers 120 are formed by, for example, deposition and anisotropic etch of a spacer dielectric layer performed after the sacrificial gate patterning is complete. In some embodiments, the spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the sacrificial gate structures 130 while leaving the gate spacers 120 along the sidewalls of the sacrificial gate structures 130.

Figure 1J:
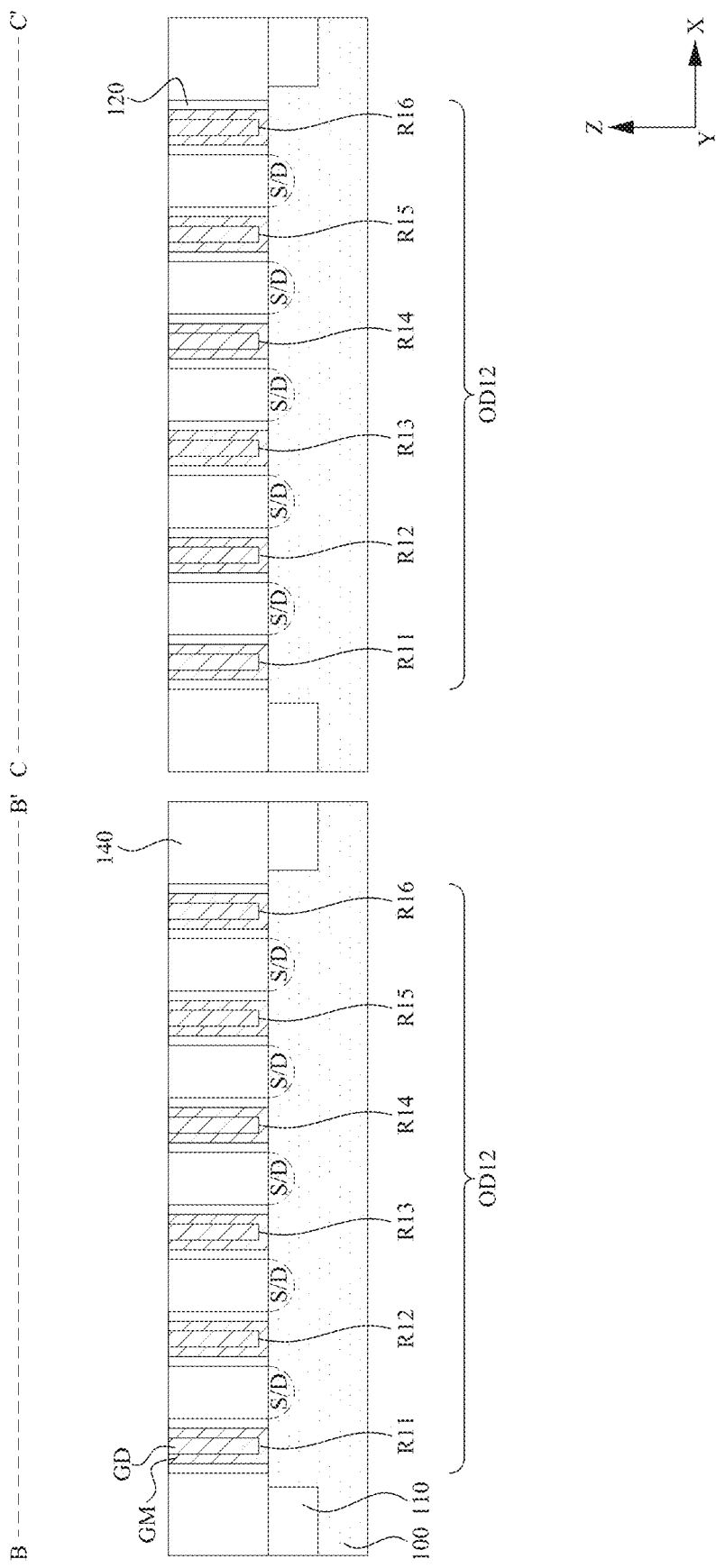

After formation of the gate spacers 120, source/drain regions S/D are formed in the passive region OD12 and the active region OD11 (as shown in FIG. 1A) and self-aligned to the gate spacers 120, as shown in FIG. 1I. An ILD layer 140 is formed over the source/drain regions S/D by depositing a dielectric material over the substrate 100, and then planarizing the dielectric material (e.g., by using CMP) until the sacrificial gate structures 130 are exposed. Thereafter, the sacrificial gate structures 130 are replaced with the metal resistor structures R11-R16 and the metal gate structures G11-G16 (as shown in FIG. 1A). The resulting structure is illustrated in FIG. 1J. Fabrication of source/drain regions and gate structures of transistors can be referred to as a front-end-of-line (FEOL) processing. Because the resistor structures R11-R16 are formed in the FEOL processing, they can be interchangeably referred to as FEOL resistors as well.

In some embodiments, the ILD layer 140 comprises silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the ILD layer 140 may be deposited using any suitable method, such as CVD, physical vapor deposition (PVD), ALD, PEALD, PECVD, SACVD, FCVD, spin-on, and/or the like, or a combination thereof, followed by a CMP process to level the ILD layer 140 with sacrificial gate structures.

After the CMP process is complete, a gate replacement process is carried out to replace the sacrificial gate structures 130 with the metal resistor structures R11-R16 and the metal gate structures G11-G16 (as shown in FIG. 1A) simultaneously. In some embodiments, the gate replacement process includes, by way of example and not limitation, removing the sacrificial gate structures 130 using one or more etching techniques (e.g., dry etching, wet etching or combinations thereof), thereby creating gate trenches between respective gate spacers 120. Next, a gate dielectric layer GD comprising one or more dielectrics, followed by a gate metal layer GM comprising one or more metals, are deposited to completely fill the gate trenches. Excess portions of the gate dielectric layer GD and the gate metal layer GM are then removed from over the top surface of the ILD layer 140 using, for example, a CMP process. In some embodiments, the resulting structure, as illustrated in FIG. 1J, may include remaining portions of the gate layers GD and GM inlaid between respective gate spacers 120 to serve as metal resistor structures R11-R16 and the metal gate structures G11-G16 (as shown in FIG. 1A). In some embodiments, the materials used in forming the metal resistor structures R11-R16 and the metal gate structures G11-G16 may be deposited by any suitable method, e.g., CVD, PECVD, PVD, ALD, PEALD, electrochemical plating (ECP), electroless plating and/or the like.

Figure 1K:
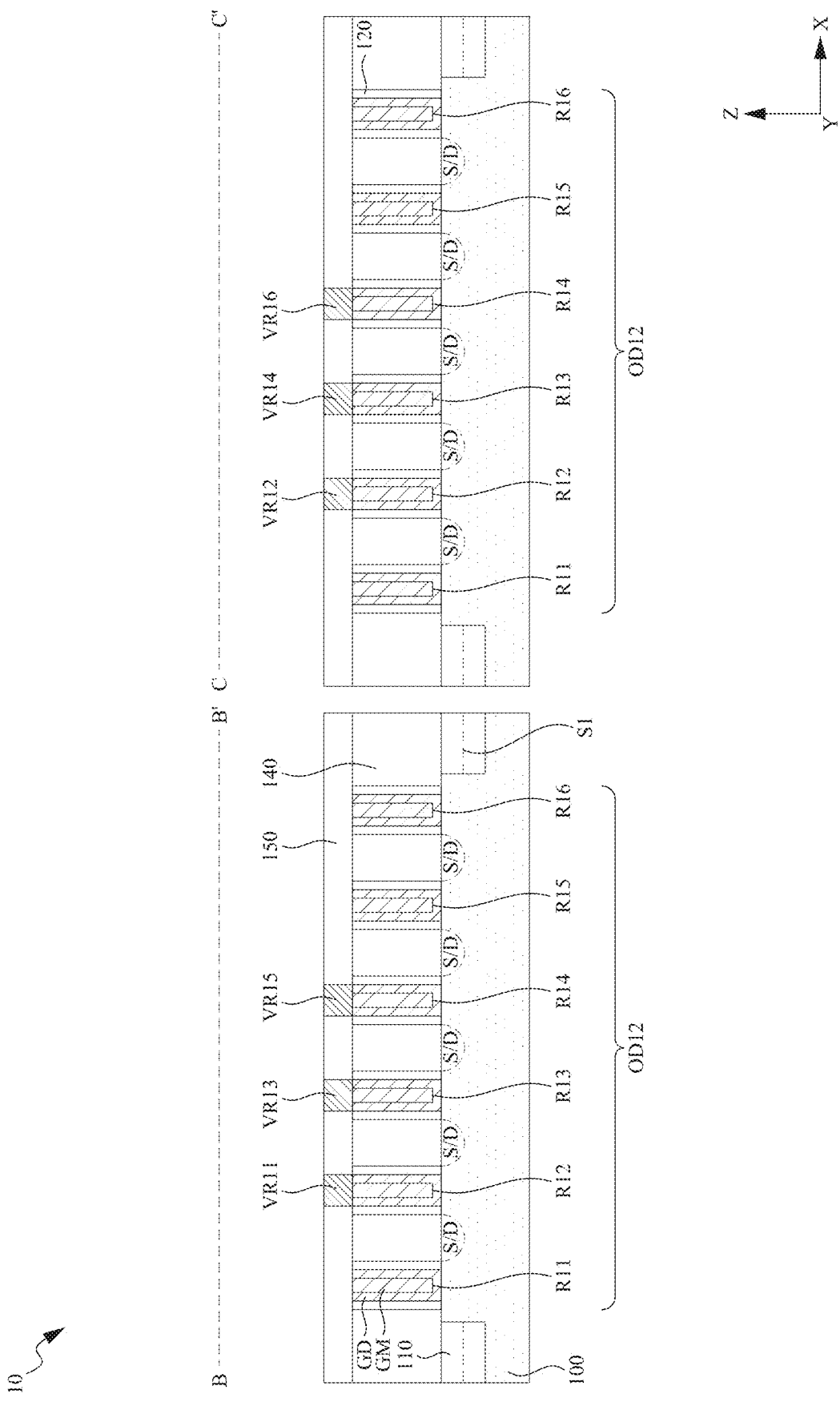

Reference is made to FIG. 1K. Another ILD layer 150 is formed over the metal resistor structures R11-R16 and the metal gate structures G11-G16 (as illustrated in FIG. 1A) by using suitable deposition techniques, and then the resistor contacts VR11-VR16 and gate contacts VG11-VG16 (as illustrated in FIG. 1A) are formed in the ILD layer 150 and over the corresponding metal resistor structures R12-R14 and metal gate structures G11-G16. In some embodiments, the ILD layer 150 is formed of a same material as the ILD layer 140. By way of example and not limitation, in some embodiments, the ILD layer 150 comprises silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or combinations thereof.

After deposition of the ILD layer 150, resistor contacts VR11-VR16 and gate contacts VG11-VG16 are formed simultaneously by using photolithography, etching and deposition techniques. For example, in some embodiments, a patterned mask may be formed over the ILD layer 150 and used to etch contact openings that extend through the ILD layer 150 to expose the metal resistor structures R12-R14 as well as metal gate structures G11-G16. In particular, these contact openings expose a single region of a metal gate structure, but two separate regions of a metal resistor structure. Thereafter, one or more metals (e.g., tungsten or copper) are deposited to fill the contact openings in the ILD layer 150 by using any acceptable deposition technique (e.g., CVD, ALD, PEALD, PECVD, PVD, ECP, electroless plating, or the like, or any combination thereof). Next, a planarization process (e.g., CMP) may be used to remove excess metals from above the top surface of the ILD layer 150. The resulting conductive plugs fill the contact openings in the ILD layer 150 and correspond to resistor contacts VR11-VR16 making physical and electrical connections to the metal resistor structures R12-R14 and gate contacts VG11-VG16 making physical and electrical connections to the metal gate structures G11-G16. In particular, a single gate contact is formed on a metal gate structure, but two resistor contacts are formed on a metal resistor structure to serve as two terminals of the metal resistor structure.

In some embodiments, both the resistor structures VR11 and VR12 are formed over the metal resistor structure R12, both the resistor contacts VR13 and VR14 are formed over the metal resistor structure R13, and both the resistor contacts VR15 and VR16 are formed over the metal resistor structure R14. Stated differently, each metal resistor structure has two resistor contacts on its top surface, but each metal gate structure has a single gate contact on its top surface as illustrated in FIG. 1A.

Reference is made to 1L. Another ILD layer 160 is formed over the resistor contacts VR11-VR16 and the gate contacts VG11-VG16 (as shown in FIG. 1A), and metal lines M11-M14 are formed in the ILD layer 160 and over corresponding resistor contacts VR11-VR16. In some embodiments, the ILD layer 160 includes same material as the ILD layer 140 and/or the ILD layer 150. By way of example and not limitation, in some embodiments, the ILD layer 150 comprises silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof.

After deposition of the ILD layer 160, the metal lines M11-M14 are formed by photolithography, etching and deposition techniques. For example, a patterned mask may be formed over the ILD layer 160 and used to etch trenches that extend in the ILD layer 160 to expose the resistor contacts VR11-VR16. Thereafter, one or more metals (e.g., tungsten or copper) are deposited to fill the trenches in the ILD layer 160 by one or more acceptable deposition techniques (e.g., CVD, ALD, PEALD, PECVD, PVD, ECP, electroless plating, or the like, or any combination thereof). Next, a planarization process (e.g., CMP) may be used to remove excess metals from above the top surface of the ILD layer 160. The remaining metals extend in the ILD layer 160 and thereby forming metal lines M11-M14 that make physical and electrical connections to the resistor contacts VR11-VR16. Although not shown (for the sake of simplicity and clarity), additional metal lines are also formed over the gate contacts VG11-VG16 (as shown in FIG. 1A) simultaneously with formation of the metal lines M11-M14.

Figure 1L:
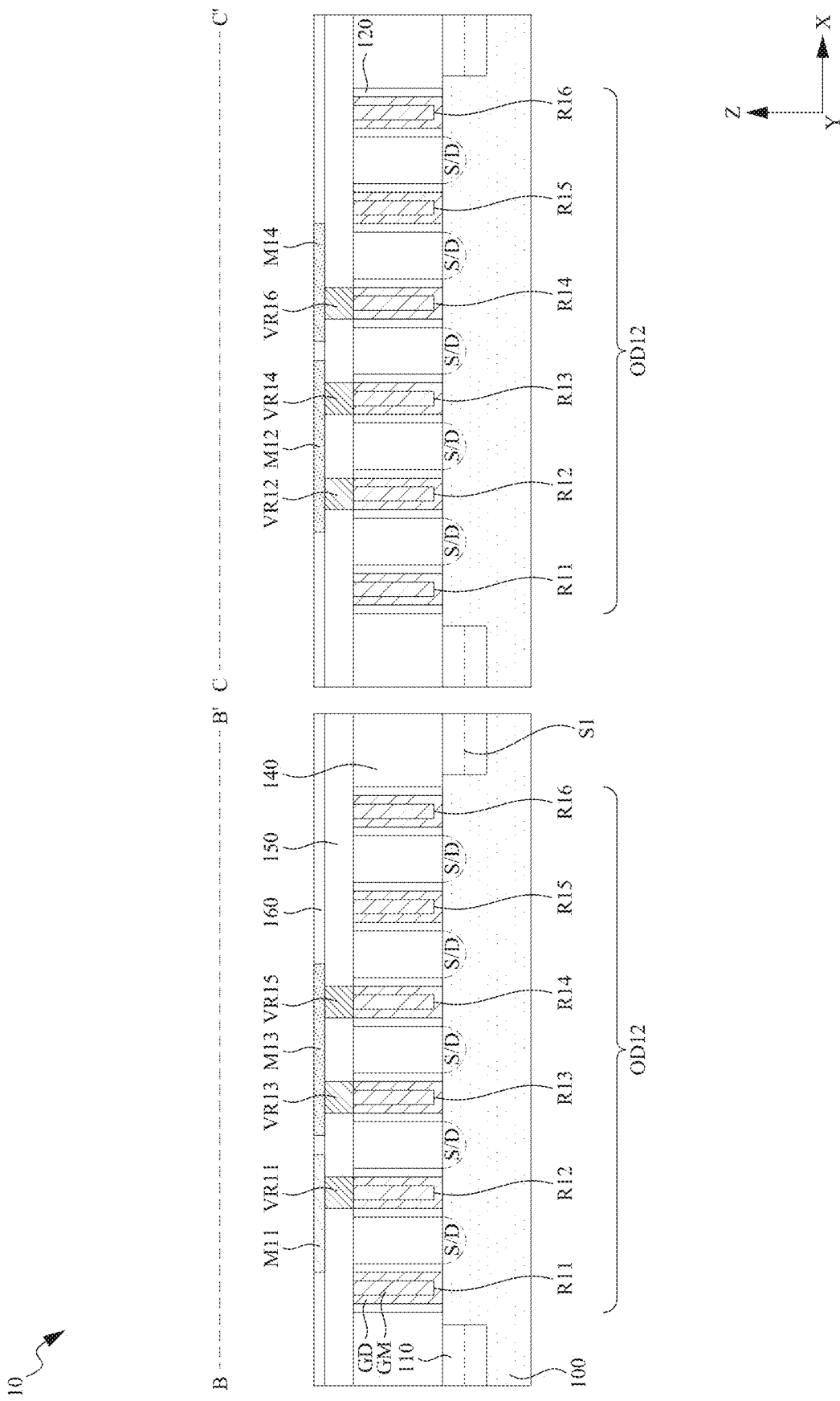

As illustrated in FIG. 1L, the metal line M11 extends across and is in direct contact with the resistor contact VR11, the metal line M13 extends across and is in direct contact with both the resistor contacts VR13 and VR15, the metal line M12 extends across and is in direct contact with both the resistor contacts VR12 and VR14, and the metal line M14 extends across and is in direct contact with the resistor contact VR16.

Figure 2A:
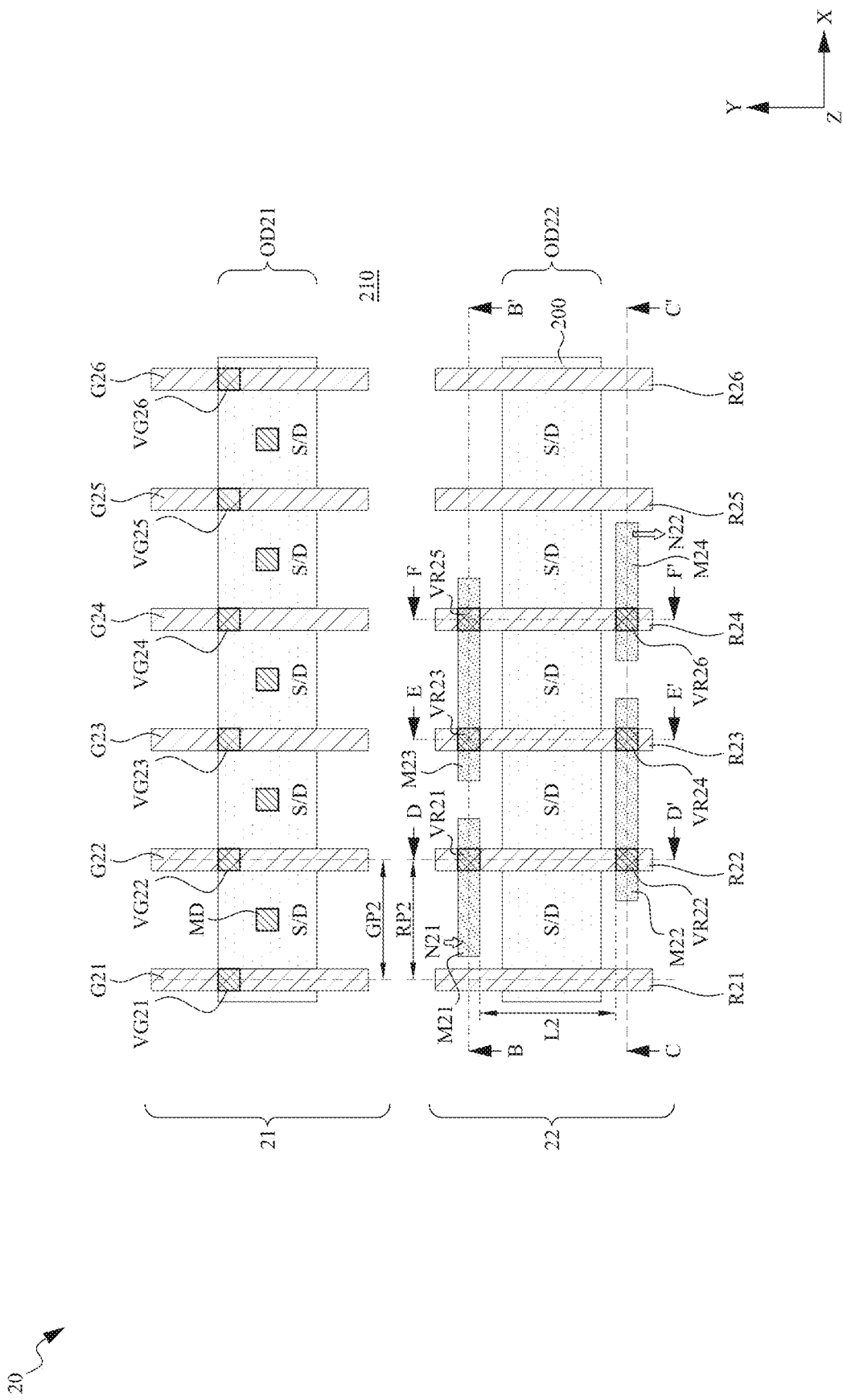
FIGS. 2A-2C illustrate different views of an integrated circuit in accordance with some embodiments of the present disclosure.
Figure 2B:
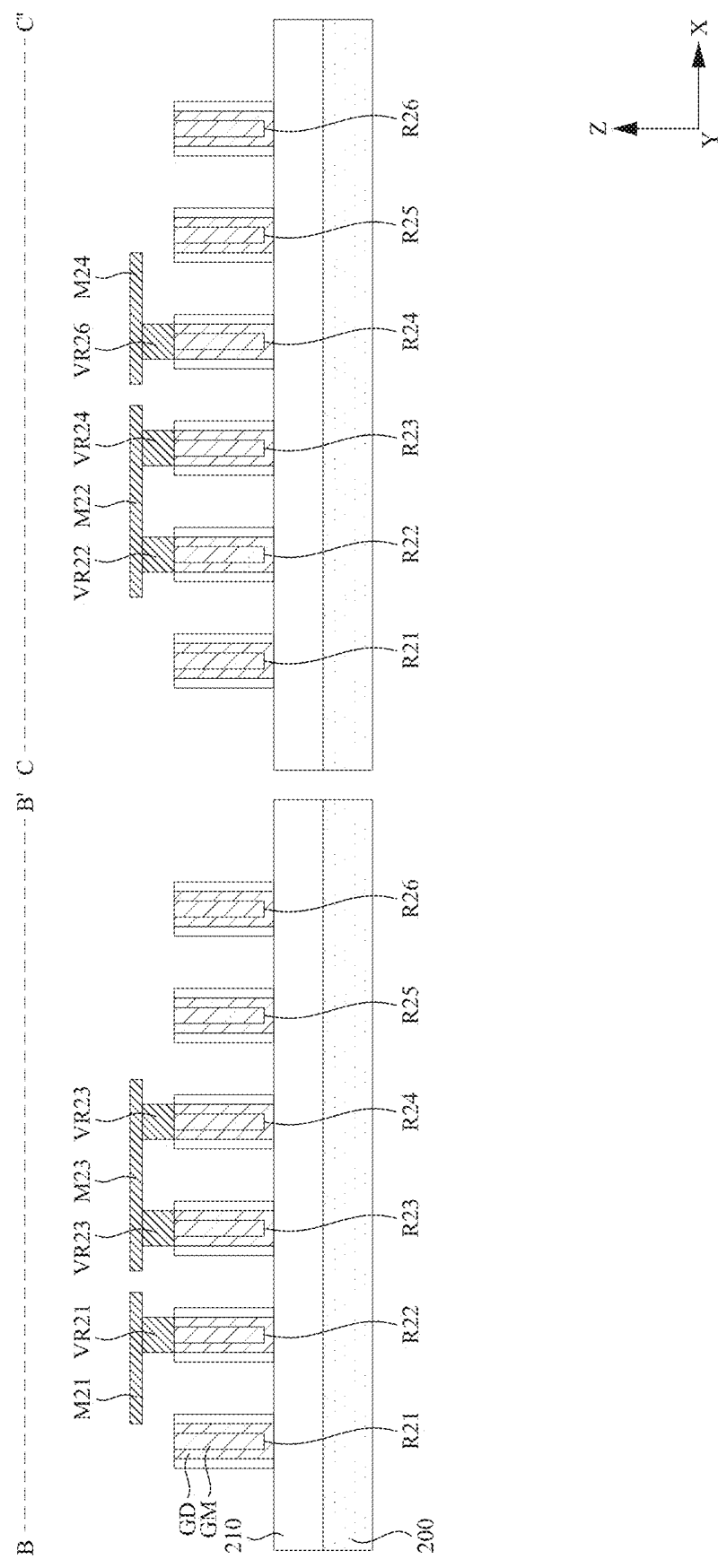
Figure 2C:
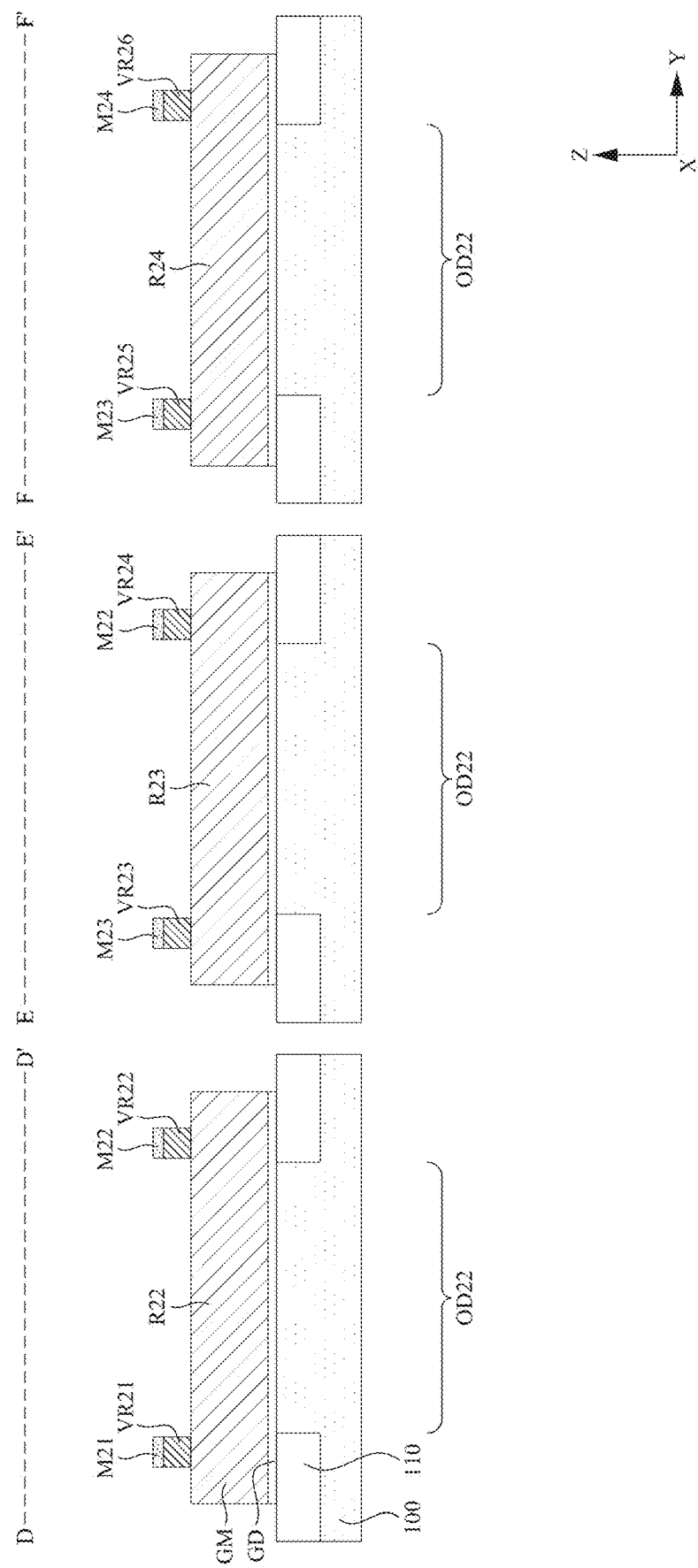

FIGS. 2A-2C illustrate a resistor circuit including dummy gate contacts overlapping STI region, in accordance with some embodiments. FIG. 2A illustrates a top view of an exemplary integrated circuit 20 having a transistor region 21 and a resistor region 22 in accordance with some embodiments of the present disclosure. FIG. 2B illustrates a cross-sectional view of the integrated circuit 20 in accordance with some embodiments, wherein the cross-sectional view combines a cross-sectional view obtained from the vertical plane containing line B-B' in FIG. 2A and a cross-sectional view obtained from the vertical plane containing line C-C' in FIG. 2A. FIG. 2C illustrates a cross-sectional view of the integrated circuit 20 in accordance with some embodiments, wherein the cross-sectional view combines a cross-sectional view obtained from the vertical plane containing line D-D' in FIG. 2A, a cross-sectional view obtained from the vertical plane containing line E-E' in FIG. 2A and a cross-sectional view obtained from the vertical plane containing line F-F' in FIG. 2A. The integrated circuit 20 is a non-limiting example for facilitating the illustration of the present disclosure.

The integrated circuit 20 includes a substrate 200 having an active region OD21 extending along the X-direction within the transistor region 21 and a passive region OD22 extending along the X-direction within the resistor region 22. The active region OD21 is separated and electrically insulated from the passive region OD22 by an STI region 210. Example materials and characteristics of the substrate 200 and the STI region 210 can be the same as that of the substrate 100 and the STI region 110 as described previously, and thus are not repeated for the sake of brevity.

The integrated circuit 20 further includes metal gate structures G21, G22, G23, G24, G25 and G26 extending within the transistor region 21 and across the active region OD21 along the Y-direction, and metal resistor structures R21, R22, R23, R24, R25 and R26 extending within the resistor region 22 and across the passive region OD22 along the Y-direction. Example materials of the metal resistor structures R21-R26 and metal gate structures G21-G26 include high-k dielectric materials GD and gate metals GM as discussed previously with respect to the metal resistor structures R11-R16 and metal gate structures G11-G16, and thus are not repeated for the sake of brevity.

In the depicted embodiment as illustrated in FIG. 2A, the metal gate structures G21-G26 are equidistantly arranged along the X-direction at a gate pitch GP2 (i.e., center-to-center spacing between neighboring gate structures), and the metal resistor structures R21-R26 are equidistantly arranged along the X-direction at a resistor pitch RP2 (i.e., center-to-center spacing between neighboring metal resistor structures). In some embodiments, the resistor pitch RP2 is substantially equal to the gate pitch GP2 for reducing pattern loading effect during fabricating the metal gate structures G21-G26 and metal resistor structures R21-R26. In some embodiments, the resistor pitch RP2 may be greater or less than the gate pitch GP2.

The integrated circuit 20 further includes a plurality of source/drain regions S/D in the active region OD21 and the passive region OD22. The source/drain regions S/D are doped semiconductor regions located on opposite sides of the corresponding metal gate structures G21-G26 and metal resistor structures R21-R26. In some embodiments, the source/drain regions S/D include dopants or impurities for forming functional FETs in the active region OD21 and non-functional or dummy FETs in the passive region OD22. Example materials and forming methods of the source/drain regions S/D of FIGS. 2A-2C are similar to those discussed previously with respect to FIG. 1A, and thus are not repeated for the sake of brevity.

In the depicted embodiment as illustrated in FIG. 2A, the integrated circuit 20 further includes a plurality of source/drain contacts MD landing on the respective source/drain regions S/D within the active region OD21. In some embodiments, one or more of the source/drain regions S/D within the passive region OD22 do not include source/drain contacts landing on the corresponding one or more source/drain regions S/D within the passive region OD22. In some embodiments, the source/drain regions S/D in the passive region OD22 are not electrically coupled to the metal line(s) in the overlying interconnect structure. Therefore, the source/drain regions S/D within the passive region OD22 are electrically floating while the source/drain regions S/D within the active region OD21 are electrically coupled to metal lines in overlying interconnect structure (not shown for the sake of clarity) by using the source/drain contacts MD. As a result, the source/drain regions S/D in the active region OD21 form functional transistors (i.e., transistors functioned to create channels in the active region OD21) with the corresponding metal gate structures G21-G26, while the electrically floating source/drain regions S/D in the passive region OD22 form non-functional or dummy transistors (i.e., transistor-like structures not functioned to create channels in the passive region OD22) with the metal resistor structures R21-R26.

The integrated circuit 20 further includes a plurality of gate contacts VG21, VG22, VG23, VG24, VG25 and VG26 over the corresponding metal gate structures G21-G26, respectively. The integrated circuit 20 further includes resistor contacts VR21 and VR22 over the metal resistor structure R22, resistor contacts VR23 and VR24 over the metal resistor structure R23, and resistor contacts VR25 and VR26 over the metal resistor structure R24. Example materials and forming methods of the gate contacts and resistor contacts of FIGS. 2A-2D are similar to those discussed previously with respect to FIG. 1A, and thus are not repeated for the sake of brevity.

The resistor contacts VR21-VR26 do not overlap the passive region OD22. Instead, the resistor contacts VR21-VR26 overlap the STI region 210. As a result, the Y-directional distance L2 between upper-row resistor contacts VR21, VR23, VR25 and the lower-row resistor contacts VR22, VR24, VR26 can be larger compared with the embodiments where the resistor contacts overlap the passive region (e.g., the embodiment illustrated in FIG. 1A). Because the upper-row resistor contacts VR21, VR23, VR25 serve as first terminals of the resistors R22-R24 and the lower-row resistor contacts VR22, VR24, VR26 serve as second terminals of the resistors R22-R24, the Y-directional distance L2 is in positive correlation with resistances of the metal resistor structures R22-R24. Therefore, the Y-directional distance L2 can be selected depending on target resistance values of the metal resistor structure R22-R24. For example, the Y-directional distance L2 between the upper-row resistor contacts and the lower-row resistor contacts is in a range from about 8% of the resistor pitch RP2 (i.e., gate pitch GP2) to about 3000% of the resistor pitch RP2. Excessively short Y-directional distance L2 might lead to increased challenge on the lithography process of forming resistor contacts VR21-VR26 and metal lines M21-M24 with low manufacturing yield. Excessively short resistor pitch RP2 might lead to increased challenge on the lithography process of forming sacrificial gates that are to be replaced with the metal resistor structures R22-R26 with low manufacturing yield. Moreover, in some embodiments, the resistances of the resistor contacts VR21-VR26 overlapping the STI region 210 may be different (e.g., higher) compared with embodiments where the resistor contacts overlap the passive region (e.g., FIG. 1A).

The integrated circuit 20 further includes a plurality of metal lines M21, M22, M23 and M24 on a level above the gate contacts VG21-VG26 and resistor contacts VR21-VR26. In some embodiments, the metal lines M21-M24 are on a M0 layer or M1 layer. Other metal layers are within the scope of the present disclosure. The metal lines M21-M24 extend along the X-direction. The metal line M21 extends across an upper section of the metal resistor structure R22. The resistor contact VR21 is located where the metal line M21 overlaps the metal resistor structure R22, thus providing an electrical connection between the metal line M21 and the metal resistor structure R22. The metal line M22 extends across both lower sections of the metal resistor structures R22 and R23, and is electrically connected to the metal resistor structure R22 by the resistor contact VR22 and to the metal resistor structure R23 by the resistor contact VR24. The metal line M23 extends across both upper sections of the metal resistor structures R23 and R24, and is electrically connected to the metal resistor structure R23 by the resistor contact VR23 and to the metal resistor structure R24 by the resistor contact VR25. The metal line M24 extends across a lower section of the metal resistor structure R24, and is electrically connected to the metal resistor structure R24 by the resistor contact VR26. The metal resistor structures R22-R24, the resistor contacts VR21-VR26, and the metal lines M21-M24 are connected in series to form a resistor circuit having a first node N21 at the metal line M21 and a second node N22 at the metal line M24.

Figure 3A:
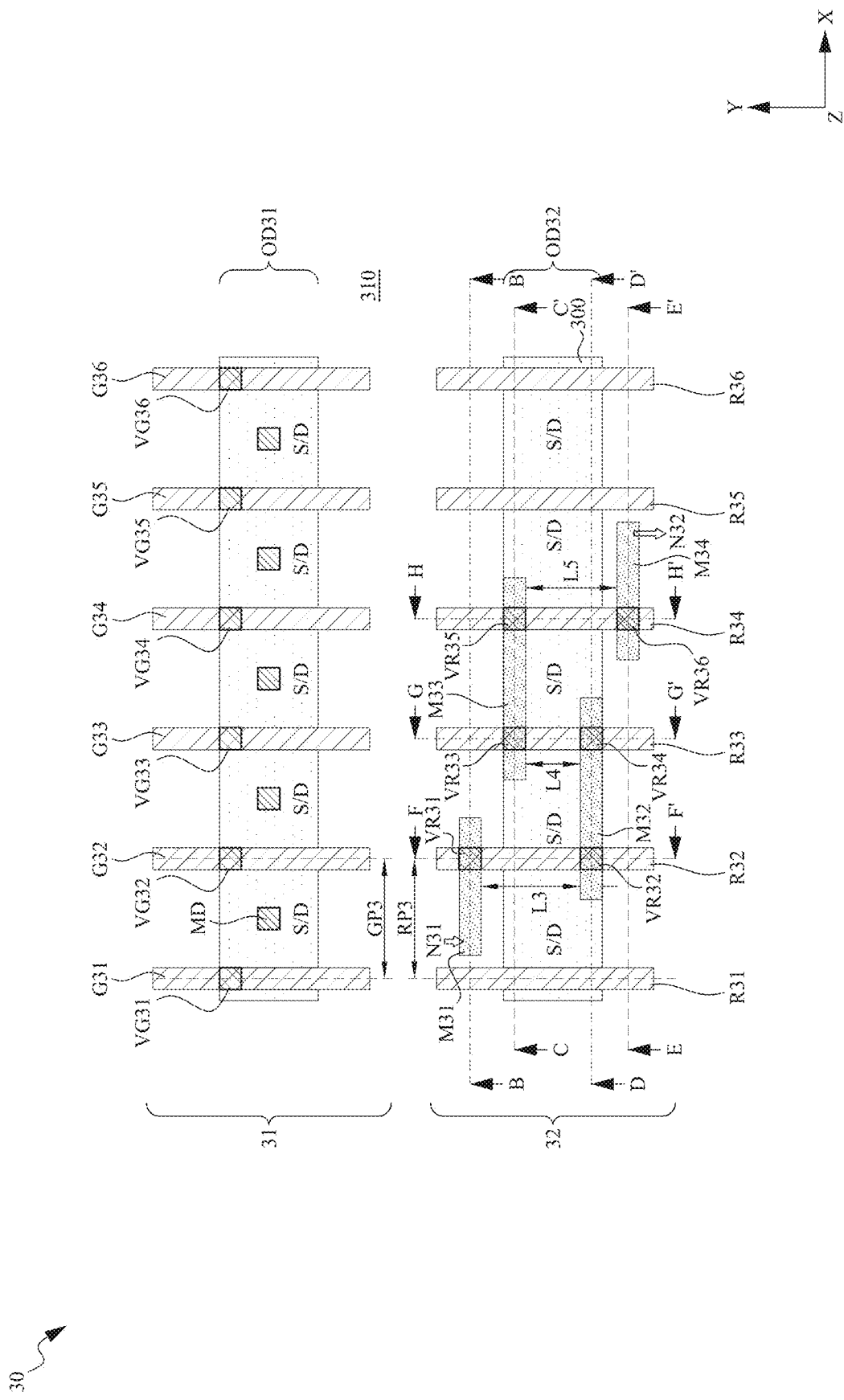
FIGS. 3A-3D illustrate different views of an integrated circuit in accordance with some embodiments of the present disclosure.
Figure 3B:
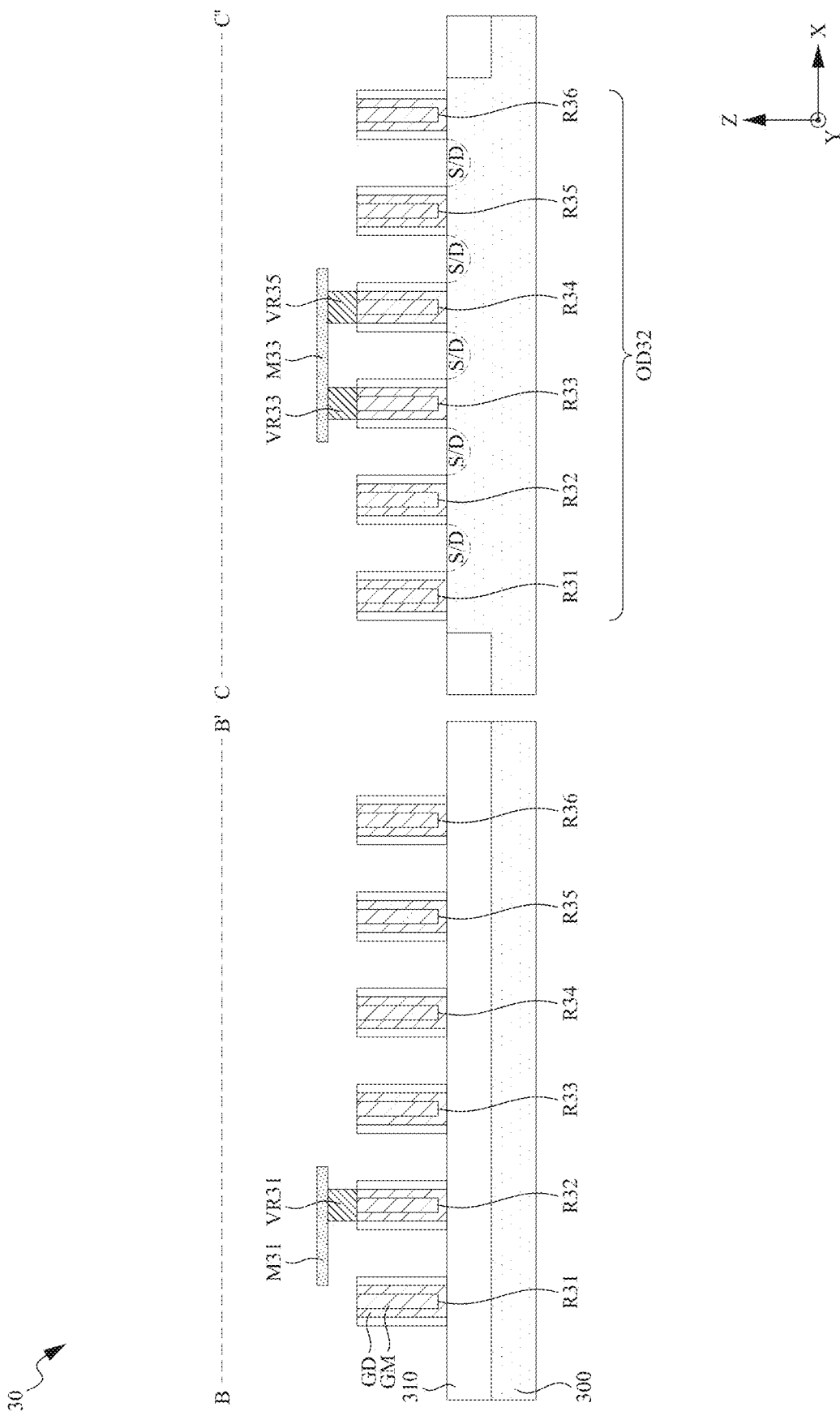
Figure 3C:
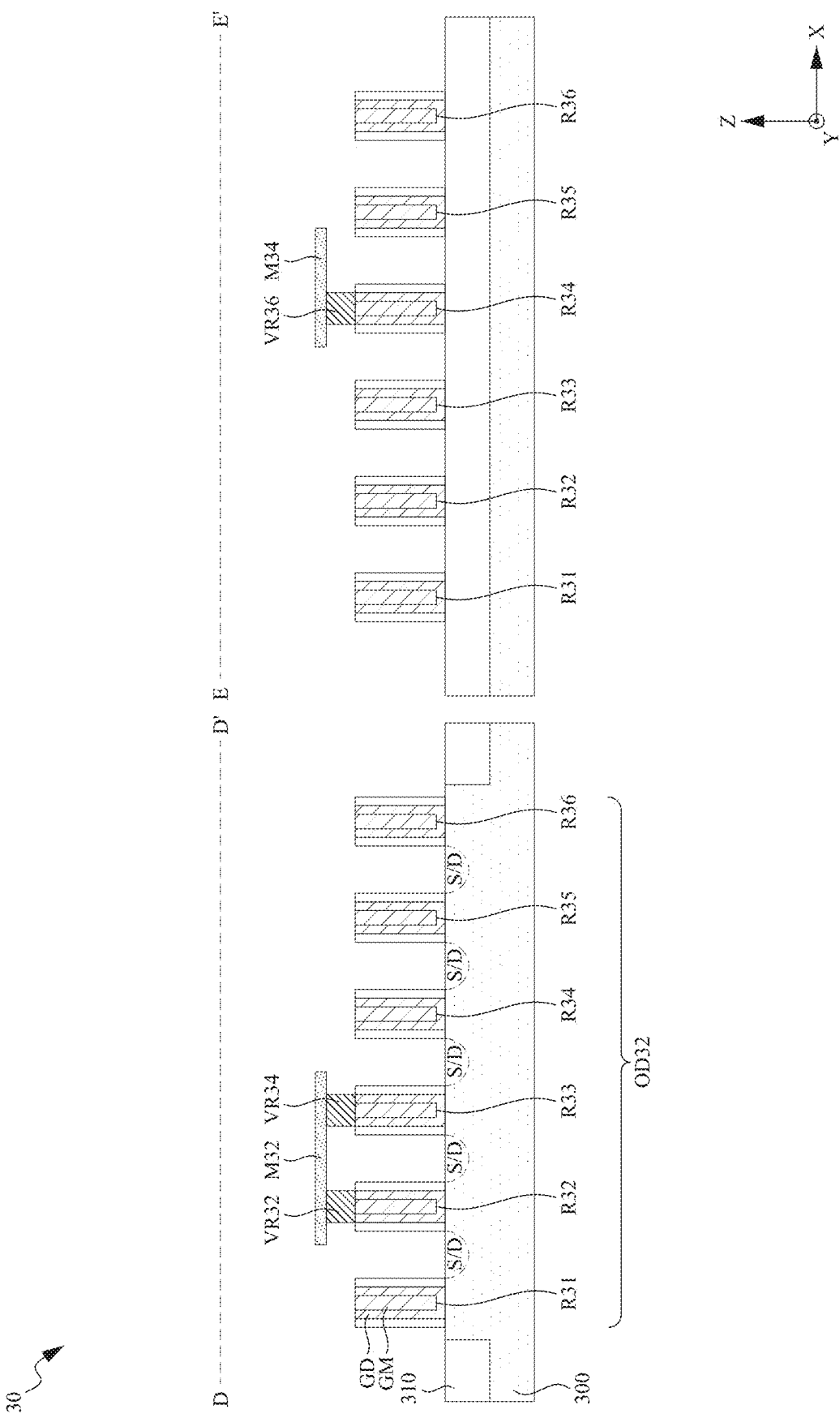
Figure 3D:
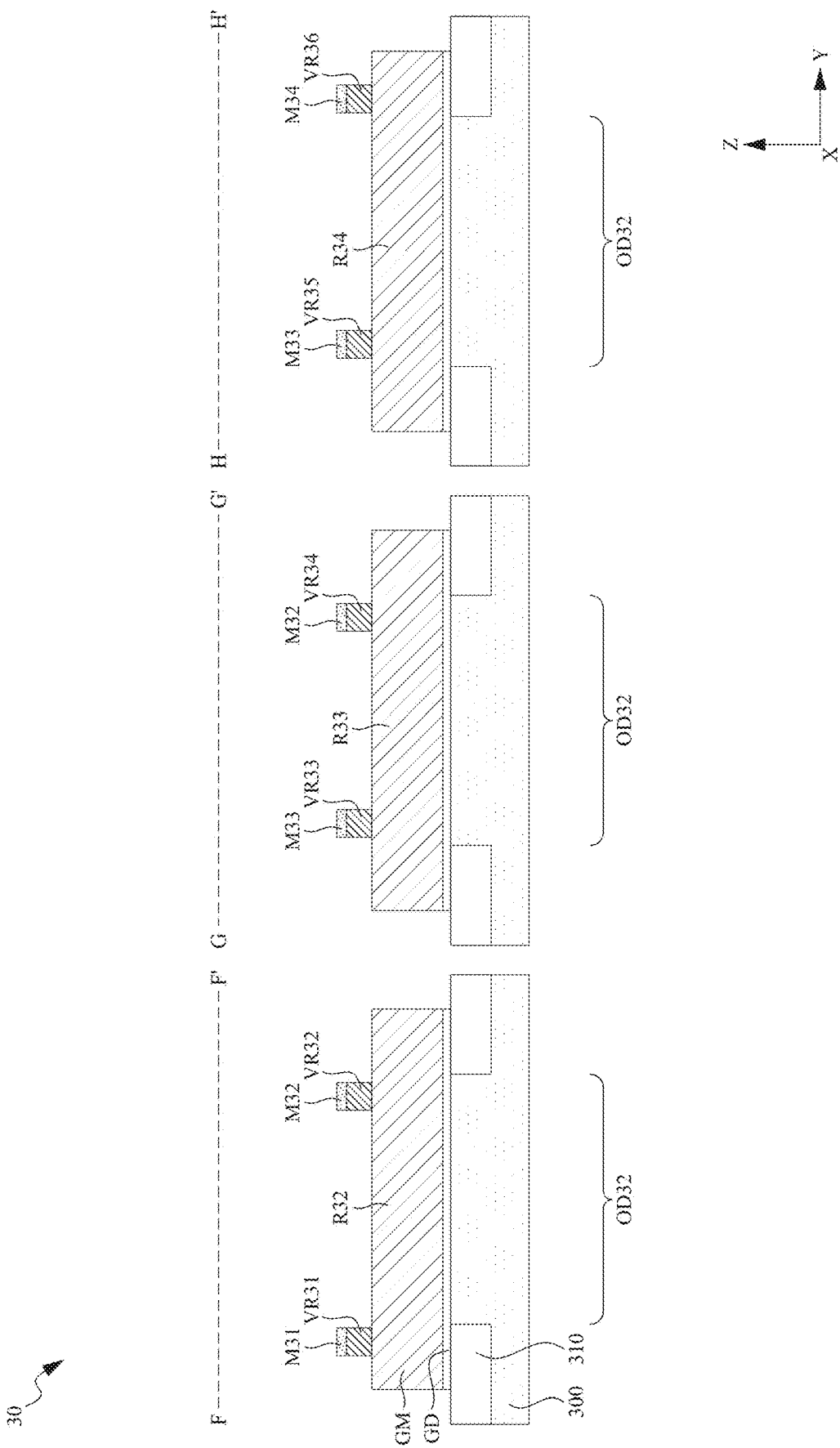

FIGS. 3A-3D illustrate a resistor circuit including at least one dummy gate contact overlapping the passive region and at least one dummy gate contact overlapping the STI region, in accordance with some embodiments. FIG. 3A illustrates a top view of an exemplary integrated circuit 30 having a transistor region 31 and a resistor region 32 in accordance with some embodiments of the present disclosure. FIG. 3B illustrates a cross-sectional view of the integrated circuit 30 in accordance with some embodiments, wherein the cross-sectional view combines a cross-sectional view obtained from the vertical plane containing line B-B' in FIG. 3A and a cross-sectional view obtained from the vertical plane containing line C-C' in FIG. 3A. FIG. 3C illustrates a cross-sectional view of the integrated circuit 30 in accordance with some embodiments, wherein the cross-sectional view combines a cross-sectional view obtained from the vertical plane containing line D-D' in FIG. 3A and a cross-sectional view obtained from the vertical plane containing line E-E' in FIG. 3A. FIG. 3D illustrates a cross-sectional view of the integrated circuit 30 in accordance with some embodiments, wherein the cross-sectional view combines a cross-sectional view obtained from the vertical plane containing line F-F' in FIG. 3A, and a cross-sectional view obtained from the vertical plane containing line G-G' in FIG. 3A and a cross-sectional view obtained from the vertical plane containing line H-H' in FIG. 3A. The integrated circuit 30 is a non-limiting example for facilitating the illustration of the present disclosure.

The integrated circuit 30 includes a substrate 300 having an active region OD31 extending along the X-direction within the transistor region 31 and a passive region OD32 extending along the X-direction within the resistor region 32. The active region OD31 is separated and electrically insulated from the passive region OD32 by an STI region 310. In some embodiments, example materials and configurations of the substrate 300, OD31 and OD32 and the STI region 310 can be the same as that of the corresponding substrate 100, OD11 and OD12 and the STI region 110 as described previously, and thus are not repeated for the sake of brevity.

The integrated circuit 30 further includes metal gate structures G31, G32, G33, G34, G35 and G36 extending within the transistor region 31 and across the active region OD31 along the Y-direction, and metal resistor structures R31, R32, R33, R34, R35 and R36 extending within the resistor region 32 and across the passive region OD32 along the Y-direction. Example materials of the metal resistor structures R31-R36 and metal gate structures G31-G36 include high-k dielectric layer GD and gate metals GM are similar to those discussed previously with respect to the metal resistor structures R11-R16 and metal gate structures G11-G16, and thus are not repeated for the sake of brevity.

In the depicted embodiment as illustrated in FIG. 3A, the metal gate structures G31-G36 are equidistantly arranged along the X-direction at a gate pitch GP3 (i.e., center-to-center spacing between neighboring gate structures), and the metal resistor structures R31-R36 are equidistantly arranged along the X-direction at a resistor pitch RP3 (i.e., center-to-center spacing between neighboring metal resistor structures). In some embodiments, the resistor pitch RP3 is substantially equal to the gate pitch GP3 for reducing pattern loading effect during fabricating the metal gate structures G31-G36 and metal resistor structures R31-R36. In some other embodiments, the resistor pitch RP3 may be greater or less than the gate pitch GP3.

The integrated circuit 30 further includes a plurality of source/drain regions S/D in the active region OD31 and the passive region OD32. The source/drain regions S/D are doped semiconductor regions located on opposite sides of the corresponding metal gate structures G31-G36 and metal resistor structures R31-R36. In some embodiments, the source/drain regions S/D include dopants or impurities for forming functional FETs in the active region OD31 and non-functional or dummy FETs in the passive region OD32. Example materials and forming methods of the source/drain regions S/D of FIGS. 3A-3D are similar to those discussed previously with respect to FIG. 1A, and thus are not repeated for the sake of brevity.

In the depicted embodiment as illustrated in FIG. 3A, the integrated circuit 30 further includes a plurality of source/drain contacts MD landing on the respective source/drain regions S/D within the active region OD31. In some embodiments, one or more of the source/drain regions S/D within the passive region OD32 do not include source/drain contacts landing on the corresponding one or more source/drain regions S/D within the passive region OD32. In some embodiments, the source/drain regions S/D in the passive region OD32 are not electrically coupled to the metal line(s) in the overlying interconnect structure. Therefore, the source/drain regions S/D within the passive region OD32 are electrically floating while the source/drain regions S/D within the active region OD31 are electrically coupled to metal lines in overlying interconnect structure (not shown for the sake of clarity) by using the source/drain contacts MD. As a result, the source/drain regions S/D in the active region OD31 form functional transistors (i.e., transistors functioned to create channels in the active region OD31) with the corresponding metal gate structures G31-G36, while the electrically floating source/drain regions S/D in the passive region OD32 form non-functional or dummy transistors (i.e., transistor-like structures not functioned to create channels in the passive region OD32) with the metal resistor structures R31-R36.

The integrated circuit 30 further includes a plurality of gate contacts VG31, VG32, VG33, VG34, VG35 and VG36 over the corresponding metal gate structures G31-G36, respectively. The integrated circuit 30 further includes resistor contacts VR31 and VR32 over the metal resistor structure R32, resistor contacts VR33 and VR34 over the metal resistor structure R33, and resistor contacts VR35 and VR36 over the metal resistor structure R34. Example materials and forming methods of the gate contacts and resistor contacts of FIGS. 3A-3D are similar to those discussed previously with respect to FIG. 1A, and thus are not repeated for the sake of brevity.

The resistor contacts VR31 and VR36 overlap the STI region 310, but do not overlap the passive region OD32. The resistor contacts VR32-VR35 overlap the passive region OD32, but do not overlap the STI region 310. In some embodiments, the resistance of the metal resistor structure R32 is greater than the resistance of the metal resistor structure R33 because the Y-directional distance L3 between the resistor contacts VR31 and VR32 is greater than the Y-directional distance L4 between the resistor contacts VR33 and VR34. For similar reasons, the resistance of the metal resistor structure R34 is also greater than the resistance of the metal resistor structure R33 because the Y-directional distance L5 between the resistor contacts VR35 and VR36 is greater than the Y-directional distance L4 between the resistor contacts VR33 and VR34. By way of example and not limitation, the Y-directional distance L3 between the resistor contacts VR31 and VR32 is in a range from about 30% of the resistor pitch RP3 (i.e., gate pitch GP3) to about 10000% of the resistor pitch RP3, the Y-directional distance L4 between the resistor contacts VR33 and VR33 is in a range from about 5% of the resistor pitch RP3 (i.e., gate pitch GP3) to about 1400% of the resistor pitch RP3, the Y-directional distance L5 between the resistor contacts VR35 and VR36 is in a range from about 30% of the resistor pitch RP3 (i.e., gate pitch GP3) to about 10000% of the resistor pitch RP3. Excessively short Y-directional distance L3, L4 or L5 might lead to increased challenge on the lithography process of forming resistor contacts and metal lines with low manufacturing yield. Excessively short resistor pitch RP3 might lead to increased challenge on the lithography process of forming sacrificial gates that are to be replaced with the metal resistor structures with low manufacturing yield.

The integrated circuit 30 further includes a plurality of metal lines M31, M32, M33 and M34 on a level above the gate contacts VG31-VG36 and resistor contacts VR31-VR36. In some embodiments, the metal lines M31-M34 are on a M0 layer or M1 layer. Other metal layers are within the scope of the present disclosure. The metal lines M31-M34 extend along the X-direction. The metal line M31 extends across an upper section of the metal resistor structure R32. The resistor contact VR31 is located where the metal line M31 overlaps the metal resistor structure R32, thus providing an electrical connection between the metal line M31 and the metal resistor structure R32. The metal line M32 extends across both lower sections of the metal resistor structures R32 and R33, and is electrically connected to the metal resistor structure R32 by the resistor contact VR32 and to the metal resistor structure R33 by the resistor contact VR34. The metal line M33 extends across both upper sections of the metal resistor structures R33 and R34, and is electrically connected to the metal resistor structure R33 by using the resistor contact VR33 and to the metal resistor structure R34 by the resistor contact VR35. The metal line M34 extends across a lower section of the metal resistor structure R34, and is electrically connected to the metal resistor structure R34 by the resistor contact VR36. The metal resistor structures R32-R34, the resistor contacts VR31-VR36, and the metal lines M31-M34 are connected in series to form a resistor circuit having a first node N31 at the metal line M31 and a second node N32 at the metal line M34.

Figure 4A:
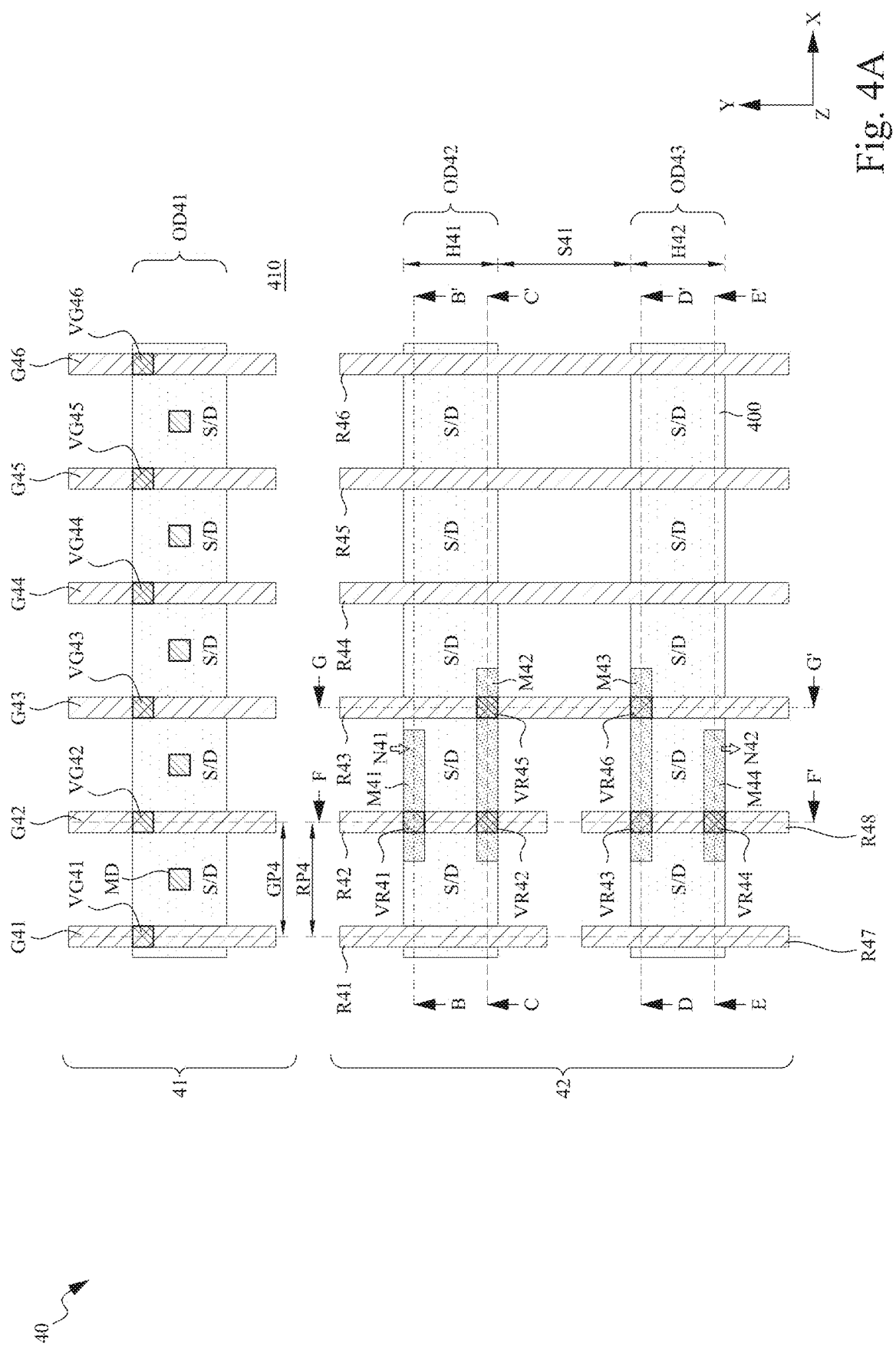
FIGS. 4A-4E illustrate different views of an integrated circuit in accordance with some embodiments of the present disclosure.
Figure 4B:
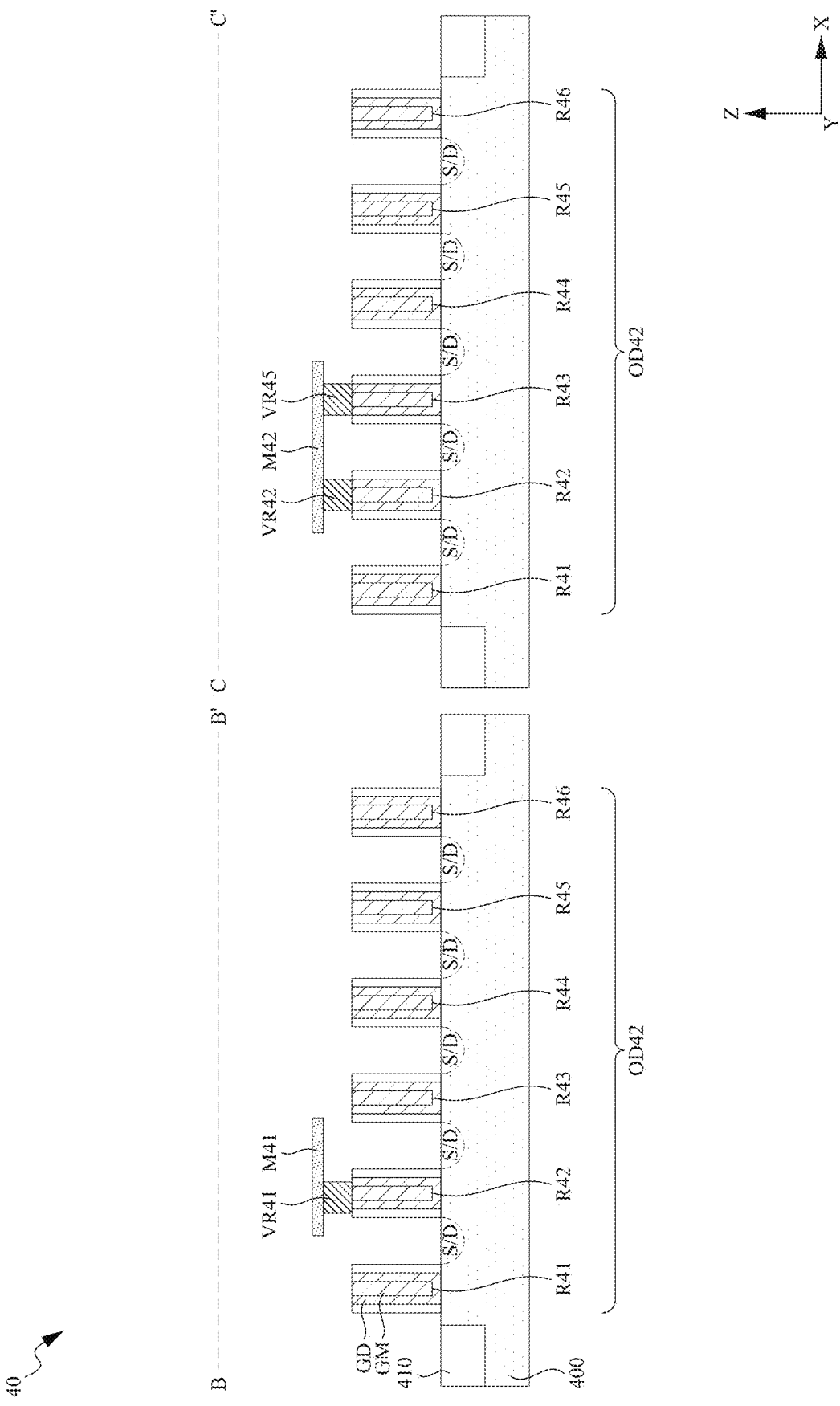
Figure 4C:
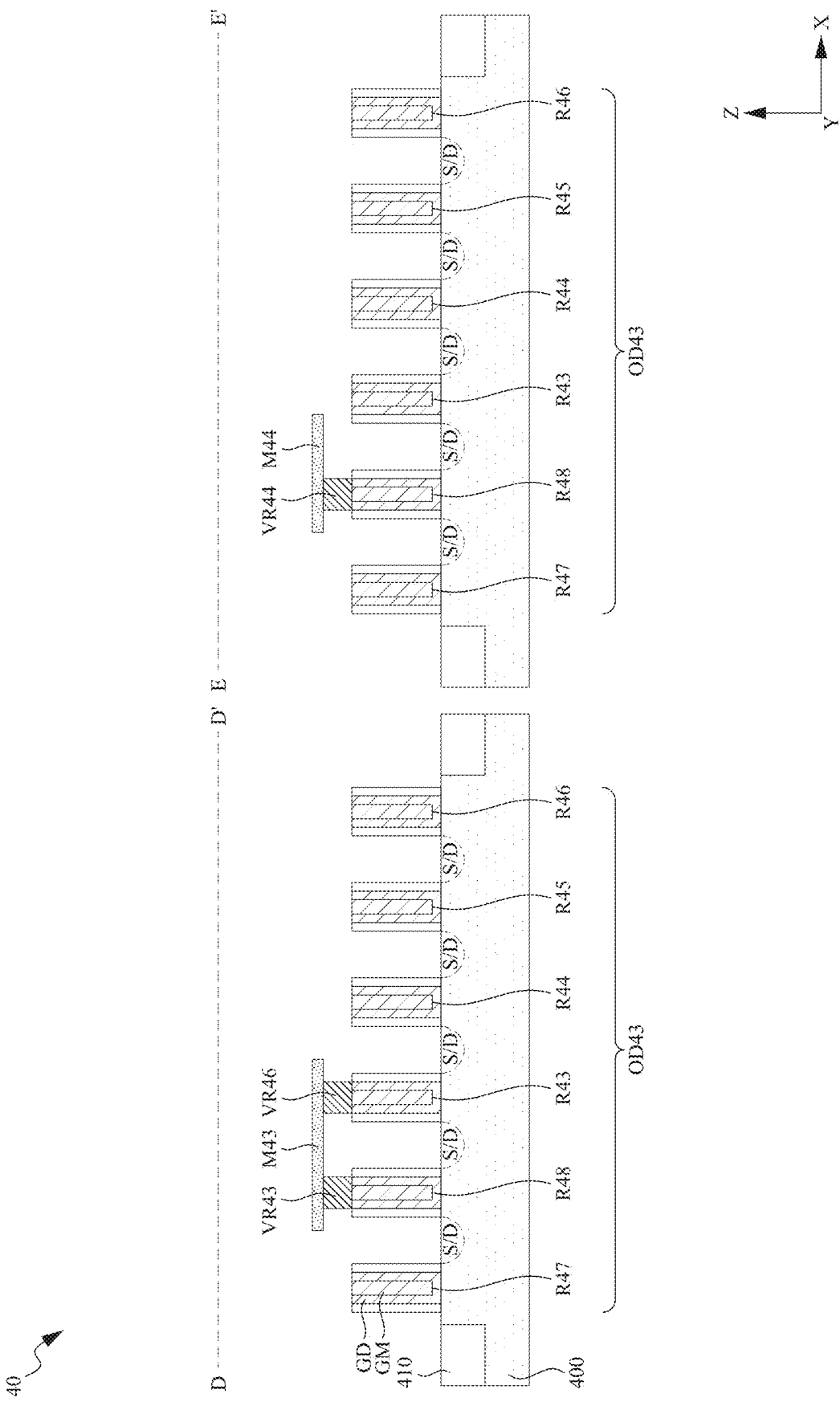
Figure 4D:
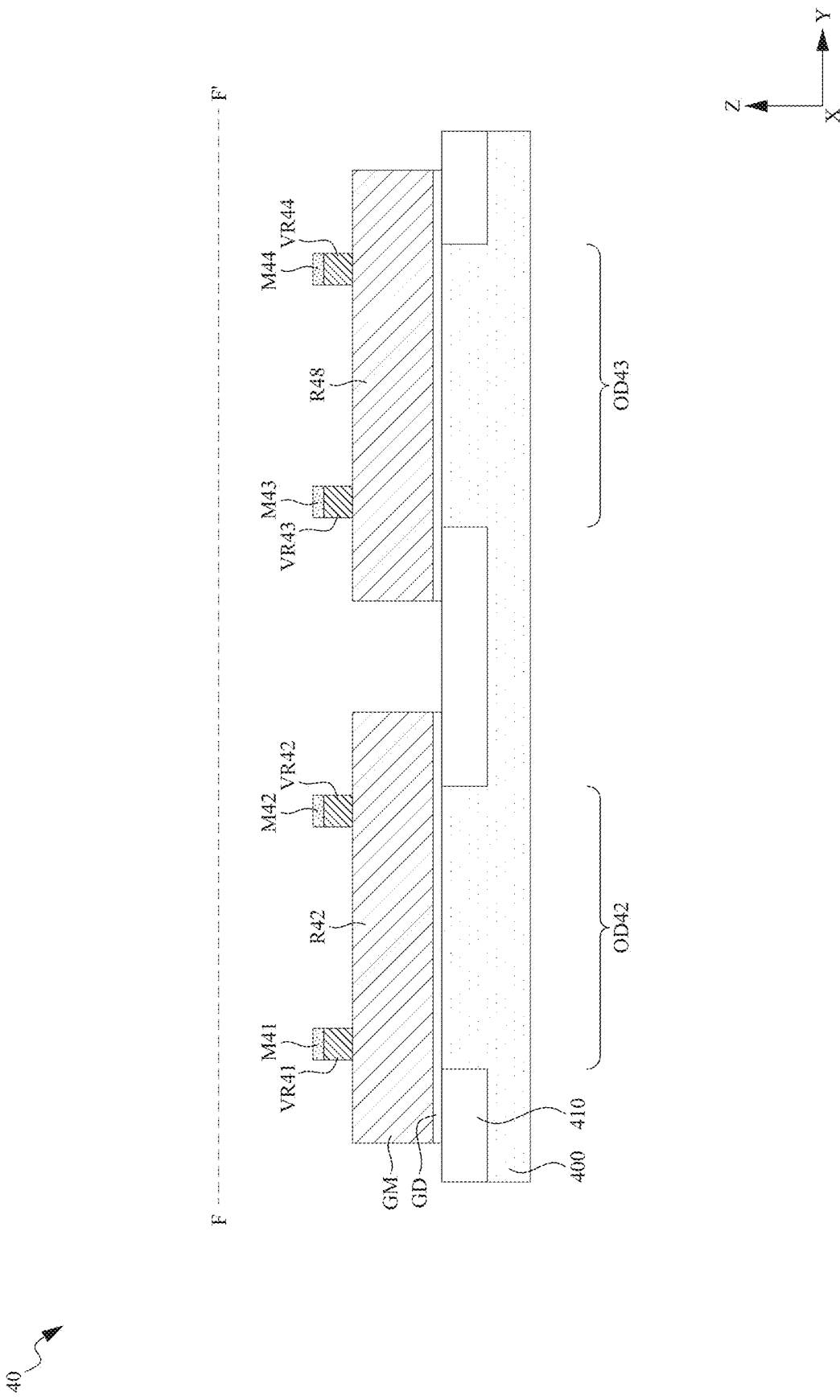
Figure 4E:
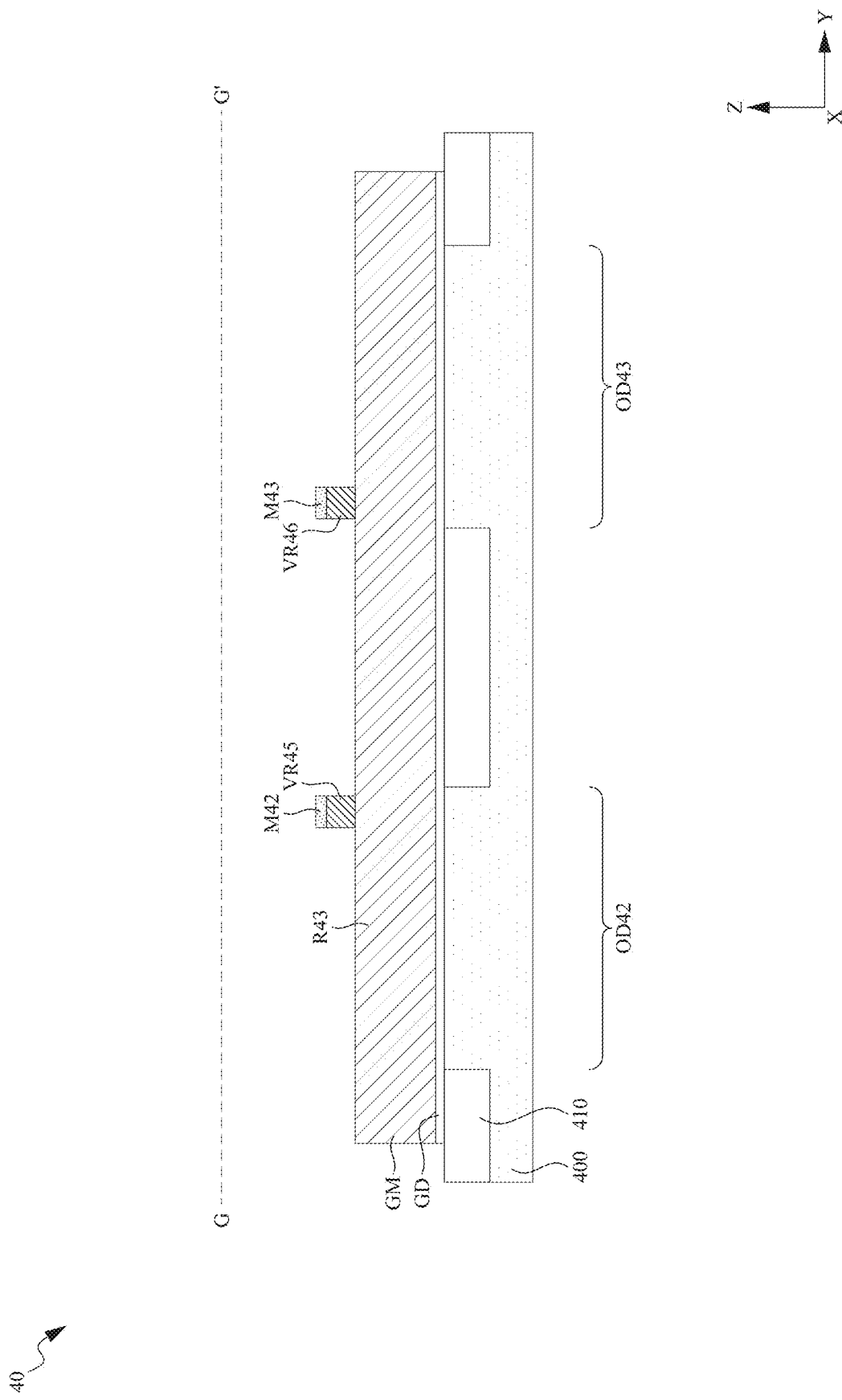

FIGS. 4A-4E illustrate a resistor circuit including dummy gate contacts overlapping different passive regions, in accordance with some embodiments. FIG. 4A illustrates a top view of an exemplary integrated circuit 40 having a transistor region 41 and a resistor region 42 in accordance with some embodiments of the present disclosure. FIG. 4B illustrates a cross-sectional view of the integrated circuit 40 in accordance with some embodiments, wherein the cross-sectional view combines a cross-sectional view obtained from the vertical plane containing line B-B' in FIG. 4A and a cross-sectional view obtained from the vertical plane containing line C-C' in FIG. 4A. FIG. 4C illustrates a cross-sectional view of the integrated circuit 40 in accordance with some embodiments, wherein the cross-sectional view combines a cross-sectional view obtained from the vertical plane containing line D-D' in FIG. 4A and a cross-sectional view obtained from the vertical plane containing line E-E' in FIG. 4A. FIG. 4D illustrates a cross-sectional view of the integrated circuit 40 obtained from the vertical plane containing line F-F' in FIG. 4A. FIG. 4E illustrates a cross-sectional view of the integrated circuit 40 obtained from the vertical plane containing line G-G' in FIG. 4A. The integrated circuit 40 is a non-limiting example for facilitating the illustration of the present disclosure.

The integrated circuit 40 includes a substrate 400 having an active region OD41 extending along the X-direction within the transistor region 41 and an upper passive region OD42 and a lower passive region OD43 extending along the X-direction within the resistor region 42. The active region OD41 and the passive regions OD42, OD43 are separated and electrically insulated from each other by an STI region 410. In some embodiments, example materials and configurations of the substrate 400, OD41, OD41 or OD42, and the STI region 410 can be the same as that of the corresponding substrate 100, OD11 and OD12 and the STI region 110 as described previously, and thus are not repeated for the sake of brevity.

The integrated circuit 40 further includes metal gate structures G41, G42, G43, G44, G45 and G46 extending within the transistor region 41 and across the active region OD41 along the Y-direction, and metal resistor structures R41, R42, R43, R44, R45, R46, R47 and R48 extending within the resistor region 42. The metal resistor structures R41 and R42 extend across the upper passive region OD42 along the Y-direction, and the metal resistor structures R47 and R48 extend across the lower passive region OD43 along the Y-direction. The metal resistor structures R43-R46 extend across both the upper passive region OD42 and the lower passive region OD43 along the Y-direction.

The metal resistor structures R41 and R42 are respectively aligned with the metal resistor structures R47 and R48 in the Y-direction. In this configuration, the metal resistor structures R41-R42 and R47-R48 can be formed by using a gate cut process. By way of example and not limitation, formation of the metal resistor structure R41 and the metal resistor structure R47 may include forming as a single continuous HKMG strip extending along the Y-direction from top view, followed by etching the single continuous HKMG strip to break it into separate strips that respectively serve as the metal resistor structure R41 and the metal resistor structure R47. In some embodiments, the metal resistor structures R41 and R42 can be misaligned with each of the metal resistor structures R47 and R48 in the Y-direction.

Example materials of the metal resistor structures R41-R48 and metal gate structures G41-G46 include high-k dielectric layer GD and gate metals GM as discussed previously with respect to the metal resistor structures R11-R16 and metal gate structures G11-G16, and thus are not repeated for the sake of brevity.

In the depicted embodiment as illustrated in FIG. 4A, the metal gate structures G41-G46 are equidistantly arranged along the X-direction at a gate pitch GP4 (i.e., center-to-center spacing between neighboring gate structures), and the metal resistor structures R41-R48 are equidistantly arranged along the X-direction at a resistor pitch RP4 (i.e., center-to-center spacing between neighboring metal resistor structures). In some embodiments, the resistor pitch RP4 is substantially equal to the gate pitch GP4. In some embodiments, the resistor pitch RP4 may be greater or less than the gate pitch GP4.

The integrated circuit 40 further includes a plurality of source/drain regions S/D in the active region OD41 and the passive regions OD42, OD43. The source/drain regions S/D are doped semiconductor regions located on opposite sides of the corresponding metal gate structures G41-G46 and metal resistor structures R41-R48. In some embodiments, the source/drain regions S/D include dopants or impurities for forming functional FETs in the active region OD41 and non-functional or dummy FETs in the passive regions OD42, OD43. Example materials and forming methods of the source/drain regions S/D of FIGS. 4A-4E are similar to those discussed previously with respect to FIG. 1A, and thus are not repeated for the sake of brevity.

In the depicted embodiment as illustrated in FIG. 4A, the integrated circuit 40 further includes a plurality of source/drain contacts MD landing on the respective source/drain regions S/D within the active region OD41. In some embodiments, one or more of the source/drain regions S/D within the passive region OD42 and OD43 do not include source/drain contacts landing on the corresponding one or more source/drain regions S/D within the passive region OD42 and OD43. In some embodiments, the source/drain regions S/D in the passive regions OD42 and OD43 are not electrically coupled to the metal line(s) in the overlying interconnect structure. Therefore, the source/drain regions S/D within the passive regions OD42 and OD43 are electrically floating while the source/drain regions S/D within the active region OD41 are electrically coupled to metal lines in overlying interconnect structure (not shown for the sake of clarity) by using the source/drain contacts MD. As a result, the source/drain regions S/D in the active region OD41 form functional transistors (i.e., transistors functioned to create channels in the active region OD41) with the corresponding metal gate structures G41-G46, while the electrically floating source/drain regions S/D in the passive regions OD42 and OD43 form non-functional or dummy transistors (i.e., transistor-like structures not functioned to create channels in the passive regions OD42 and OD43) with the metal resistor structures R41-R48.

The integrated circuit 40 further includes a plurality of gate contacts VG41, VG42, VG43, VG44, VG45 and VG46 over the corresponding metal gate structures G41-G46, respectively. The integrated circuit 40 further includes resistor contacts VR41 and VR42 over the metal resistor structure R42, resistor contacts VR43 and VR44 over the metal resistor structure R48, and resistor contacts VR45 and VR46 over the metal resistor structure R43. Example materials and forming methods of the gate contacts and resistor contacts of FIGS. 4A-4D are similar to those discussed previously with respect to FIG. 1A, and thus are not repeated for the sake of brevity.

The integrated circuit 40 further includes a plurality of metal lines M41, M42, M43 and M44 on a level above the gate contacts VG41-VG46 and resistor contacts VR41-VR46. In some embodiments, the metal lines M41-M44 are on a M0 layer or M1 layer. Other metal layers are within the scope of the present disclosure. The metal lines M41-M44 extend along the X-direction. The metal line M41 extends across an upper section of the metal resistor structure R42. The resistor contact VR41 is located where the metal line M41 overlaps the metal resistor structure R42, thus providing an electrical connection between the metal line M41 and the metal resistor structure R42. The metal line M42 extends across a lower section of the metal resistor structure R42 and an upper section of the metal resistor structure R43, and is electrically connected to the metal resistor structure R42 by the resistor contact VR42 and to the metal resistor structure R43 by the resistor contact VR45. The metal line M43 extends across an upper section of the metal resistor structure R48 and a lower section of the metal resistor structure R43, and is electrically connected to the metal resistor structure R48 by the resistor contact VR43 and to the metal resistor structure R43 by the resistor contact VR46. The metal line M44 extends across a lower section of the metal resistor structure R48, and is electrically connected to the metal resistor structure R48 by using the resistor contact VR44.

The metal resistor structures R42, R43, R48, the resistor contacts VR41-VR46, and the metal lines M41-M44 are connected in series to form a resistor circuit having a first node N41 at the metal line M41 and a second node N42 at the metal line M44. By way of example and not limitation, the resistor circuit 40 includes a series connection of the metal line M41, the resistor contact VR41, the metal resistor structure R42, the resistor contact VR42, the metal line M42, the resistor contact VR45, the metal resistor structure R43, the resistor contact VR46, the metal line M43, the resistor contact VR43, the metal resistor structure R48, the resistor contact VR44, and the metal line M44. As a result, a total resistance of the resistor circuit (i.e., the resistance between the first and second nodes N41 and N42) is the sum of the resistances of the metal lines M41-M44, the resistances of the resistor contacts VR41-VR46, and the resistances of the metal resistor structures R42, R43 and R48.

The upper passive region OD42 has width H41 measured in the Y-direction, and the lower passive region OD43 has a width H42 measured in the Y-direction. The upper passive region OD42 and the lower passive region OD43 are separated by a Y-directional distance S41. In some embodiments where the resistor contacts VR41 and VR42 overlap the upper passivation region OD42, the width H41 is in positive correlation with the Y-directional distance between the resistor contact VR41 and the resistor contact VR42, which is in turn in positive correlation with the resistance of the metal resistor structure R42. In some embodiments where the resistor contact VR45 overlaps the upper passive region OD42 and the resistor contact VR46 overlaps the lower passive region OD43, the Y-directional distance S41 between passive regions OD42 and OD43 is in positive correlation with the Y-direction distance between the resistor contacts VR45 and VR46, which is in turn in positive correlation with the resistance of the metal resistor structure R43. In some embodiments where the resistor contacts VR43 and VR44 overlap the lower passivation region OD43, the width H42 of the passive region OD43 is in positive correlation with the Y-direction distance between the resistor contact VR43 and the resistor contact VR44, which is in turn in positive correlation with the resistance of the metal resistor structure R48.

The width H41 of the upper passive region OD42 is thus selected depending on a desired resistance of the metal resistor structure R42. For example, the width H41 of the upper passive region OD42 is in a range from about 5% of the resistor pitch RP4 (i.e., gate pitch GP4) to about 1400% of the resistor pitch RP4. Excessively small width H41 might lead to increased challenge on the lithography process of forming the upper passive region OD42 with low manufacturing yield. Excessively short resistor pitch RP4 might lead to increased challenge on the lithography process of forming sacrificial gates that are to be replaced with the metal resistor structures with low manufacturing yield. Similarly, the width H42 of the lower passive region OD43 is selected depending on a desired resistance of the metal resistor structure R48. For example, the width H42 of the lower passive region OD43 is in a range from about 5% of the resistor pitch RP4 to about 1400% of the resistor pitch RP4. The Y-directional distance S41 between the passive regions OD42 and OD43 is selected depending on a desired resistance of the metal resistor structure R43. For example, the Y-directional distance S41 between the passive regions OD42 and OD43 is in a range from about 5% of the resistor pitch RP4 to about 1400% of the resistor pitch RP4. Excessively short width H42 might lead to increased challenge on the lithography process of forming the lower passive region OD43 with low manufacturing yield. Excessively short Y-directional distance S41 between the passive regions might lead to increased challenge on the lithography process of forming the passive regions with low manufacturing yield.

Figure 5A:
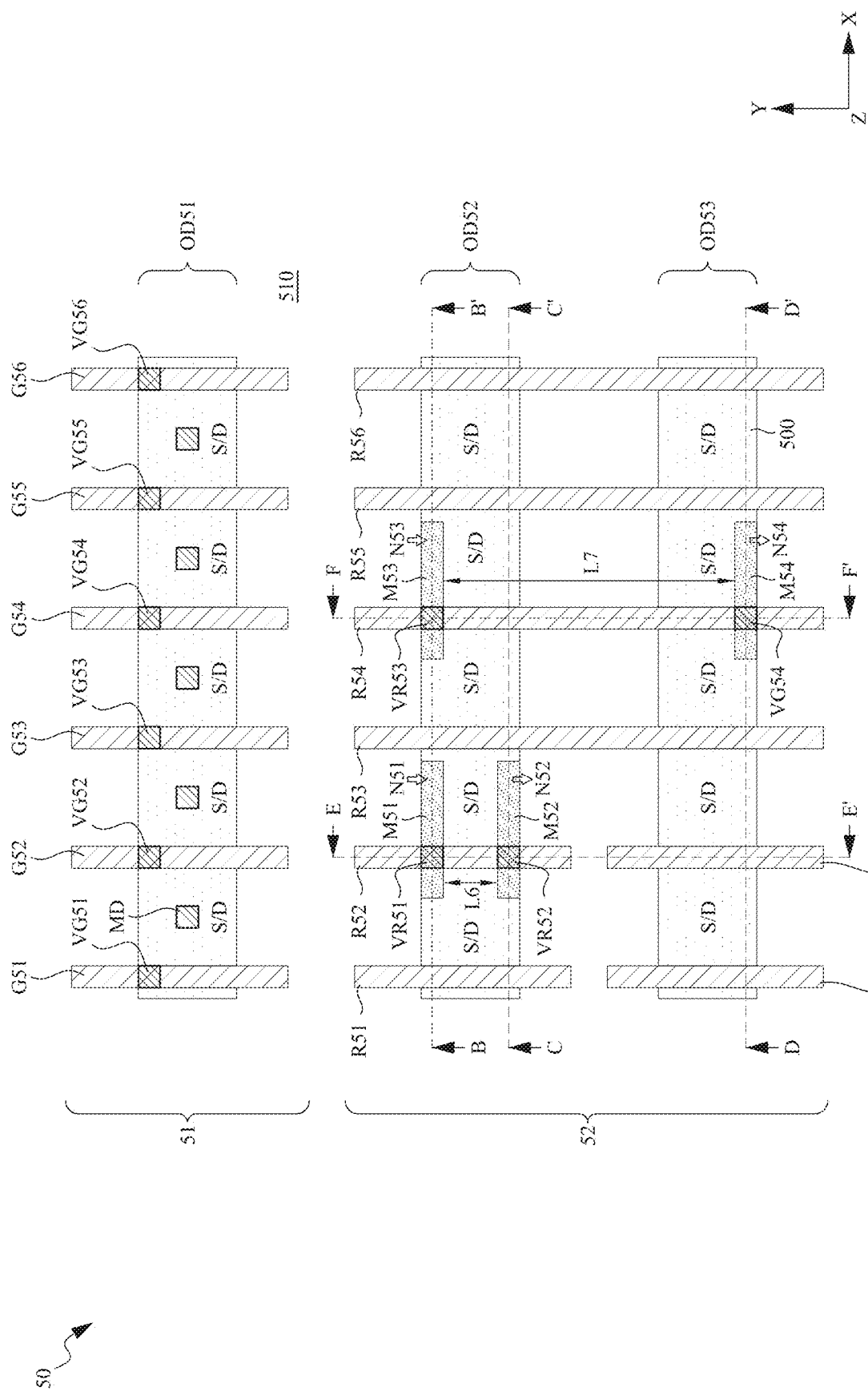
FIGS. 5A-5E illustrate different views of an integrated circuit in accordance with some embodiments of the present disclosure.
Figure 5B:
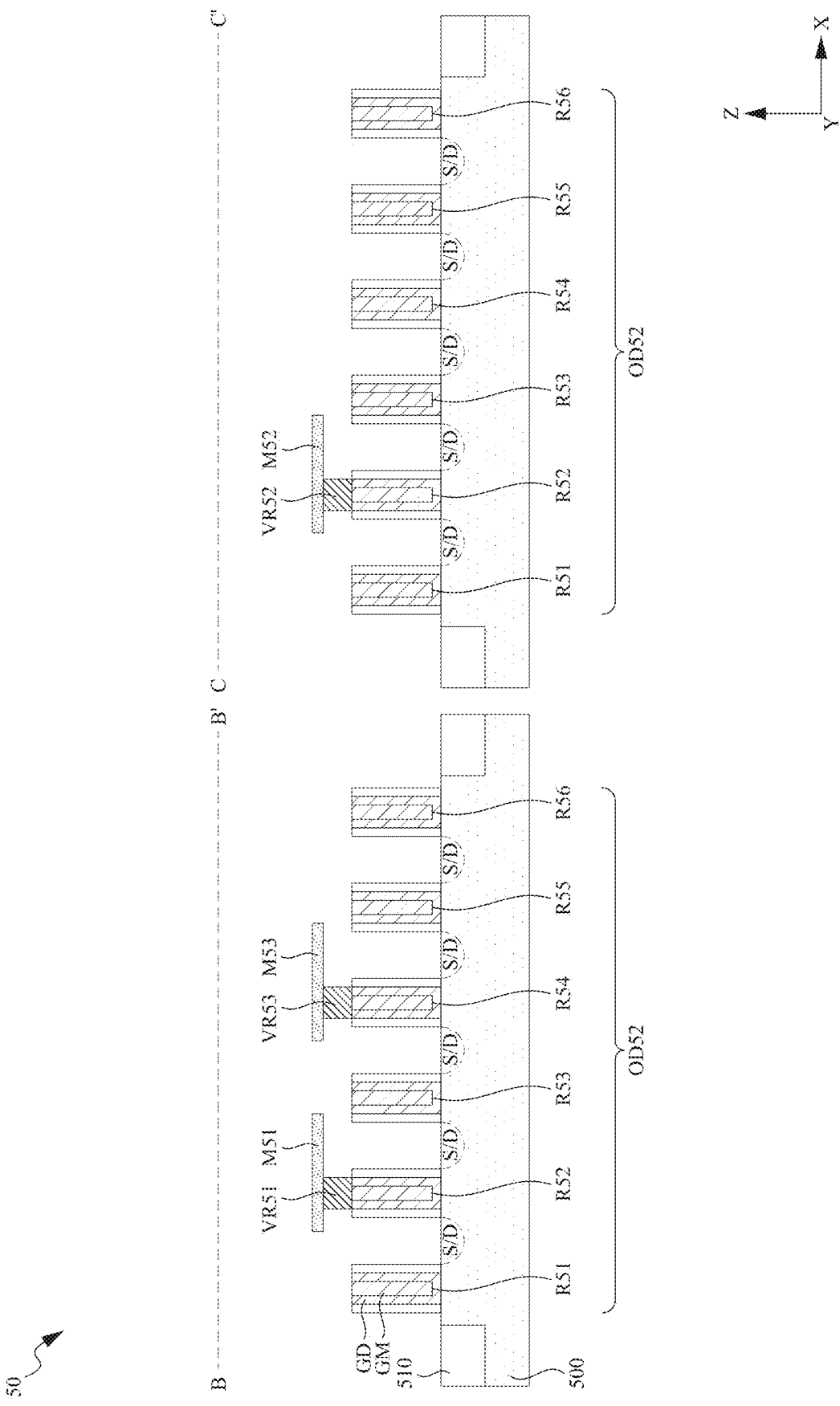
Figure 5C:
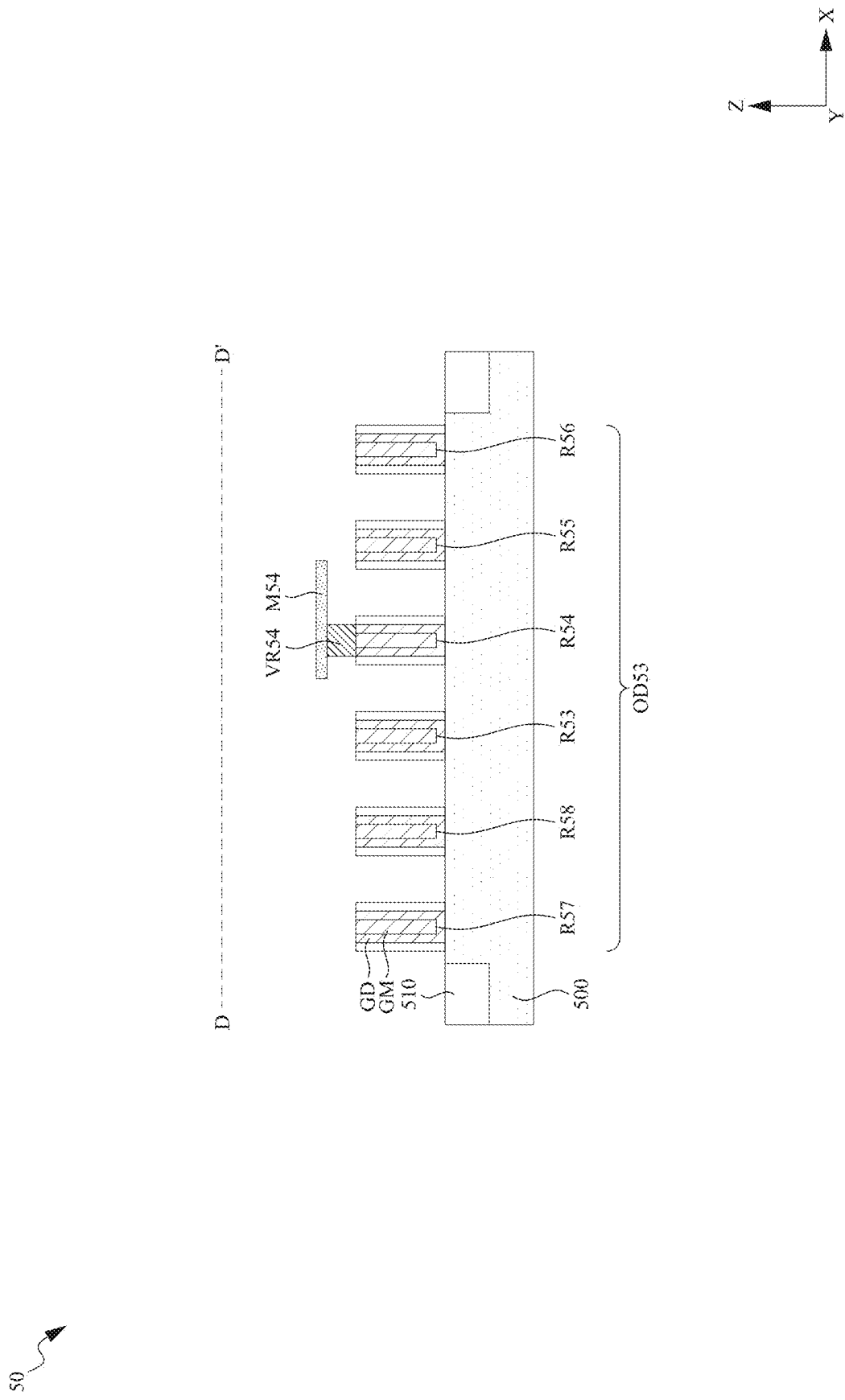
Figure 5D:
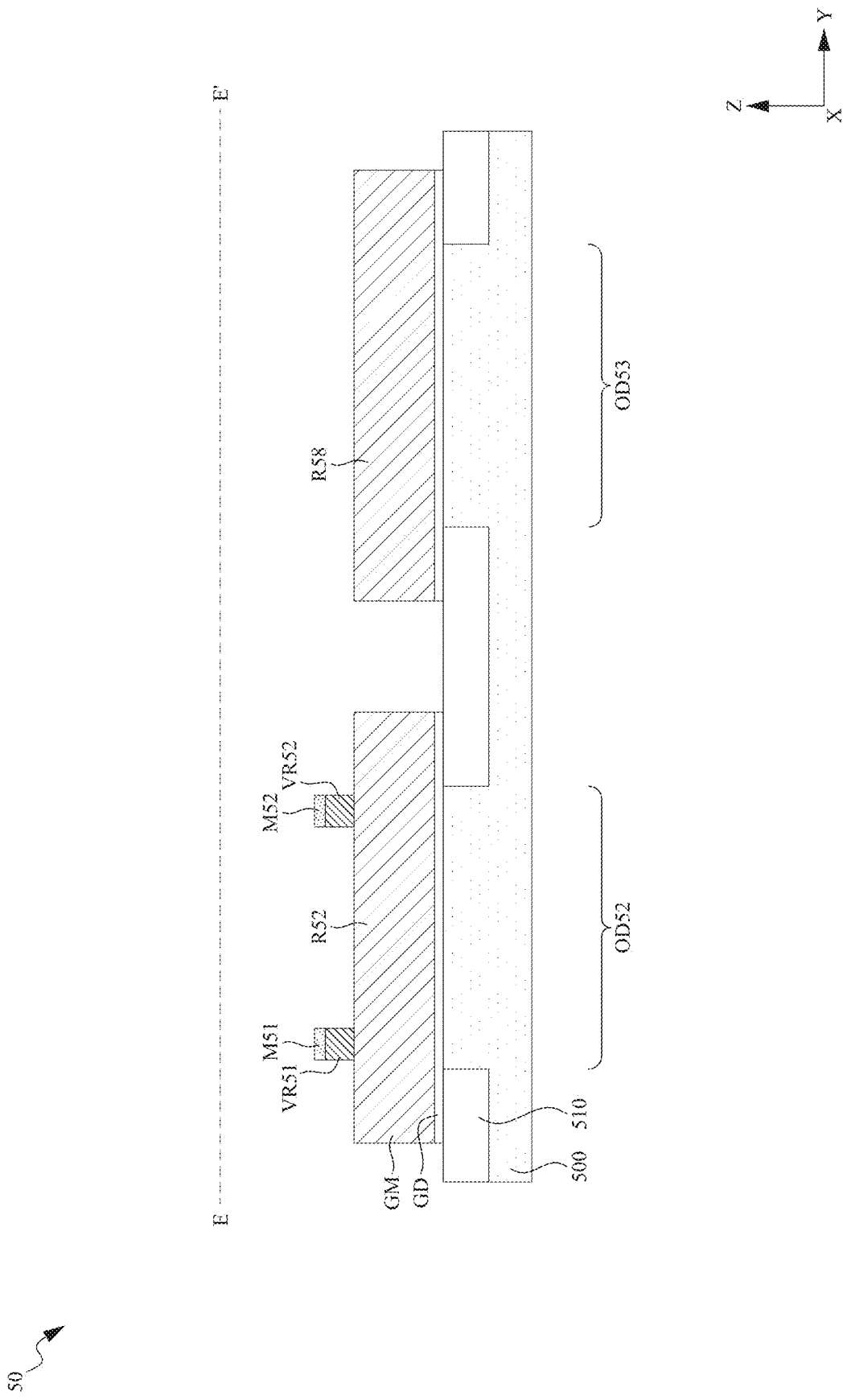
Figure 5E:
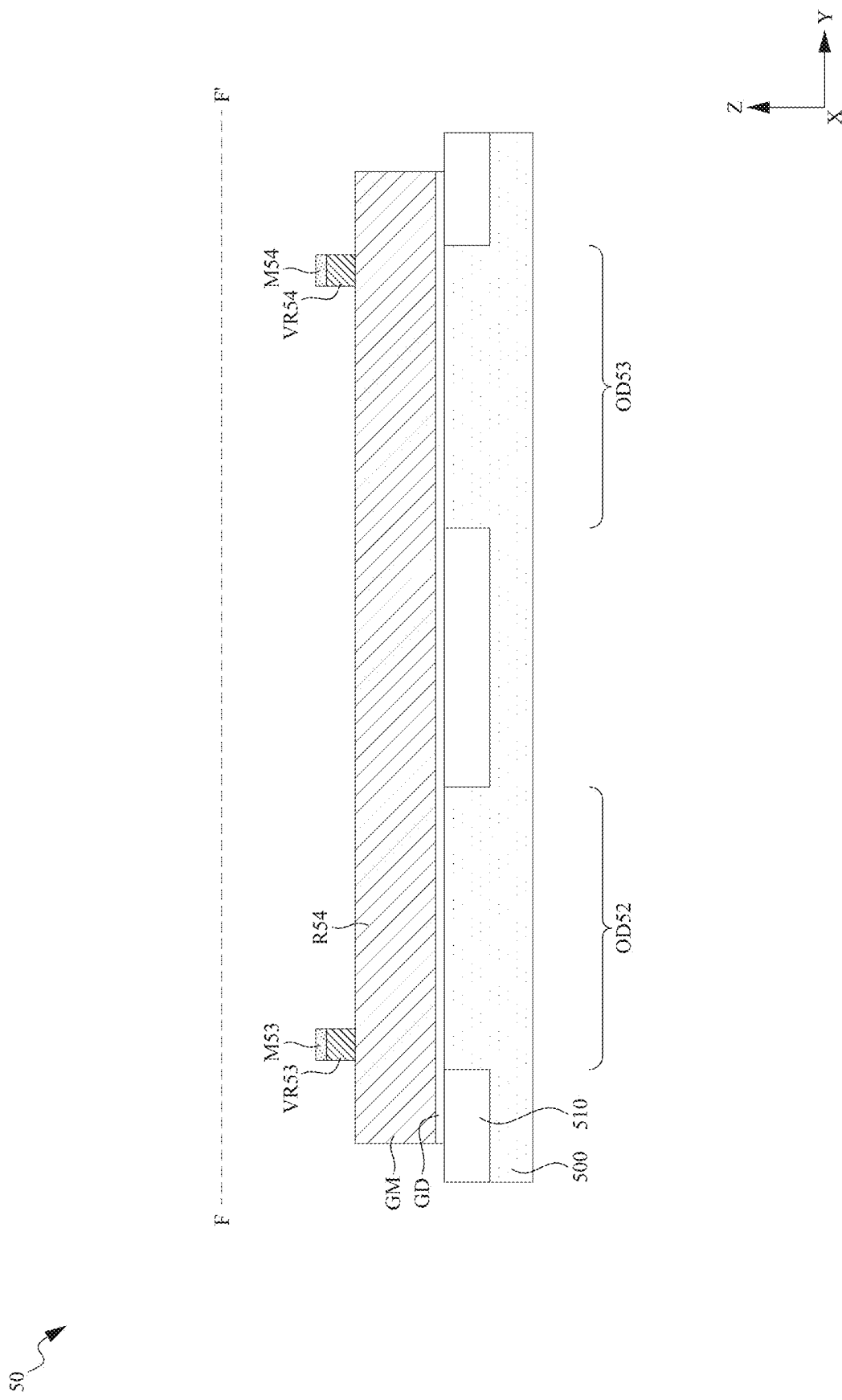

FIGS. 5A-5E illustrate two resistor circuits formed by two different dummy gates, in accordance with some embodiments. FIG. 5A illustrates a top view of an exemplary integrated circuit 50 having a transistor region 51 and a resistor region 52 in accordance with some embodiments of the present disclosure. FIG. 5B illustrates a cross-sectional view of the integrated circuit 50 in accordance with some embodiments, wherein the cross-sectional view combines a cross-sectional view obtained from the vertical plane containing line B-B' in FIG. 5A and a cross-sectional view obtained from the vertical plane containing line C-C' in FIG. 5A. FIG. 5C illustrates a cross-sectional view of the integrated circuit 50 obtained from the vertical plane containing line D-D' in FIG. 5A in accordance with some embodiments. FIG. 5D illustrates a cross-sectional view of the integrated circuit 50 obtained from the vertical plane containing line E-E' in FIG. 5A in accordance with some embodiments. FIG. 5E illustrates a cross-sectional view of the integrated circuit 50 obtained from the vertical plane containing line F-F' in FIG. 5A in accordance with some embodiments. The integrated circuit 50 is a non-limiting example for facilitating the illustration of the present disclosure.

The integrated circuit 50 includes a substrate 500 having an active region OD51 extending along the X-direction within the transistor region 51 and an upper passive region OD52 and a lower passive region OD53 extending along the X-direction within the resistor region 52. The active region OD51 and the passive regions OD52, OD53 are separated and electrically insulated from each other by an STI region 510. In some embodiments, example materials and configurations of the substrate 500, OD51 OD52 or OD53 and the STI region 510 can be the same as that of the substrate 100, OD11 and OD12 and the STI region 110 as described previously, and thus are not repeated for the sake of brevity.

The integrated circuit 50 further includes metal gate structures G51, G52, G53, G54, G55 and G56 extending within the transistor region 51 and across the active region OD51 along the Y-direction, and metal resistor structures R51, R52, R53, R54, R55, R56, R57 and R58 extending within the resistor region 52. The metal resistor structures R51 and R52 extend across the upper passive region OD52 along the Y-direction, and the metal resistor structures R57 and R58 extend across the lower passive region OD53 along the Y-direction. The metal resistor structures R53-R56 extend across both the upper passive region OD52 and the lower passive region OD53 along the Y-direction.

Example materials of the metal resistor structures R51-R58 and metal gate structures G51-G56 include high-k dielectric layer GD and gate metals GM similar to those discussed previously with respect to the metal resistor structures R11-R16 and metal gate structures G11-G16, and thus are not repeated for the sake of brevity.

The integrated circuit 50 further includes a plurality of source/drain regions S/D in the active region OD51 and the passive regions OD52, OD53. The source/drain regions S/D are doped semiconductor regions located on opposite sides of the corresponding metal gate structures G51-G56 and metal resistor structures R51-R58. In some embodiments, the source/drain regions S/D include dopants or impurities for forming functional FETs in the active region OD51 and non-functional or dummy FETs in the passive regions OD52, OD53. Example materials and forming methods of the source/drain regions S/D of FIGS. 5A-5E are similar to those discussed previously with respect to FIG. 1A, and thus are not repeated for the sake of brevity.

In the depicted embodiment as illustrated in FIG. 5A, the integrated circuit 50 further includes a plurality of source/drain contacts MD landing on the respective source/drain regions S/D within the active region OD51. In some embodiments, one or more of the source/drain regions S/D within the passive region OD52 and OD53 do not include source/drain contacts landing on the corresponding one or more source/drain regions S/D within the passive region OD52 and OD53. In some embodiments, the source/drain regions S/D in the passive regions OD52 and OD53 are not electrically coupled to the metal line(s) in the overlying interconnect structure. Therefore, the source/drain regions S/D within the passive regions OD52 and OD53 are electrically floating while the source/drain regions S/D within the active region OD51 are electrically coupled to metal lines in overlying interconnect structure (not shown for the sake of clarity) by using the source/drain contacts MD. As a result, the source/drain regions S/D in the active region OD51 form functional transistors (i.e., transistors functioned to create channels in the active region OD51) with the corresponding metal gate structures G51-G56, while the electrically floating source/drain regions S/D in the passive regions OD52 and OD53 form non-functional or dummy transistors (i.e., transistor-like structures not functioned to create channels in the passive regions OD52 and OD53) with the metal resistor structures R51-R58.

The integrated circuit 50 further includes a plurality of gate contacts VG51, VG52, VG53, VG54, VG55 and VG56 over the corresponding metal gate structures G51-G56, respectively. The integrated circuit 50 further includes resistor contacts VR51 and VR52 over the metal resistor structure R52, and resistor contacts VR53 and VR54 over the metal resistor structure R54. Example materials and forming methods of the gate contacts and resistor contacts of FIGS. 5A-5E are similar to those discussed previously with respect to FIG. 1A, and thus are not repeated for the sake of brevity.

The integrated circuit 50 further includes a plurality of metal lines M51, M52, M53 and M55 on a level above the gate contacts VG51-VG56 and resistor contacts VR51-VR54. In some embodiments, the metal lines M51-M54 are on a M0 layer or M1 layer. Other metal layers are within the scope of the present disclosure. The metal lines M51-M54 extend along the X-direction. The metal line M51 extends across an upper section of the metal resistor structure R52. The resistor contact VR51 is located where the metal line M51 overlaps the metal resistor structure R52, thus providing an electrical connection between the metal line M51 and the metal resistor structure R52. The metal line M52 extends across a lower section of the metal resistor structure R52, and is electrically connected to the metal resistor structure R52 by the resistor contact VR52. The metal line M53 extends across an upper section of the metal resistor structure R54, and is electrically connected to the metal resistor structure R54 by the resistor contact VR53. The metal line M54 extends across a lower section of the metal resistor structure R54, and is electrically connected to the metal resistor structure R54 by using the resistor contact VR54.

The metal resistor structure R52, the resistor contacts VR51-VR52, and the metal lines M51-M52 are connected in series to form a resistor circuit having a first node N51 at the metal line M51 and a second node N52 at the metal line M52. Moreover, the metal resistor structure R54, the resistor contacts VR53-VR54, and the metal lines M53-M54 are connected in series to form a resistor circuit having a first node N53 at the metal line M53 and a second node N54 at the metal line M54. In some embodiments, the metal lines M53 and M54 are electrically isolated from each of the metal lines M51 and M52, and thus the resistor circuit having nodes N53 and N54 are independent of the resistor circuit having the nodes N51 and N52.

Moreover, the Y-directional distance L6 between the resistor contacts VR51 and VR52 is less than the Y-directional distance L7 between the resistor contacts VR53 and VR54, and thus the metal resistor structure R52 has a lower resistance than the metal resistor structure R54, which in turn results in a lower resistance in the resistor circuit having the nodes N51 and N52 than in the resistor circuit having the nodes N53 and N54. By way of example and not limitation, in some embodiments, a ratio of the Y-directional distance L6 between the resistor contacts VR51 and VR52 is in a range from about 5% of the Y-directional distance L7 between the resistor contacts VR53 and VR54 to about 95% of the Y-directional distance L7. Excessively short Y-directional distance L6 might lead to increased challenge on the lithography process of forming resistor contacts VR51, VR52 and metal lines M51, M52 and M53 with low manufacturing yield. Excessively short Y-directional distance L7 would lead to small spacing between the passive regions OD52 and OD53, which in turn would result in increased challenge on the lithography process of forming the passive regions with low manufacturing yield.

Figure 6A:
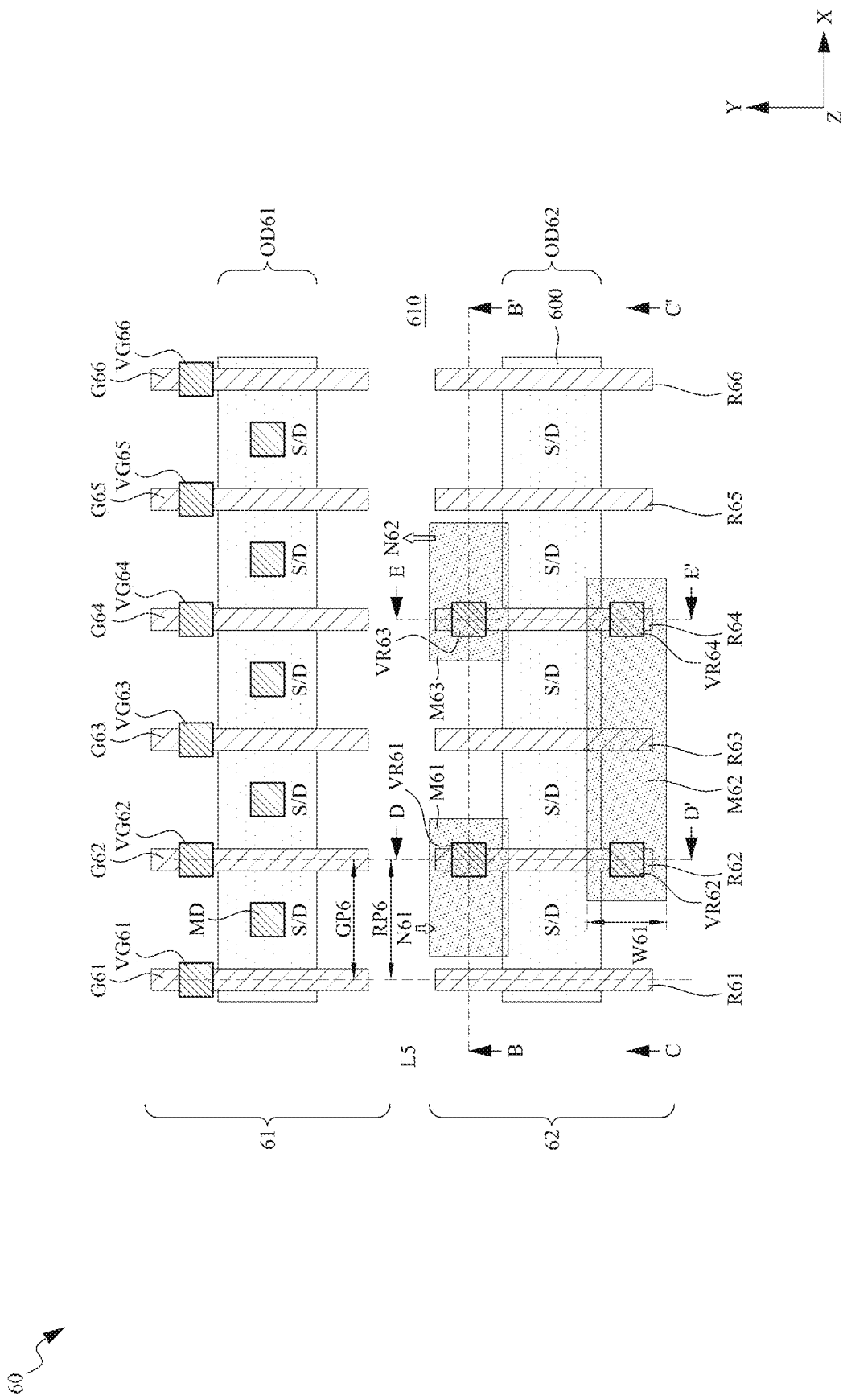
FIGS. 6A-6C illustrate different views of an integrated circuit in accordance with some embodiments of the present disclosure.
Figure 6B:
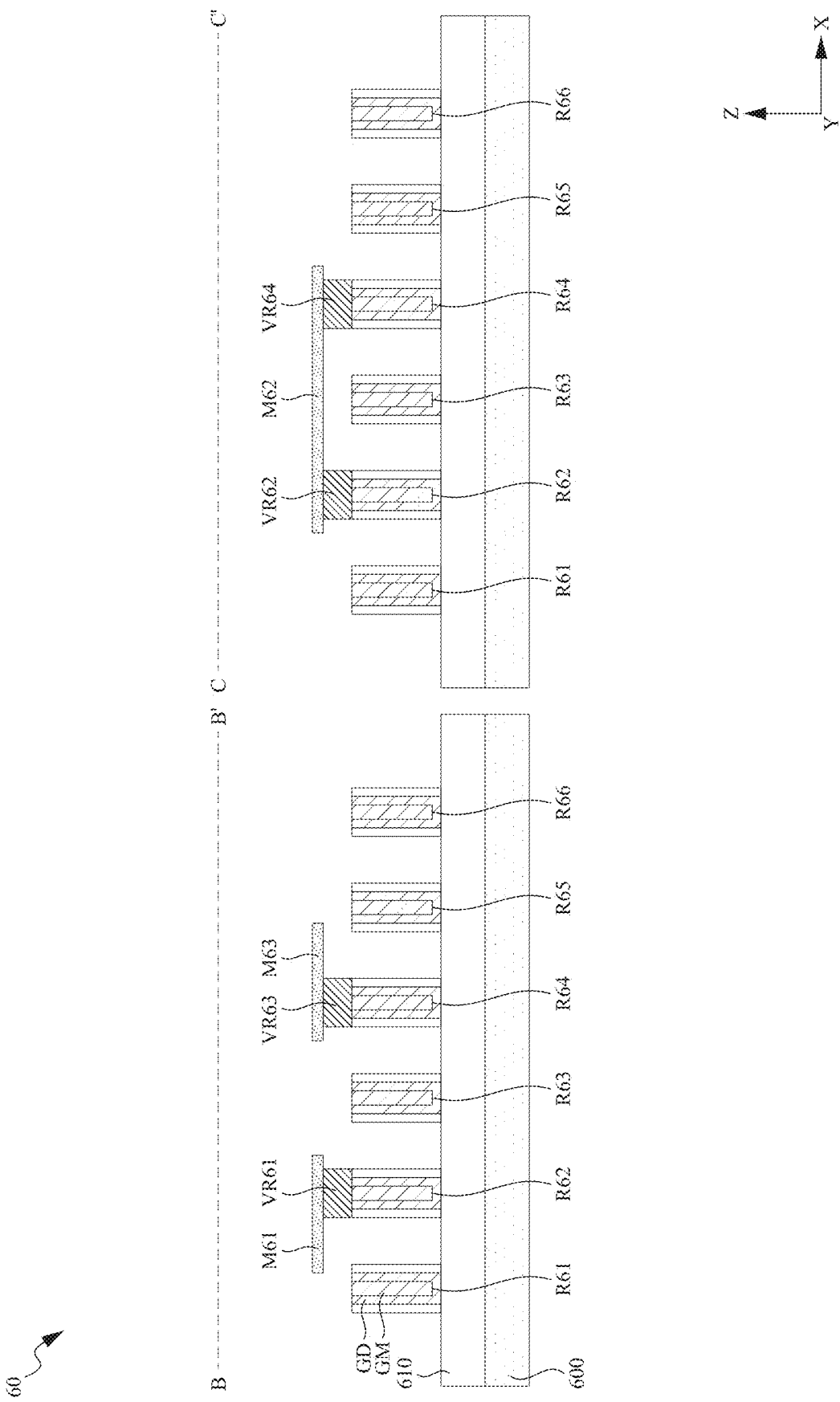
Figure 6C:
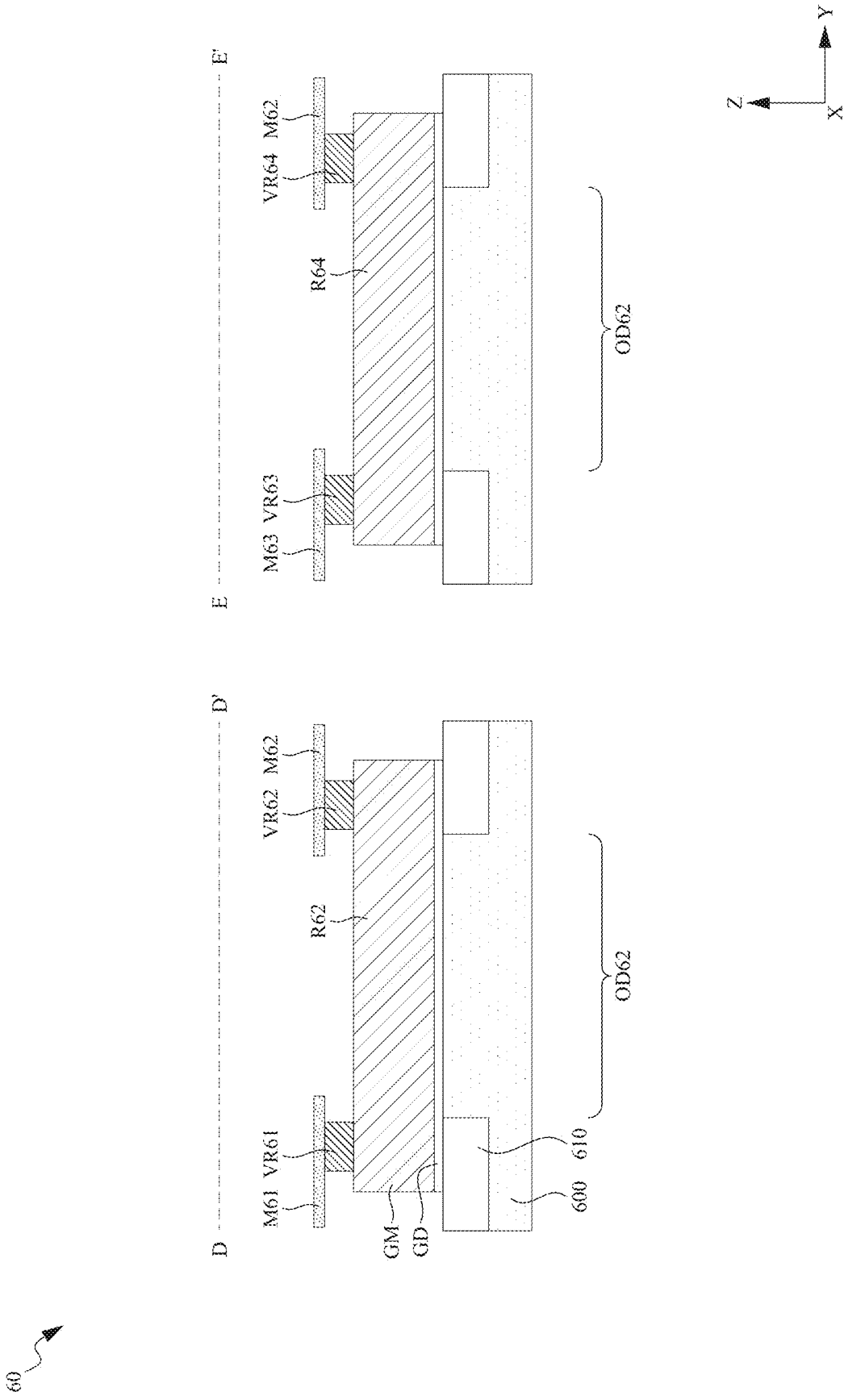

FIGS. 6A-6C illustrate a resistor circuit including thicker metal lines and larger dummy gate contacts than other embodiments, in accordance with some embodiments. FIG. 6A illustrates a top view of an exemplary integrated circuit 60 having a transistor region 61 and a resistor region 62 in accordance with some embodiments of the present disclosure. FIG. 6B illustrates a cross-sectional view of the integrated circuit 60 in accordance with some embodiments, wherein the cross-sectional view combines a cross-sectional view obtained from the vertical plane containing line B-B' in FIG. 6A and a cross-sectional view obtained from the vertical plane containing line C-C' in FIG. 6A. FIG. 6C illustrates a cross-sectional view of the integrated circuit 60 in accordance with some embodiments, wherein the cross-sectional view combines a cross-sectional view obtained from the vertical plane containing line D-D' in FIG. 6A and a cross-sectional view obtained from the vertical plane containing line E-E' in FIG. 6A. The integrated circuit 60 is a non-limiting example for facilitating the illustration of the present disclosure.

The integrated circuit 60 includes a substrate 600 having an active region OD61 extending along the X-direction within the transistor region 61 and a passive region OD62 extending along the X-direction within the resistor region 62. The active region OD61 is separated and electrically insulated from the passive region OD62 by an STI region 610. In some embodiments, example materials and configurations of the substrate 600, OD61, OD62 and the STI region 610 can be the same as that of the substrate 100, OD11, OD12 and the STI region 110 as described previously, and thus are not repeated for the sake of brevity.

The integrated circuit 60 further includes metal gate structures G61, G62, G63, G64, G65 and G66 extending within the transistor region 61 and across the active region OD61 along the Y-direction, and metal resistor structures R61, R62, R63, R64, R65 and R66 extending within the resistor region 62 and across the passive region OD62 along the Y-direction. Example materials of the metal resistor structures R61-R66 and metal gate structures G61-G66 include high-k dielectric layer GD and gate metals GM are similar to those discussed previously with respect to the metal resistor structures R11-R16 and metal gate structures G11-G16, and thus are not repeated for the sake of brevity.

In the depicted embodiment as illustrated in FIG. 6A, the metal gate structures G61-G66 are equidistantly arranged along the X-direction at a gate pitch GP6 (i.e., center-to-center spacing between neighboring gate structures), and the metal resistor structures R61-R66 are equidistantly arranged along the X-direction at a resistor pitch RP6 (i.e., center-to-center spacing between neighboring metal resistor structures). In some embodiments, the resistor pitch RP6 is substantially equal to the gate pitch GP6. In some embodiments, the resistor pitch RP6 may be greater or less than the gate pitch GP6.

The integrated circuit 60 further includes a plurality of source/drain regions S/D in the active region OD61 and the passive region OD62. The source/drain regions S/D are doped semiconductor regions located on opposite sides of the corresponding metal gate structures G61-G66 and metal resistor structures R61-R66. In some embodiments, the source/drain regions S/D include dopants or impurities for forming functional FETs in the active region OD61 and non-functional or dummy FETs in the passive region OD62. Example materials and forming methods of the source/drain regions S/D of FIGS. 6A-6C are similar to those discussed previously with respect to FIG. 1A, and thus are not repeated for the sake of brevity.

In the depicted embodiment as illustrated in FIG. 6A, the integrated circuit 60 further includes a plurality of source/drain contacts MD landing on the respective source/drain regions S/D within the active region OD61. In some embodiments, one or more of the source/drain regions S/D within the passive region OD62 do not include source/drain contacts landing on the corresponding one or more source/drain regions S/D within the passive region OD62. In some embodiments, the source/drain regions S/D in the passive region OD62 are not electrically coupled to the metal line(s) in the overlying interconnect structure. Therefore, the source/drain regions S/D within the passive region OD62 are electrically floating while the source/drain regions S/D within the active region OD61 are electrically coupled to metal lines in overlying interconnect structure (not shown for the sake of clarity) by using the source/drain contacts MD. As a result, the source/drain regions S/D in the active region OD61 form functional transistors (i.e., transistors functioned to create channels in the active region OD61) with the corresponding metal gate structures G61-G66, while the electrically floating source/drain regions S/D in the passive region OD62 form non-functional or dummy transistors (i.e., transistor-like structures not functioned to create channels in the passive region OD62) with the metal resistor structures R61-R66.

The integrated circuit 60 further includes a plurality of gate contacts VG61, VG62, VG63, VG64, VG65 and VG66 over the corresponding metal gate structures G61-G66, respectively. The integrated circuit 60 further includes resistor contacts VR61 and VR62 over the metal resistor structure R62, and resistor contacts VR63 and VR64 over the metal resistor structure R64. Example materials and forming methods of the gate contacts and resistor contacts of FIGS. 6A-6C are similar to those discussed previously with respect to FIG. 1A, and thus are not repeated for the sake of brevity.

The integrated circuit 60 further includes a plurality of metal lines M61, M62 and M63 on a next level above the gate contacts VG61-VG66 and resistor contacts VR61-VR64. In some embodiments, the metal lines M61-M63 are on a M0 layer or M1 layer. Other metal layers are within the scope of the present disclosure. The metal lines M61-M63 extend along the X-direction. The metal line M61 extends across an upper section of the metal resistor structure R62. The resistor contact VR61 is located where the metal line M61 overlaps the metal resistor structure R62, thus providing an electrical connection between the metal line M61 and the metal resistor structure R62. The metal line M62 extends across both lower sections of the metal resistor structures R62-R64, and is electrically connected to the metal resistor structure R62 by the resistor contact VR62 and to the metal resistor structure R64 by the resistor contact VR64. The metal line M63 extends across an upper section of the metal resistor structure R64, and is electrically connected to the metal resistor structure R64 by the resistor contact VR63. The metal resistor structures R62 and R64, the resistor contacts VR61-VR64, and the metal lines M61-M63 are connected in series to form a resistor circuit having a first node N61 at the metal line M61 and a second node N62 at the metal line M63.

Resistance to electromigration (EM) in the metal lines M61-M63 are in negative correlation with current density in the metal lines M61-M63. Current density in the metal lines M61-M63 is in negative correlation with the width W61 of the metal lines M61-M63. Therefore, the metal line width W61 of the metal lines M61-M63 can be selected depending on desired EM resistance of the metal lines M61-M63. Specifically, if the integrated circuit 60 has stricter requirements on the EM resistance, the metal line width W61 of the metal lines M61-M63 can be larger compared with metal line width in embodiments having more relaxed requirements on EM resistance (e.g., FIG. 1A). By way of example and not limitation, the metal line width W61 is in a range from about 10% of the resistor pitch RP6 to about 500% of the resistor pitch RP6. Excessively short metal line width W61 might lead to increased challenge on the lithography process of forming metal lines M61-M63 with low manufacturing yield. Excessively short resistor pitch RP6 might lead to increased challenge on the lithography process of forming sacrificial gates that are to be replaced with the metal resistor structures R61-R66 with low manufacturing yield. Moreover, the increased metal line width not only enhances the resistance to electromigration, but may also reduce the electrical resistances of the metal lines M61-M63, which in turn reduces the total resistance of the resistor circuit between the nodes N61 and N62.

Similarly, EM resistance in the resistor contacts VR61-VR64 are in negative correlation with current density in the resistor contacts VR61-VR64. Current density in the resistor contacts VR61-VR64 is in negative correlation with the top-view areas of the resistor contacts VR61-VR64. Therefore, the top-view areas of the resistor contacts VR61-VR64 can be selected depending on desired EM resistance of the resistor contacts VR61-VR64. Specifically, if the integrated circuit 60 has stricter requirements on the EM resistance, the top-view areas of the resistor contacts VR61-VR64 can be larger compared with resistor contacts in embodiments having more relaxed requirements on EM resistance (e.g., FIG. 1A). By way of example and not limitation, the top-view area of each of the resistor contacts VR61-VR64 are in a range from about 101% of each of the top-view area of the resistor contacts VR11-VR16 (illustrated in FIG. 1A) to about 500% of each of the top-view area of the resistor contacts VR11-VR16. Excessively small top-view area of the resistor contacts might lead to increased challenge on the lithography process of forming resistor contacts with low manufacturing yield. Excessively large top-view area of the resistor contacts might lead to small spacing between resistor contacts, which in turn would also result in increased challenge on the lithography process of forming resistor contacts with low manufacturing yield. Moreover, the increased top-view areas of resistor contacts VR61-VR64 not only enhance the resistance to electromigration, but may also reduce the electrical resistances of the resistor contacts VR61-VR64, which in turn reduces the total resistance of the resistor circuit between the nodes N61 and N62.

Figure 7A:
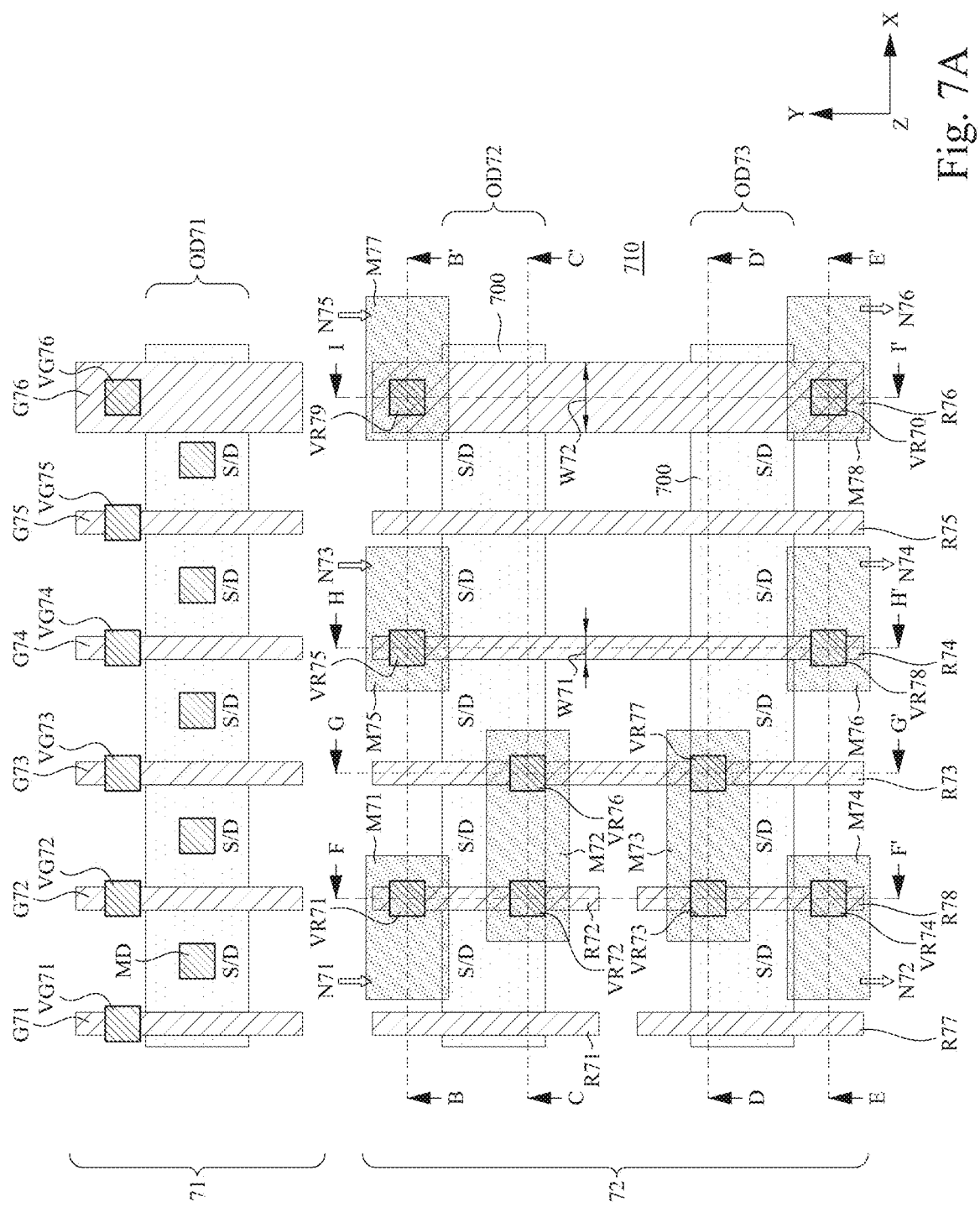
FIGS. 7A-7G illustrate different views of an integrated circuit in accordance with some embodiments of the present disclosure.
Figure 7B:
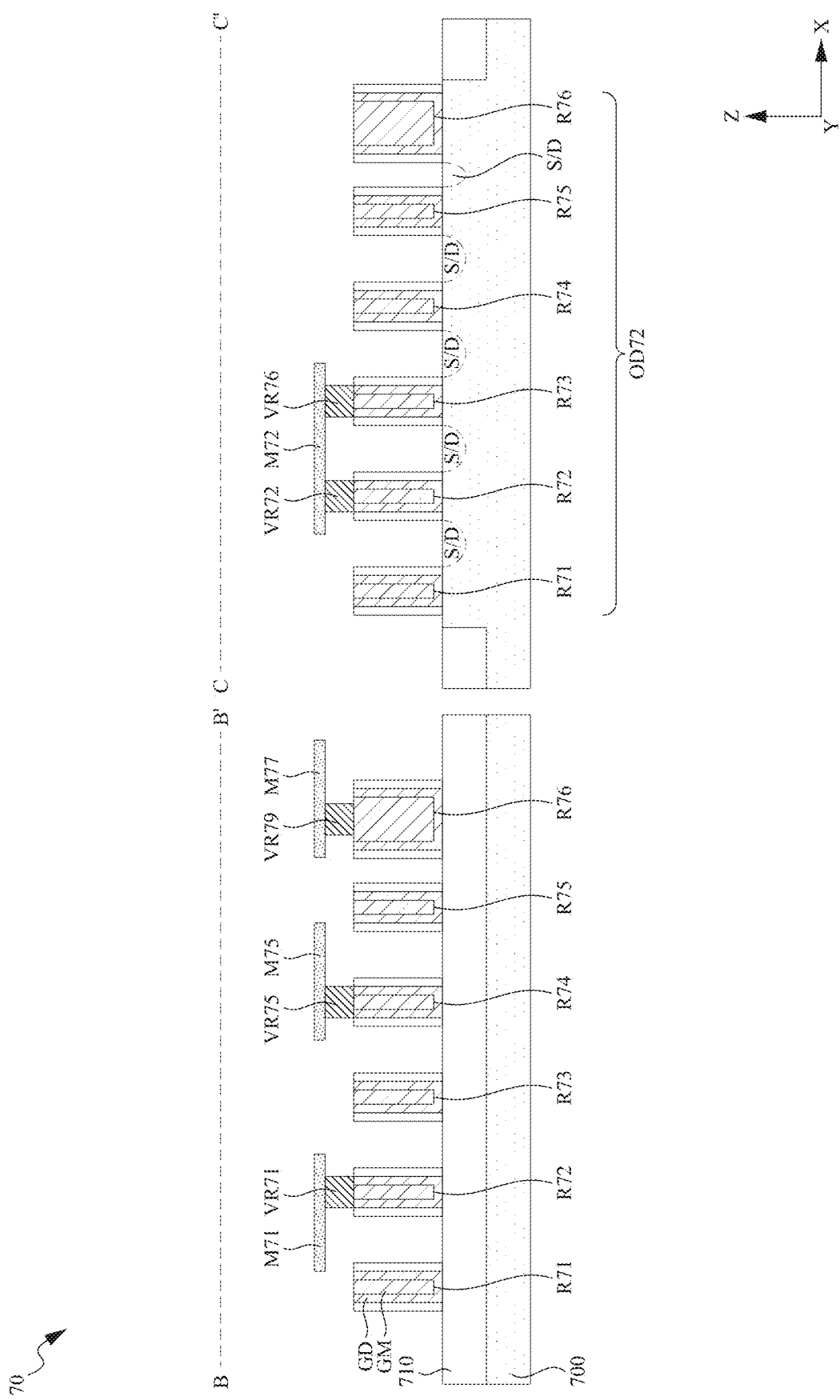
Figure 7C:
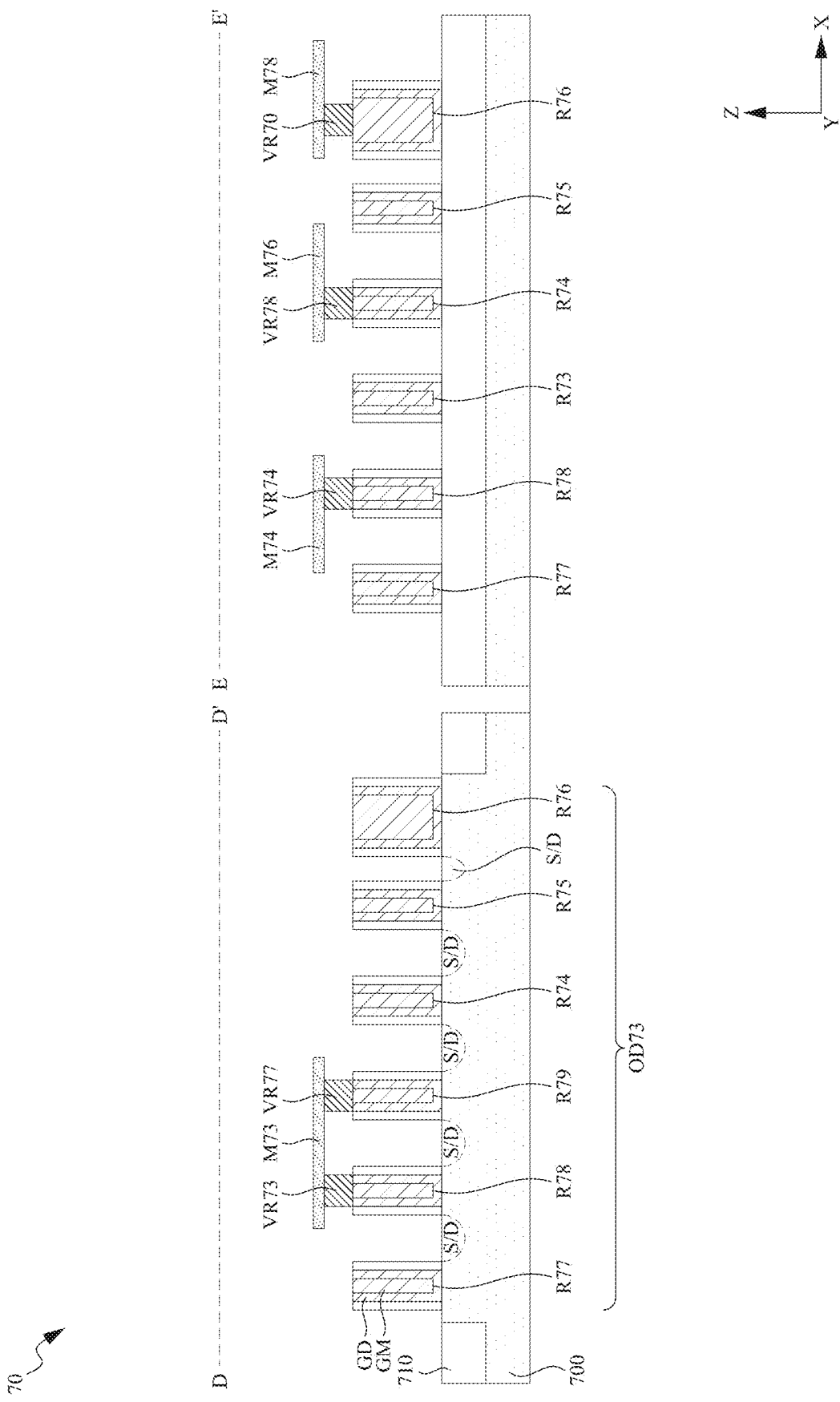
Figure 7D:
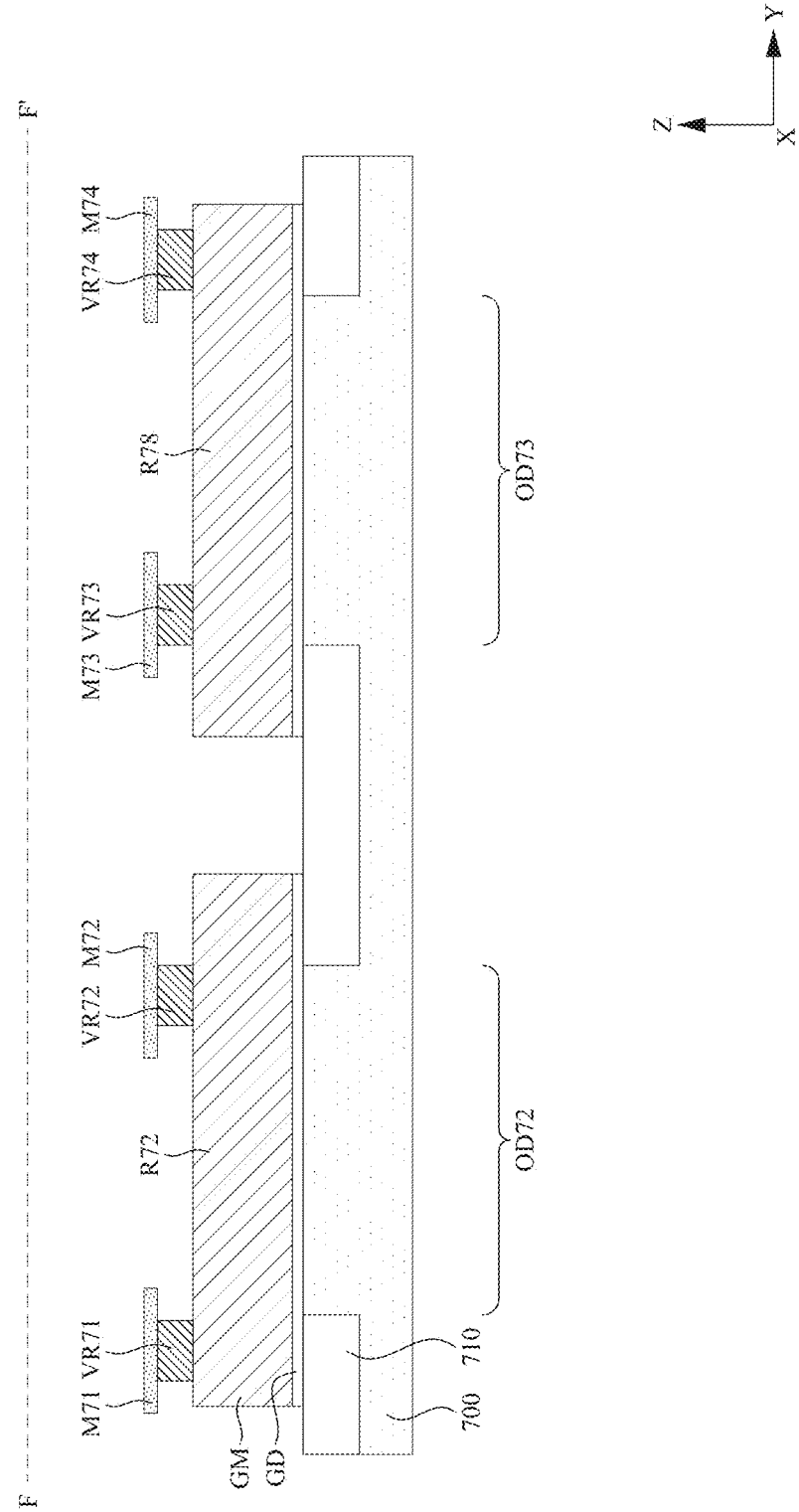
Figure 7E:
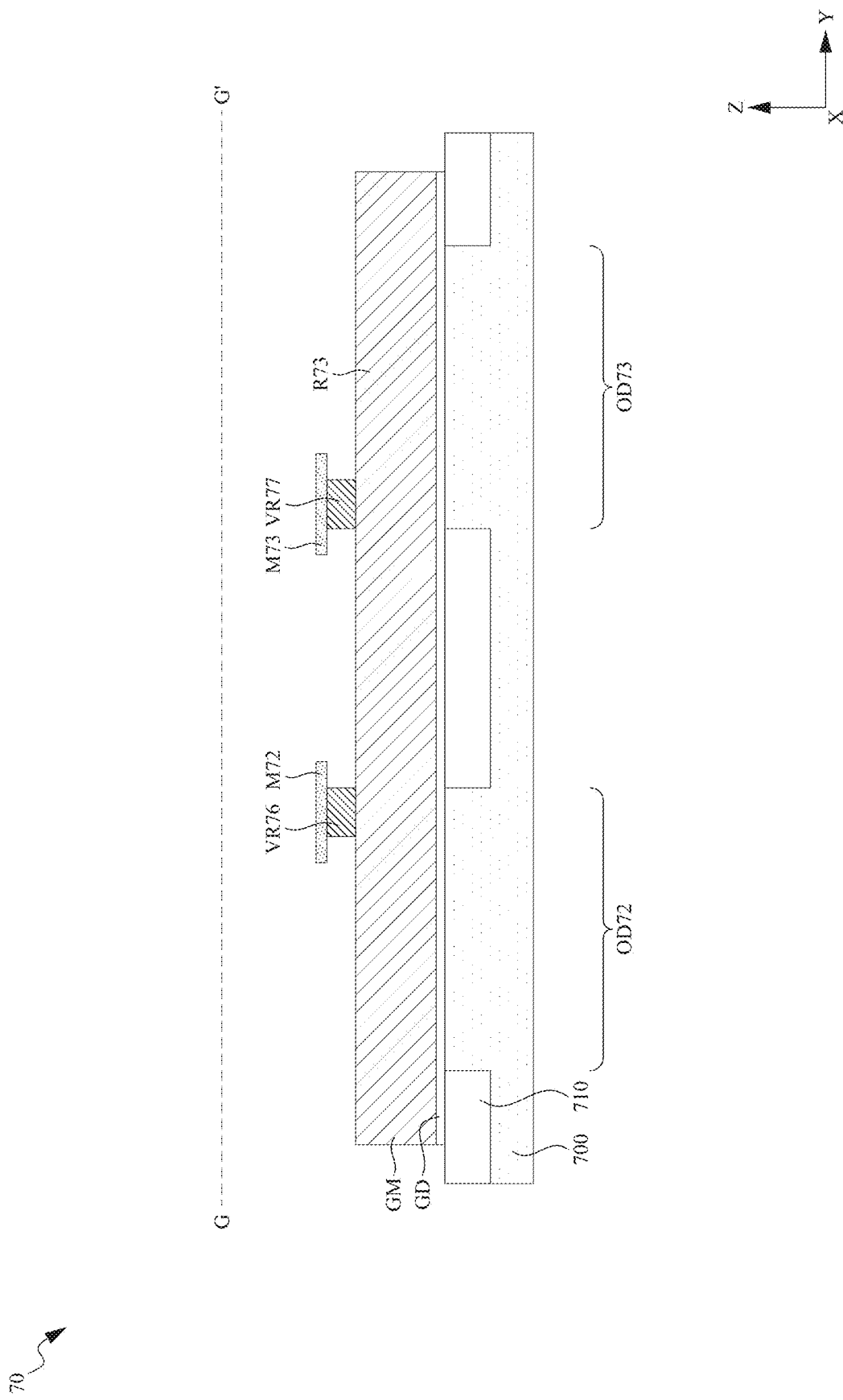
Figure 7F:
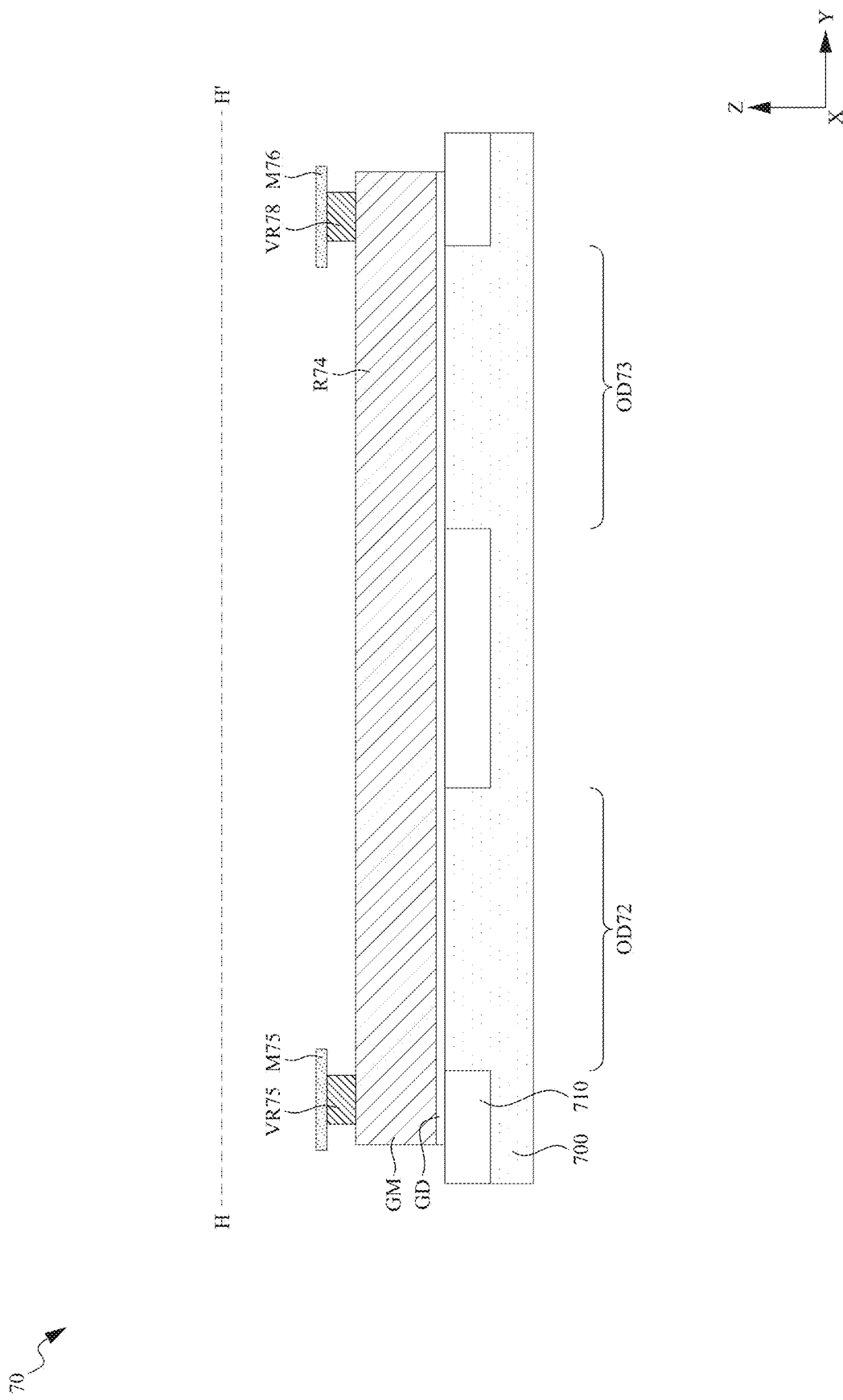
Figure 7G:
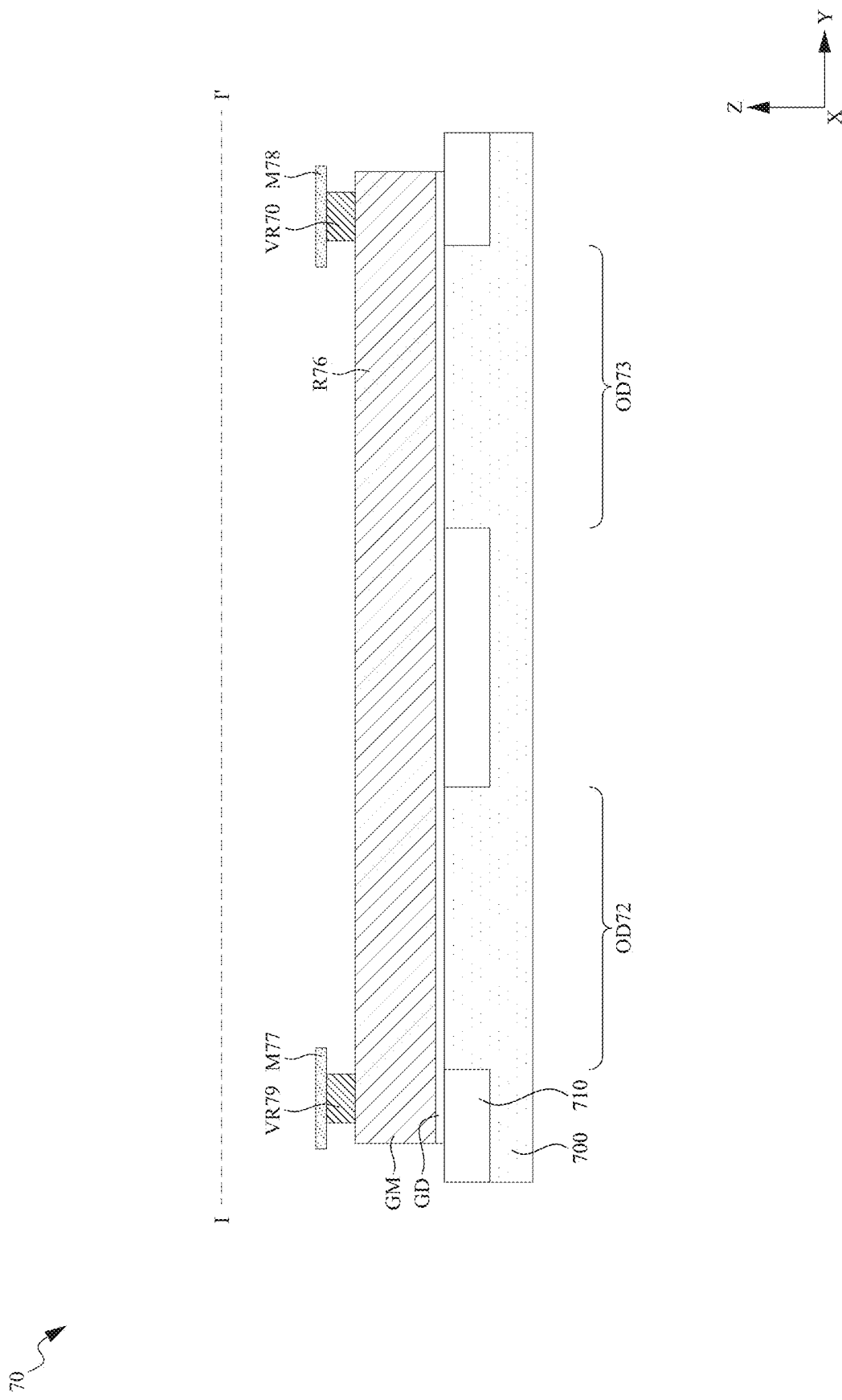

FIGS. 7A-7G illustrate three resistor circuits, wherein one resistor circuit includes a wider dummy gate than the dummy gates of the other two resistor circuits, in accordance with some embodiments. FIG. 7A illustrates a top view of an exemplary integrated circuit 70 having a transistor region 71 and a resistor region 72 in accordance with some embodiments of the present disclosure. FIG. 7B illustrates a cross-sectional view of the integrated circuit 70 in accordance with some embodiments, wherein the cross-sectional view combines a cross-sectional view obtained from the vertical plane containing line B-B' in FIG. 7A and a cross-sectional view obtained from the vertical plane containing line C-C' in FIG. 7A. FIG. 7C illustrates a cross-sectional view of the integrated circuit 70 in accordance with some embodiments, wherein the cross-sectional view combines a cross-sectional view obtained from the vertical plane containing line D-D' in FIG. 7A and a cross-sectional view obtained from the vertical plane containing line E-E' in FIG. 7A. FIG. 7D illustrates a cross-sectional view of the integrated circuit 70 obtained from the vertical plane containing line F-F' in FIG. 7A in accordance with some embodiments. FIG. 7E illustrates a cross-sectional view of the integrated circuit 70 obtained from the vertical plane containing line G-G' in FIG. 7A in accordance with some embodiments. FIG. 7F illustrates a cross-sectional view of the integrated circuit 70 obtained from the vertical plane containing line H-H' in FIG. 7A in accordance with some embodiments. FIG. 7G illustrates a cross-sectional view of the integrated circuit 70 obtained from the vertical plane containing line I-I' in FIG. 7A in accordance with some embodiments. The integrated circuit 70 is a non-limiting example for facilitating the illustration of the present disclosure.

The integrated circuit 70 includes a substrate 700 having an active region OD71 extending along the X-direction within the transistor region 71 and an upper passive region OD72 and a lower passive region OD73 extending along the X-direction within the resistor region 72. The active region OD71 and the passive regions OD72, OD73 are separated and electrically insulated from each other by an STI region 710. In some embodiments, example materials and configurations of the substrate 700, OD71 OD72 or OD73 and the STI region 710 can be the same as that of the substrate 100, OD11 or OD12 and the STI region 110 as described previously, and thus are not repeated for the sake of brevity.

The integrated circuit 70 further includes metal gate structures G71, G72, G73, G74, G75 and G76 extending within the transistor region 71 and across the active region OD71 along the Y-direction, and metal resistor structures R71, R72, R73, R74, R75, R76, R77 and R78 extending within the resistor region 72. The metal resistor structures R71 and R72 extend across the upper passive region OD72 along the Y-direction, and the metal resistor structures R77 and R78 extend across the lower passive region OD73 along the Y-direction. The metal resistor structures R71 and R72 are respectively aligned with the metal resistor structures R77 and R78 in the Y-direction. The metal resistor structures R73-R76 extend across both the upper passive region OD72 and the lower passive region OD73 along the Y-direction.

Example materials of the metal resistor structures R71-R78 and metal gate structures G71-G76 include high-k dielectric layer GD and gate metals GM are similar to those discussed previously with respect to the metal resistor structures R11-R16 and metal gate structures G11-G16, and thus are not repeated for the sake of brevity.

The integrated circuit 70 further includes a plurality of source/drain regions S/D in the active region OD71 and the passive regions OD72, OD73. The source/drain regions S/D are doped semiconductor regions located on opposite sides of the corresponding metal gate structures G71-G76 and metal resistor structures R71-R78. In some embodiments, the source/drain regions S/D include dopants or impurities for forming functional FETs in the active region OD71 and non-functional or dummy FETs in the passive regions OD72, OD73. Example materials and forming methods of the source/drain regions S/D of FIGS. 7A-7G are similar to those discussed previously with respect to FIG. 1A, and thus are not repeated for the sake of brevity.

In the depicted embodiment as illustrated in FIG. 7A, the integrated circuit 70 further includes a plurality of source/drain contacts MD landing on the respective source/drain regions S/D within the active region OD71. In some embodiments, one or more of the source/drain regions S/D within the passive region OD72 and OD73 do not include source/drain contacts landing on the corresponding one or more source/drain regions S/D within the passive region OD72 and OD73. In some embodiments, the source/drain regions S/D in the passive regions OD72 and OD73 are not electrically coupled to the metal line(s) in the overlying interconnect structure. Therefore, the source/drain regions S/D within the passive regions OD72 and OD73 are electrically floating while the source/drain regions S/D within the active region OD71 are electrically coupled to metal lines in overlying interconnect structure (not shown for the sake of clarity) by using the source/drain contacts MD. As a result, the source/drain regions S/D in the active region OD71 form functional transistors (i.e., transistors functioned to create channels in the active region OD71) with the corresponding metal gate structures G71-G76, while the electrically floating source/drain regions S/D in the passive regions OD72 and OD73 form non-functional or dummy transistors (i.e., transistor-like structures not functioned to create channels in the passive regions OD72 and OD73) with the metal resistor structures R71-R78.

The integrated circuit 70 further includes a plurality of gate contacts VG71, VG72, VG73, VG74, VG75 and VG76 over the corresponding metal gate structures G71-G76, respectively. The integrated circuit 70 further includes resistor contacts VR71 and VR72 over the metal resistor structure R72, resistor contacts VR73 and VR74 over the metal resistor structure R78, resistor contacts VR76 and VR77 over the metal resistor structure R73, resistor contacts VR75 and VR78 over the metal resistor structure R74, and resistor contacts VR79 and VR70 over the metal resistor structure R76. Example materials and forming methods of the gate contacts and resistor contacts of FIGS. 7A-7G are similar to those discussed previously with respect to FIG. 1A, and thus are not repeated for the sake of brevity.

The integrated circuit 70 further includes a plurality of metal lines M71, M72, M73, M74, M75, M76, M77 and M78 on a level above the gate contacts VG71-VG76 and resistor contacts VR70-VR79. In some embodiments, the metal lines M71-M76 are on a M0 layer or M1 layer. Other metal layers are within the scope of the present disclosure. The metal lines M71-M78 extend along the X-direction. The metal line M71 extends across an upper section of the metal resistor structure R72. The resistor contact VR71 is located where the metal line M71 overlaps the metal resistor structure R72, thus providing an electrical connection between the metal line M71 and the metal resistor structure R72. The metal line M72 extends across a lower section of the metal resistor structure R72 and an upper section of the metal resistor structure R73, and is electrically connected to the metal resistor structure R72 by the resistor contact VR72 and to the metal resistor structure R73 by the resistor contact VR76. The metal line M73 extends across an upper section of the metal resistor structure R78 and a lower section of the metal resistor structure R73, and is electrically connected to the metal resistor structure R78 by the resistor contact VR73 and to the metal resistor structure R73 by the resistor contact VR77. The metal line M74 extends across a lower section of the metal resistor structure R78, and is electrically connected to the metal resistor structure R78 by the resistor contact VR74. The metal resistor structures R72, R73, R78, the resistor contacts VR71-VR74, VR76-VR77, and the metal lines M71-M74 are connected in series thereby forming a resistor circuit having a first node N71 at the metal line M71 and a second node N72 at the metal line M74.

The metal line M75 extends across an upper section of the metal resistor structure R74 and is electrically connected to the metal resistor structure R74 by the resistor contact VR75. The metal line M76 extends across a lower section of the metal resistor structure R74 and is electrically connected to the metal resistor structure R74 by the resistor contact VR78. The metal lines M75-M76, the resistor contacts VR75, VR78, and the metal resistor structure R74 are connected in series thereby forming a resistor circuit having a first node N73 at the metal line M75 and a second node N74 at the metal line M76.

The metal line M77 extends across an upper section of the metal resistor structure R76 and is electrically connected to the metal resistor structure R76 by the resistor contact VR79. The metal line M78 extends across a lower section of the metal resistor structure R76 and is electrically connected to the metal resistor structure R76 by the resistor contact VR70. The metal lines M77-M78, the resistor contacts VR79, VR70, and the metal resistor structure R76 are connected in series thereby forming a resistor circuit having a first node N75 at the metal line M76 and a second node N76 at the metal line M78.

A width of a metal resistor structure is in negative correlation with resistance of the meal resistor structure, and thus the width of the metal resistor structure can be selected depending on a desired resistance of the metal resistor structure. For example, in some embodiments, the width W72 of the metal resistor structure R76 is greater than the width W71 of the metal resistor structure R74, which in turn results in a lower resistance in the wider resistor structure R76 than in the narrower resistor structure R74. By way of example and not limitation, the width W72 of the wider resistor structure R76 is in a range from about 101% of the width W71 of the narrower resistor structure R74 to about 7000% of the width W71 of the narrower resistor structure R74. Excessively large width W72 of the resistor structure R76 might lead to small spacing between the resistor structure R76 and other resistor structures, which in turn would result in increased challenge on the lithography process of forming sacrificial gates that are to be replaced with the resistor structures with low manufacturing yield.

Figure 8A:
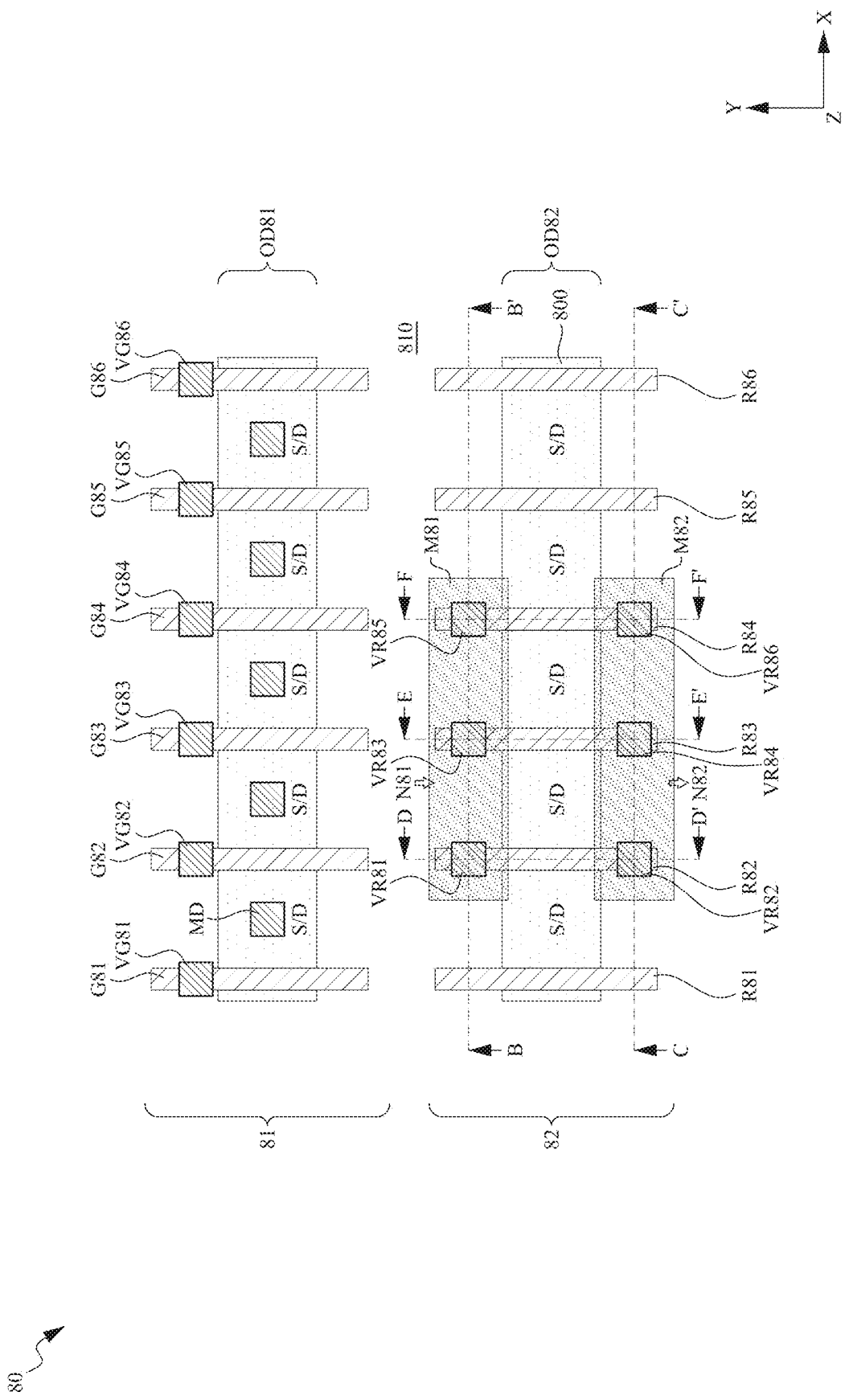
FIGS. 8A-8C illustrate different views of an integrated circuit in accordance with some embodiments of the present disclosure.
Figure 8B:
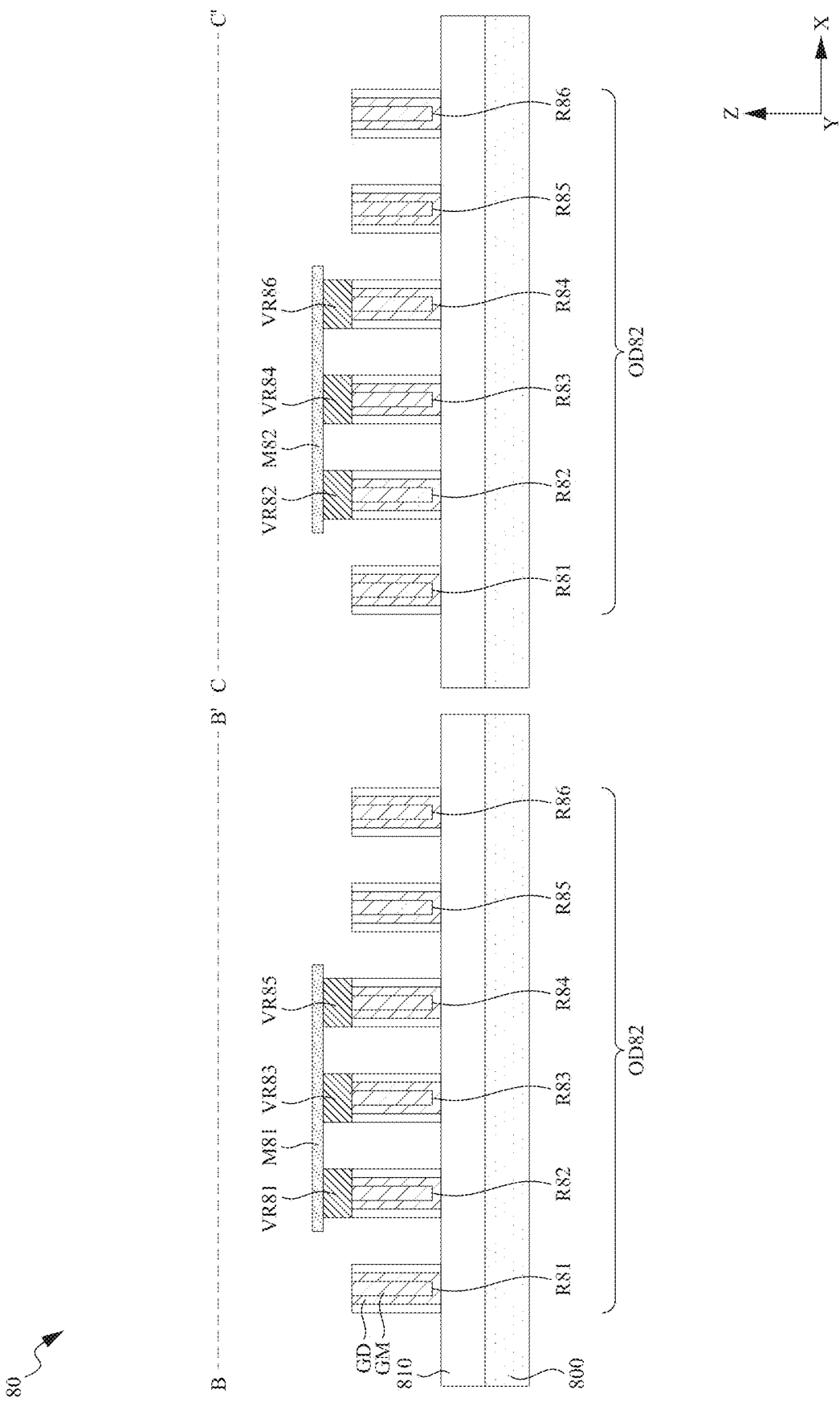
Figure 8C:
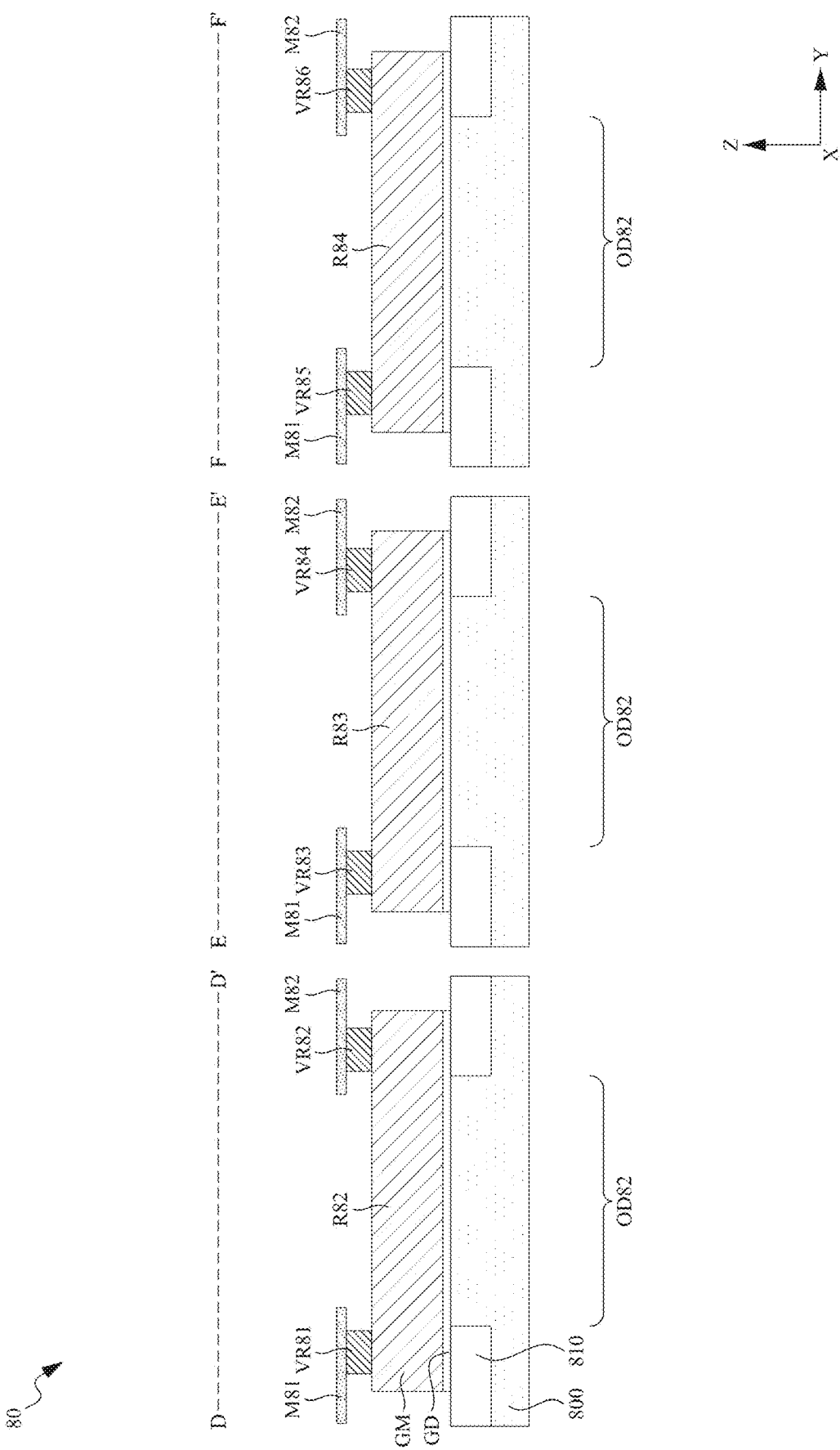

FIGS. 8A-8C illustrate a resistor circuit including dummy gates connected in parallel, in accordance with some embodiments. In some embodiments, the dummy gate connected in parallel of FIGS. 8A-8C are part of a multi-finger dummy gate device. FIG. 8A illustrates a top view of an exemplary integrated circuit 80 having a transistor region 81 and a resistor region 82 in accordance with some embodiments of the present disclosure. FIG. 8B illustrates a cross-sectional view of the integrated circuit 80 in accordance with some embodiments, wherein the cross-sectional view combines a cross-sectional view obtained from the vertical plane containing line B-B' in FIG. 8A and a cross-sectional view obtained from the vertical plane containing line C-C' in FIG. 8A. FIG. 8C illustrates a cross-sectional view of the integrated circuit 80 in accordance with some embodiments, wherein the cross-sectional view combines a cross-sectional view obtained from the vertical plane containing line D-D' in FIG. 8A, a cross-sectional view obtained from the vertical plane containing line E-E' in FIG. 8A, and a cross-sectional view obtained from the vertical plane containing line F-F' in FIG. 8A. The integrated circuit 80 is a non-limiting example for facilitating the illustration of the present disclosure.

The integrated circuit 80 includes a substrate 800 having an active region OD81 extending along the X-direction within the transistor region 81 and a passive region OD82 extending along the X-direction within the resistor region 82. The active region OD81 is separated and electrically insulated from the passive region OD82 by an STI region 810. In some embodiments, example materials and configurations of the substrate 800, OD81, OD82 and the STI region 810 can be the same as that of the substrate 100, OD11, OD12 and the STI region 110 as described previously, and thus are not repeated for the sake of brevity.

The integrated circuit 80 further includes metal gate structures G81, G82, G83, G84, G85 and G86 extending within the transistor region 81 and across the active region OD81 along the Y-direction, and metal resistor structures R81, R82, R83, R84, R85 and R86 extending within the resistor region 82 and across the passive region OD82 along the Y-direction. Example materials of the metal resistor structures R81-R86 and metal gate structures G81-G86 include high-k dielectric layer GD and gate metals GM are similar to those discussed previously with respect to the metal resistor structures R11-R16 and metal gate structures G11-G16, and thus are not repeated for the sake of brevity.

The integrated circuit 80 further includes a plurality of source/drain regions S/D in the active region OD81 and the passive region OD82. The source/drain regions S/D are doped semiconductor regions located on opposite sides of the corresponding metal gate structures G81-G86 and metal resistor structures R81-R86. In some embodiments, the source/drain regions S/D include dopants or impurities for forming functional FETs in the active region OD81 and non-functional or dummy FETs in the passive region OD82. Example materials and forming methods of the source/drain regions S/D of FIGS. 8A-8C are similar to those discussed previously with respect to FIG. 1A, and thus are not repeated for the sake of brevity.

In the depicted embodiment as illustrated in FIG. 8A, the integrated circuit 80 further includes a plurality of source/drain contacts MD landing on the respective source/drain regions S/D within the active region OD81. In some embodiments, one or more of the source/drain regions S/D within the passive region OD82 do not include source/drain contacts landing on the corresponding one or more source/drain regions S/D within the passive region OD82. In some embodiments, the source/drain regions S/D in the passive region OD82 are not electrically coupled to the metal line(s) in the overlying interconnect structure. Therefore, the source/drain regions S/D within the passive region OD82 are electrically floating while the source/drain regions S/D within the active region OD81 are electrically coupled to metal lines in overlying interconnect structure (not shown for the sake of clarity) by using the source/drain contacts MD. As a result, the source/drain regions S/D in the active region OD81 form functional transistors (i.e., transistors functioned to create channels in the active region OD81) with the corresponding metal gate structures G81-G86, while the electrically floating source/drain regions S/D in the passive region OD82 form non-functional or dummy transistors (i.e., transistor-like structures not functioned to create channels in the passive region OD82) with the metal resistor structures R81-R86.

The integrated circuit 80 further includes a plurality of gate contacts VG81, VG82, VG83, VG84, VG85 and VG86 over the corresponding metal gate structures G81-G86, respectively. The integrated circuit 80 further includes resistor contacts VR81 and VR82 over the metal resistor structure R82, resistor contacts VR83 and VR84 over the metal resistor structure R83, and resistor contacts VR85 and VR86 over the metal resistor structure R84. Example materials and forming methods of the gate contacts and resistor contacts of FIGS. 8A-8C are similar to those discussed previously with respect to FIG. 1A, and thus are not repeated for the sake of brevity.

The integrated circuit 80 further includes metal lines M81 and M82 on a level above the gate contacts VG81-VG86 and resistor contacts VR81-VR86. In some embodiments, the metal lines M81-M82 are on a M0 layer or M1 layer. Other metal layers are within the scope of the present disclosure. The metal lines M81-M82 extend along the X-direction. The metal line M81 extends across upper sections of the metal resistor structures R82-R84. The metal line M82 extends across lower sections of the metal resistor structures R82-R84. The metal line M81 is electrically connected to the metal resistor structure R82 by the resistor contact VR81, to the metal resistor structure R83 by the resistor contact VR83, and to the metal resistor structure R84 by the resistor contact VR85. The metal line M82 is electrically connected to the metal resistor structure R82 by the resistor contact VR82, to the metal resistor structure R83 by the resistor contact VR84, and to the metal resistor structure R84 by the resistor contact VR86. The metal resistor structures R82, R83 and R84 are thus connected in parallel to form a resistor circuit having a first node N81 at the metal line M81 and a second node N82 at the metal line M82. The parallel connection aids in forming the resistor circuit with a lower resistance as compared with series connection.

Figure 9A:
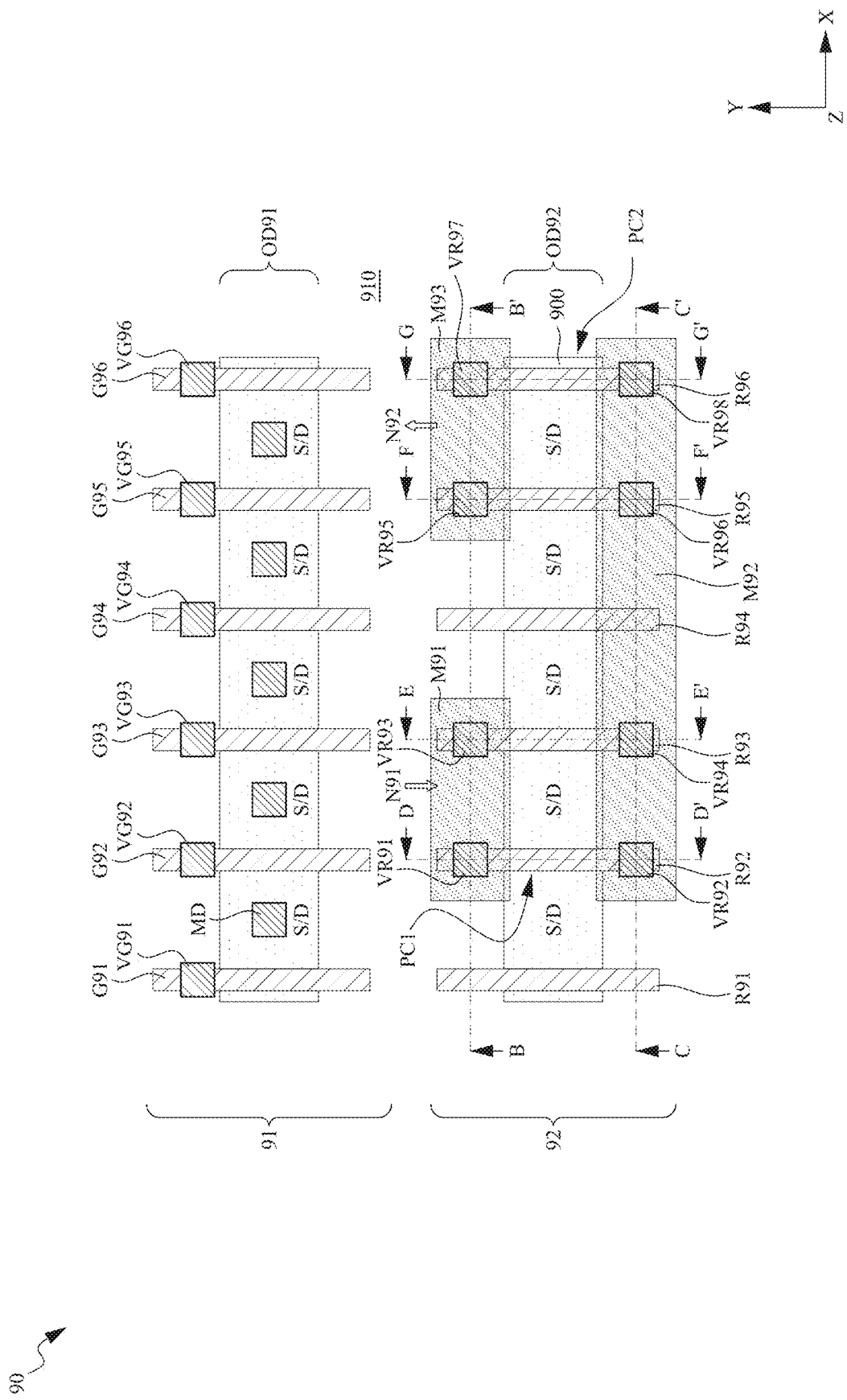
FIGS. 9A-9D illustrate different views of an integrated circuit in accordance with some embodiments of the present disclosure.
Figure 9B:
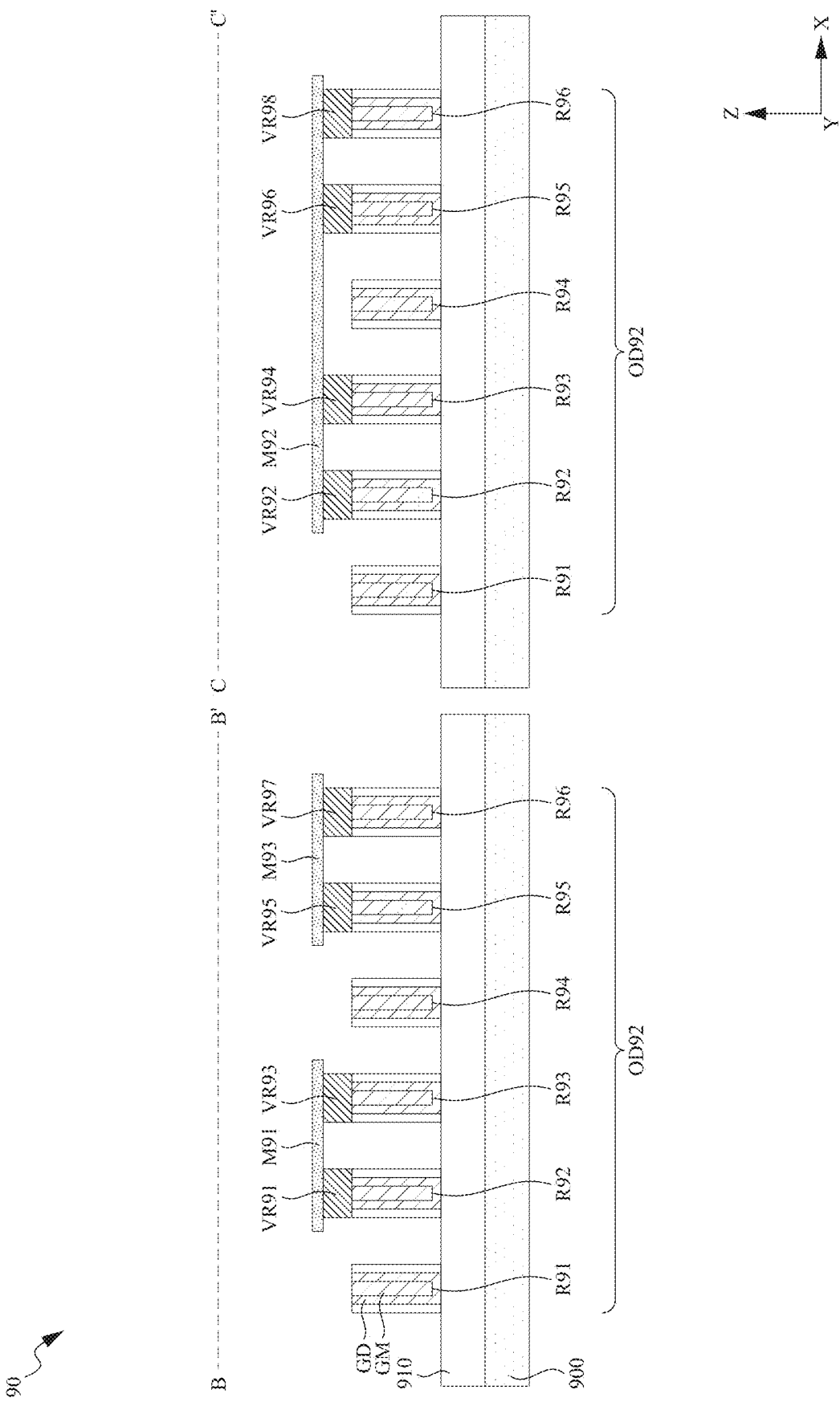
Figure 9C:
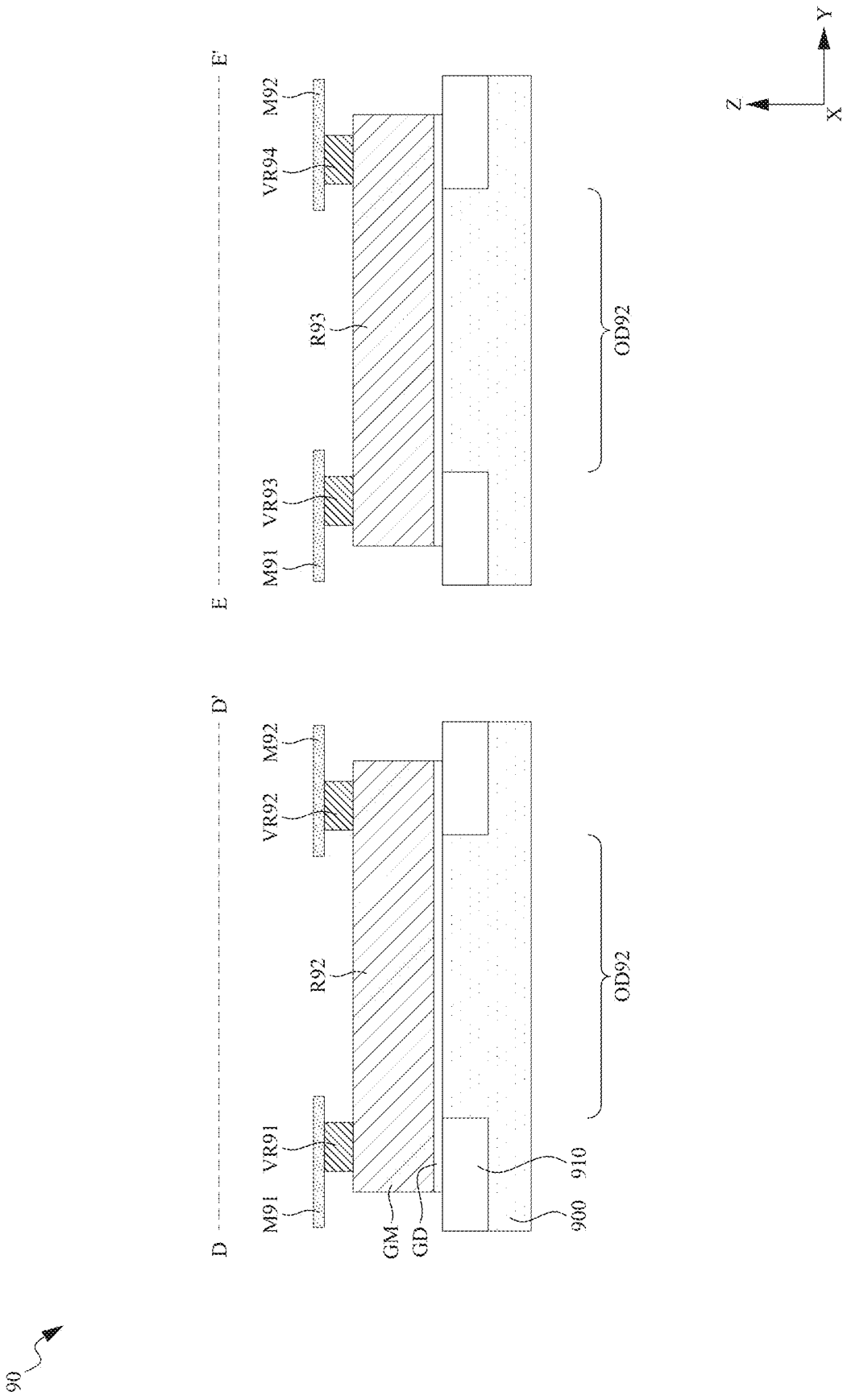
Figure 9D:
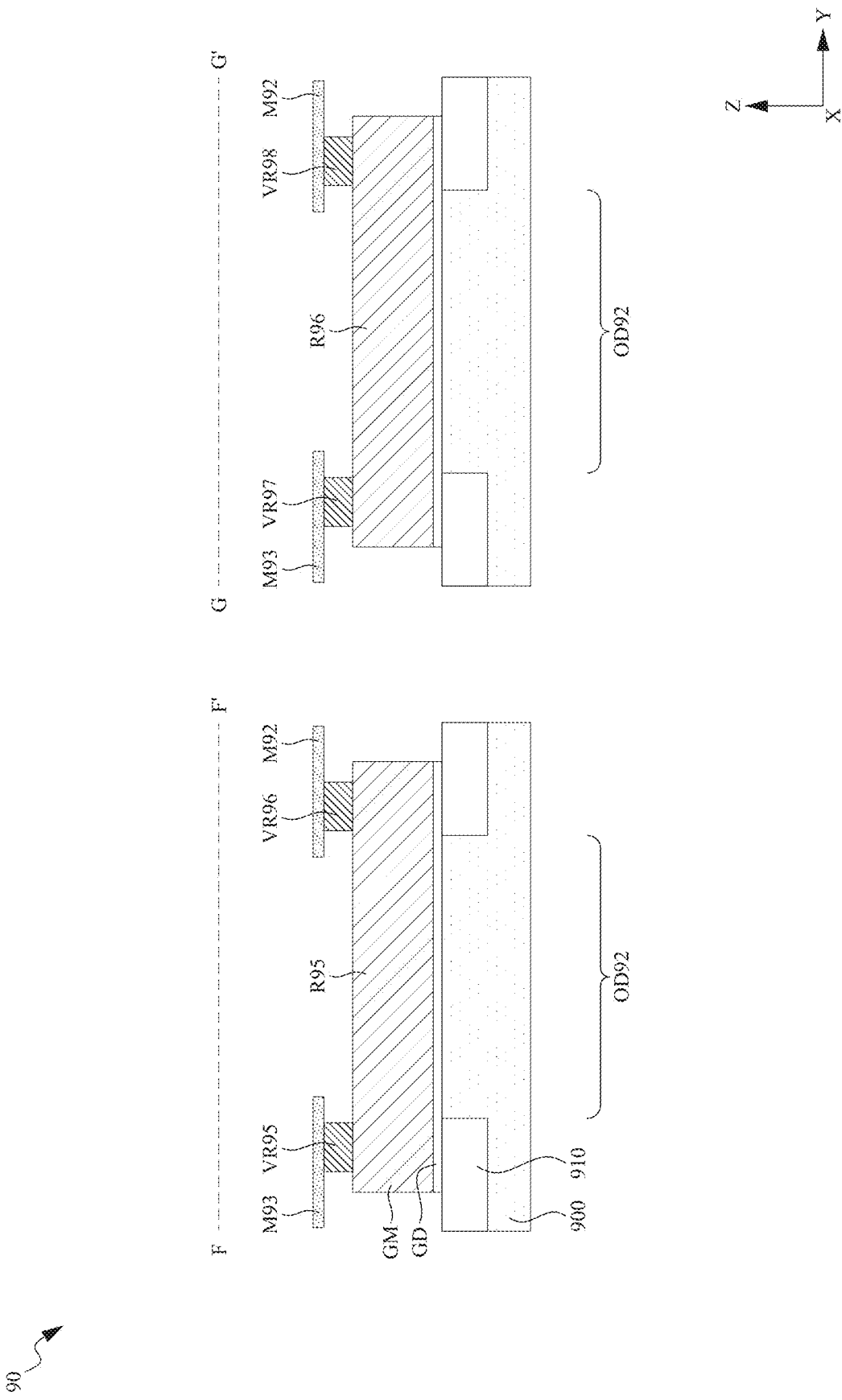

FIGS. 9A-9D illustrate a resistor circuit including two parallel circuits connected in series, wherein each parallel circuit includes two dummy gates connected in parallel, in accordance with some embodiments. In some embodiments, the dummy gates connected in parallel of FIGS. 9A-9D are part of a multi-finger dummy gate device. FIG. 9A illustrates a top view of an exemplary integrated circuit 90 having a transistor region 91 and a resistor region 92 in accordance with some embodiments of the present disclosure. FIG. 9B illustrates a cross-sectional view of the integrated circuit 90 in accordance with some embodiments, wherein the cross-sectional view combines a cross-sectional view obtained from the vertical plane containing line B-B' in FIG. 9A and a cross-sectional view obtained from the vertical plane containing line C-C' in FIG. 9A. FIG. 9C illustrates a cross-sectional view of the integrated circuit 90 in accordance with some embodiments, wherein the cross-sectional view combines a cross-sectional view obtained from the vertical plane containing line D-D' in FIG. 9A and a cross-sectional view obtained from the vertical plane containing line E-E' in FIG. 9A. FIG. 9D illustrates a cross-sectional view of the integrated circuit 90 in accordance with some embodiments, wherein the cross-sectional view combines a cross-sectional view obtained from the vertical plane containing line F-F' in FIG. 9A and a cross-sectional view obtained from the vertical plane containing line G-G' in FIG. 9A. The integrated circuit 90 is a non-limiting example for facilitating the illustration of the present disclosure.

The integrated circuit 90 includes a substrate 900 having an active region OD91 extending along the X-direction within the transistor region 91 and a passive region OD92 extending along the X-direction within the resistor region 92. The active region OD91 is separated and electrically insulated from the passive region OD92 by an STI region 910. In some embodiments, example materials and configurations of the substrate 900, OD91, OD92 and the STI region 910 can be the same as that of the substrate 100, OD11, OD12 and the STI region 110 as described previously, and thus are not repeated for the sake of brevity.

The integrated circuit 90 further includes metal gate structures G91, G92, G93, G94, G95 and G96 extending within the transistor region 91 and across the active region OD91 along the Y-direction, and metal resistor structures R91, R92, R93, R94, R95 and R96 extending within the resistor region 92 and across the passive region OD92 along the Y-direction. Example materials of the metal resistor structures R91-R96 and metal gate structures G91-G96 include high-k dielectric layer GD and gate metals GM are similar to those discussed previously with respect to the metal resistor structures R11-R16 and metal gate structures G11-G16, and thus are not repeated for the sake of brevity.

The integrated circuit 90 further includes a plurality of source/drain regions S/D in the active region OD91 and the passive region OD92. The source/drain regions S/D are doped semiconductor regions located on opposite sides of the corresponding metal gate structures G91-G96 and metal resistor structures R91-R96. In some embodiments, the source/drain regions S/D include dopants or impurities for forming functional FETs in the active region OD91 and non-functional or dummy FETs in the passive region OD92. Example materials and forming methods of the source/drain regions S/D of FIGS. 9A-9D are similar to those discussed previously with respect to FIG. 1A, and thus are not repeated for the sake of brevity.

In the depicted embodiment as illustrated in FIG. 9A, the integrated circuit 90 further includes a plurality of source/drain contacts MD landing on the respective source/drain regions S/D within the active region OD91. In some embodiments, one or more of the source/drain regions S/D within the passive region OD92 do not include source/drain contacts landing on the corresponding one or more source/drain regions S/D within the passive region OD92. In some embodiments, the source/drain regions S/D in the passive region OD92 are not electrically coupled to the metal line(s) in the overlying interconnect structure. Therefore, the source/drain regions S/D within the passive region OD92 are electrically floating while the source/drain regions S/D within the active region OD91 are electrically coupled to metal lines in overlying interconnect structure (not shown for the sake of clarity) by using the source/drain contacts MD. As a result, the source/drain regions S/D in the active region OD91 form functional transistors (i.e., transistors functioned to create channels in the active region OD91) with the corresponding metal gate structures G91-G96, while the electrically floating source/drain regions S/D in the passive region OD92 form non-functional or dummy transistors (i.e., transistor-like structures not functioned to create channels in the passive region OD92) with the metal resistor structures R91-R96.

The integrated circuit 90 further includes a plurality of gate contacts VG91, VG92, VG93, VG94, VG95 and VG96 over the corresponding metal gate structures G91-G96, respectively. The integrated circuit 90 further includes resistor contacts VR91 and VR92 over the metal resistor structure R92, resistor contacts VR93 and VR94 over the metal resistor structure R93, resistor contacts VR95 and VR96 over the metal resistor structure R95, and resistor contacts VR97 and VR98 over the metal resistor structure VR96. Example materials and forming methods of the gate contacts and resistor contacts of FIGS. 9A-9D are similar to those discussed previously with respect to FIG. 1A, and thus are not repeated for the sake of brevity.

The integrated circuit 90 further includes metal lines M91, M92 and M93 on a level above the gate contacts VG91-VG96 and resistor contacts VR91-VR98. In some embodiments, the metal lines M91-M93 are on a M0 layer or M1 layer. Other metal layers are within the scope of the present disclosure. The metal lines M91-M93 extend along the X-direction. The metal line M91 extends across both upper sections of the metal resistor structures R92 and R93. The metal line M93 extends across both upper sections of the metal resistor structures R95 and R96. The metal line M92 extends across lower sections of the metal resistor structures R92-R96. The metal line M91 is electrically connected to the metal resistor structure R92 by the resistor contact VR91 and to the metal resistor structure R93 by the resistor contact VR93. The metal line M93 is electrically connected to the metal resistor structure R95 by the resistor contact VR95 and to the metal resistor structure R96 by the resistor contact VR97. The metal line M92 is electrically connected to the metal resistor structure R92 by the resistor contact VR92, to the metal resistor structure R93 by using the resistor contact VR94, to the metal resistor structure R95 by the resistor contact VR96, and to the metal resistor structure R96 by using the resistor contact VR98.

In this layout as illustrated in FIG. 9A, the metal resistor structures R92 and R93 are connected in parallel to form a parallel circuit PC1, the metal resistor structures R95 and R96 are connected in parallel to form a parallel circuit PC2, and the parallel circuits PC1 and PC2 are connected in series, by the metal line M92, to form a resistor circuit having a first node N91 at the metal line N91 and a second node N92 at the metal line M93.

Figure 10A:
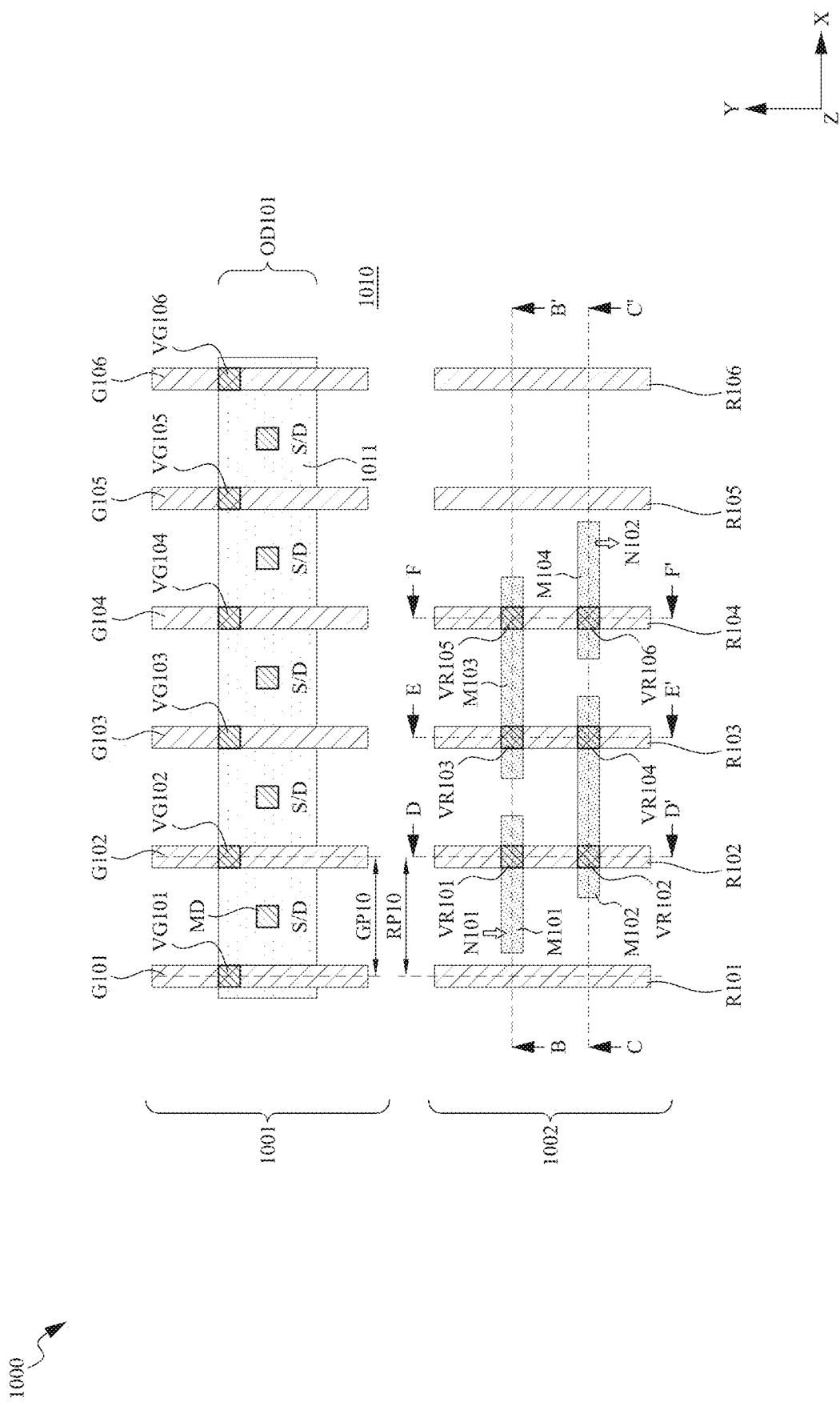
FIGS. 10A-10C illustrate different views of an integrated circuit in accordance with some embodiments of the present disclosure.
Figure 10B:
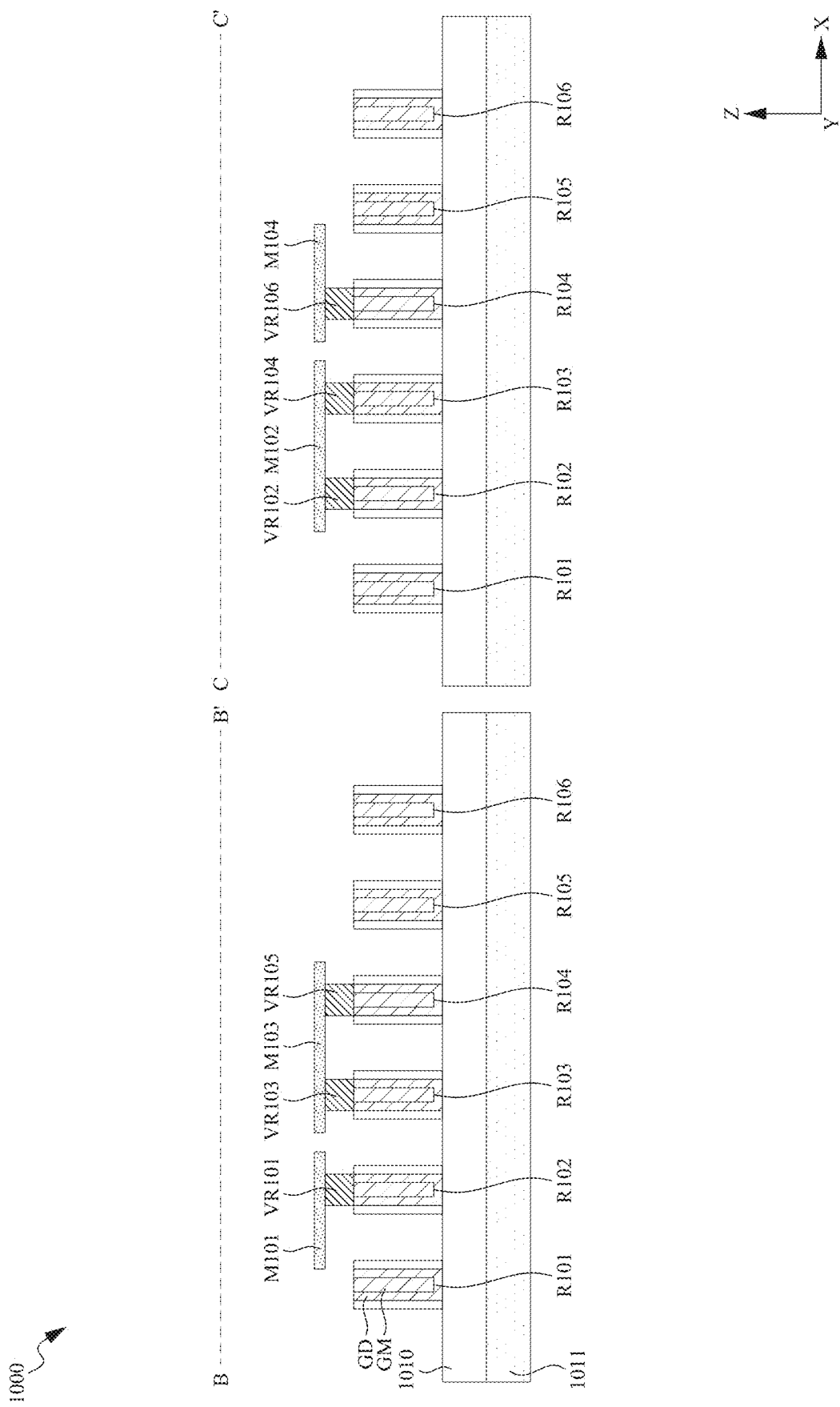
Figure 10C:
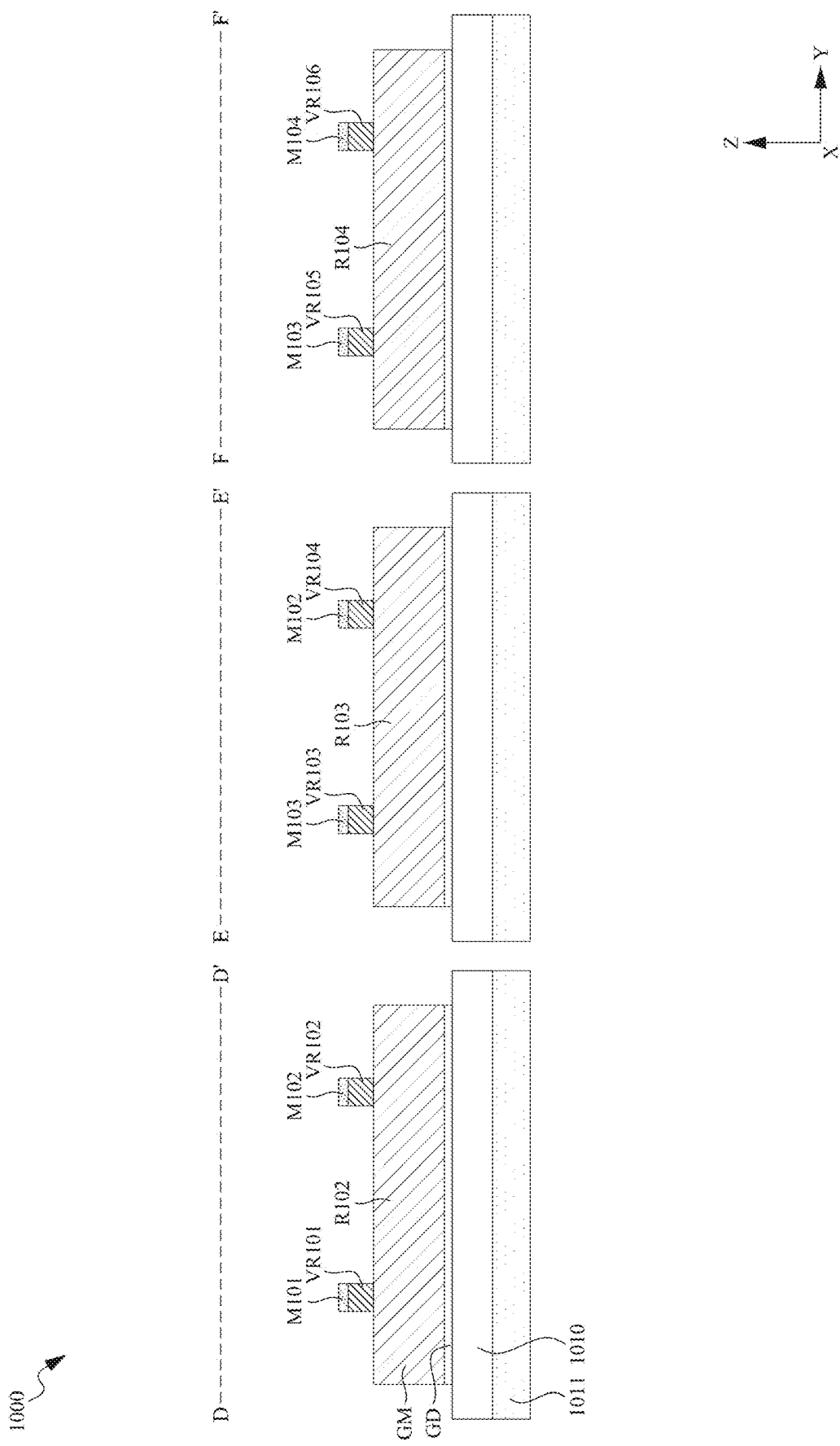

FIGS. 10A-10C illustrates a resistor circuit on STI, and the resistor circuit includes multiple dummy gates, in accordance with some embodiments. FIG. 10A illustrates a top view of an exemplary integrated circuit 1000 having a transistor region 1001 and a resistor region 1002 in accordance with some embodiments of the present disclosure. FIG. 10B illustrates a cross-sectional view of the integrated circuit 1000 in accordance with some embodiments, wherein the cross-sectional view combines a cross-sectional view obtained from the vertical plane containing line B-B' in FIG. 10A and a cross-sectional view obtained from the vertical plane containing line C-C' in FIG. 10A. FIG. 10C illustrates a cross-sectional view of the integrated circuit 1000 in accordance with some embodiments, wherein the cross-sectional view combines a cross-sectional view obtained from the vertical plane containing line D-D' in FIG. 10A, a cross-sectional view obtained from the vertical plane containing line E-E' in FIG. 10A, and a cross-sectional view obtained from the vertical plane containing line F-F' in FIG. 10A. The integrated circuit 1000 is a non-limiting example for facilitating the illustration of the present disclosure.

The integrated circuit 1000 includes a substrate 1001 having an active region OD101 extending along the X-direction within the transistor region 1011 and does not include a passive region in resistor region 1002. The active region OD101 is defined by an STI region 1010. In some embodiments, example materials and configurations of the substrate 1011, OD101 and the STI region 1010 can be the same as that of the substrate 100, OD11 and the STI region 110 as described previously, and thus are not repeated for the sake of brevity.

The integrated circuit 1000 further includes metal gate structures G101, G102, G103, G104, G105 and G106 extending within the transistor region 1001 and across the active region OD101 along the Y-direction, and metal resistor structures R101, R102, R103, R104, R105 and R106 extending within the resistor region 1002. In some embodiments, each of the metal resistor structures R101-R106 overlap the STI region 1010. By contrast, center regions of the metal gate structures G101-G106 overlap the active region OD101, and upper and lower regions of the metal gate structures G101-G106 overlap the STI region 1010. Example materials of the metal resistor structures R101-R106 and metal gate structures G101-G106 include high-k dielectric layer GD and gate metals GM are similar to those discussed previously with respect to the metal resistor structures R11-R16 and metal gate structures G11-G16, and thus are not repeated for the sake of brevity.

In the depicted embodiment as illustrated in FIG. 10A, the metal gate structures G101-G106 are equidistantly arranged along the X-direction at a gate pitch GP10 (i.e., center-to-center spacing between neighboring gate structures), and the metal resistor structures R101-R106 are equidistantly arranged along the X-direction at a resistor pitch RP10 (i.e., center-to-center spacing between neighboring metal resistor structures). In some embodiments, the resistor pitch RP10 is substantially equal to the gate pitch GP10. In some embodiments, the resistor pitch RP10 may be greater or less than the gate pitch GP10.

The integrated circuit 1000 further includes a plurality of source/drain regions S/D in the active region OD101. The source/drain regions S/D are doped semiconductor regions located on opposite sides of the corresponding metal gate structures G101-G106. In some embodiments, the source/drain regions S/D include dopants or impurities for forming functional FETs in the active region OD101. Example materials and forming methods of the source/drain regions S/D of FIGS. 10A-10C are similar to those discussed previously with respect to FIG. 1A, and thus are not repeated for the sake of brevity. The integrated circuit 1000 further includes a plurality of source/drain contacts MD landing on the respective source/drain regions S/D within the active region OD101.

The integrated circuit 1000 further includes a plurality of gate contacts VG101, VG102, VG103, VG104, VG105 and VG106 over the corresponding metal gate structures G101-G106, respectively. The integrated circuit 1000 further includes resistor contacts VR101 and VR102 over the metal resistor structure R102, resistor contacts VR103 and VR104 over the metal resistor structure R103, and resistor contacts VR105 and VR106 over the metal resistor structure R104. Example materials and forming methods of the gate contacts and resistor contacts of FIGS. 10A-10C are similar to those discussed previously with respect to FIG. 1A, and thus are not repeated for the sake of brevity.

The integrated circuit 1000 further includes a plurality of metal lines M101, M102, M103 and M104 on a level above the gate contacts VG101-VG106 and resistor contacts VR101-VR106. In some embodiments, the metal lines M101-M104 are on a M0 layer or M1 layer. Other metal layers are within the scope of the present disclosure. The metal lines M101-M104 extend along the X-direction. The metal line M101 extends across an upper section of the metal resistor structure R102. The resistor contact VR101 is located where the metal line M101 overlaps the metal resistor structure R102, thus providing an electrical connection between the metal line M101 and the metal resistor structure R102. The metal line M102 extends across both lower sections of the metal resistor structures R102 and R103, and is electrically connected to the metal resistor structure R102 by the resistor contact VR102 and to the metal resistor structure R103 by the resistor contact VR104. The metal line M103 extends across both upper sections of the metal resistor structures R103 and R104, and is electrically connected to the metal resistor structure R103 by the resistor contact VR103 and to the metal resistor structure R104 by the resistor contact VR105. The metal line M104 extends across a lower section of the metal resistor structure R104, and is electrically connected to the metal resistor structure R104 by the resistor contact VR106. The metal resistor structures R102-R104, the resistor contacts VR101-VR106, and the metal lines M101-M104 are connected in series to form a resistor circuit having a first node N101 at the metal line M101 and a second node N102 at the metal line M104. In this way, the resistor circuit is formed on STI region 1010 using multiple dummy gate structures (i.e., dummy gate structure R102-R104).

Figure 11A:
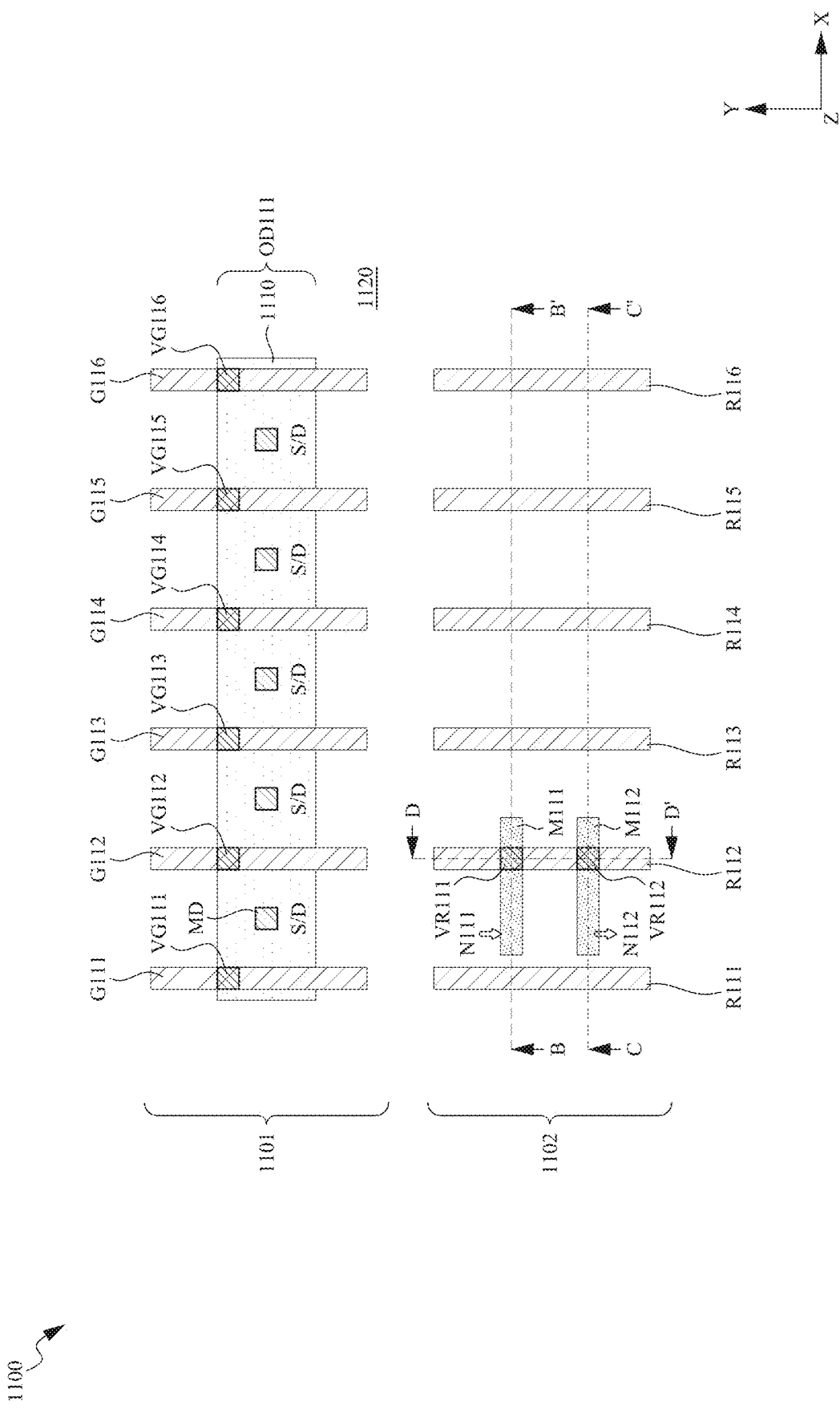
Figure 11B:
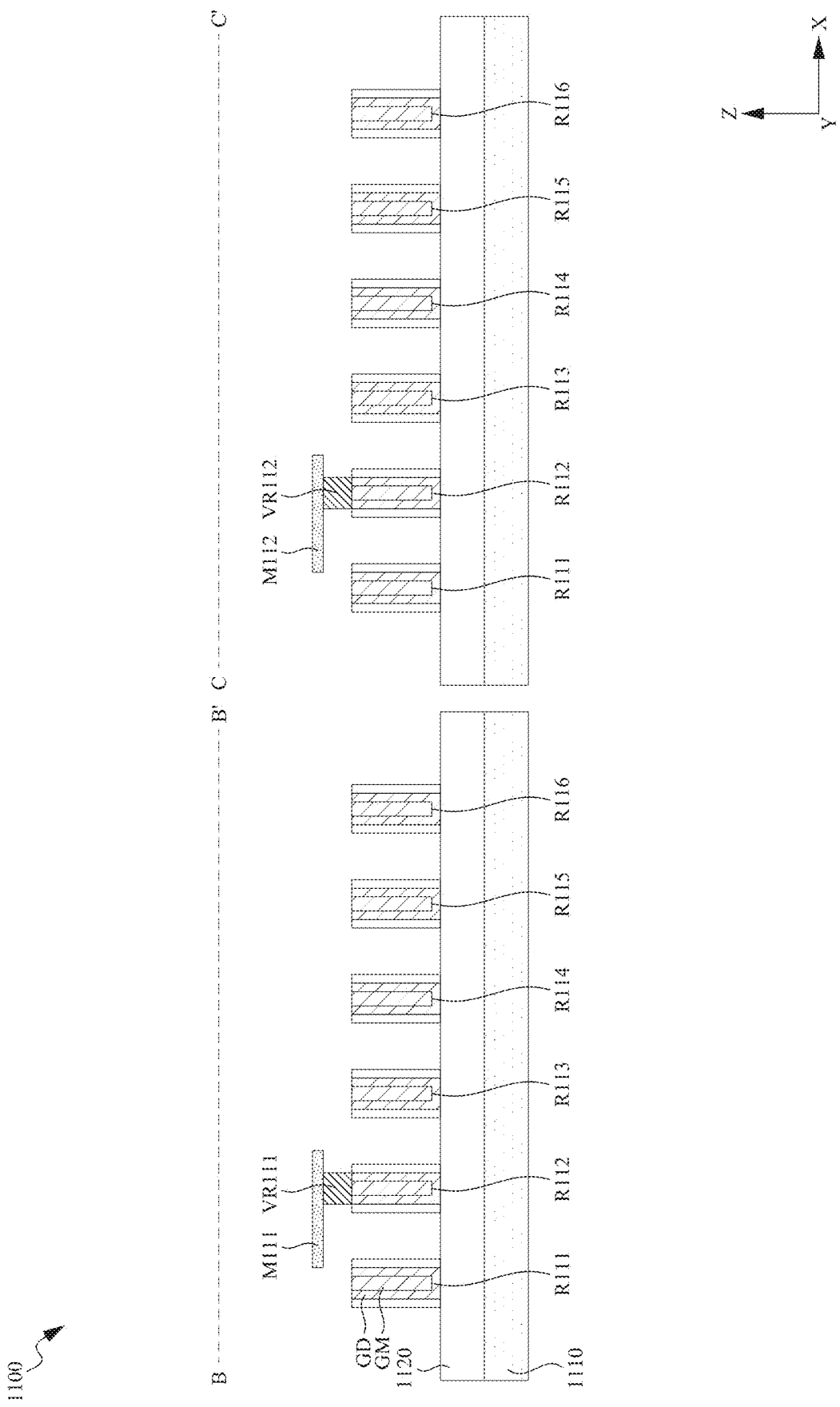
Figure 11C:
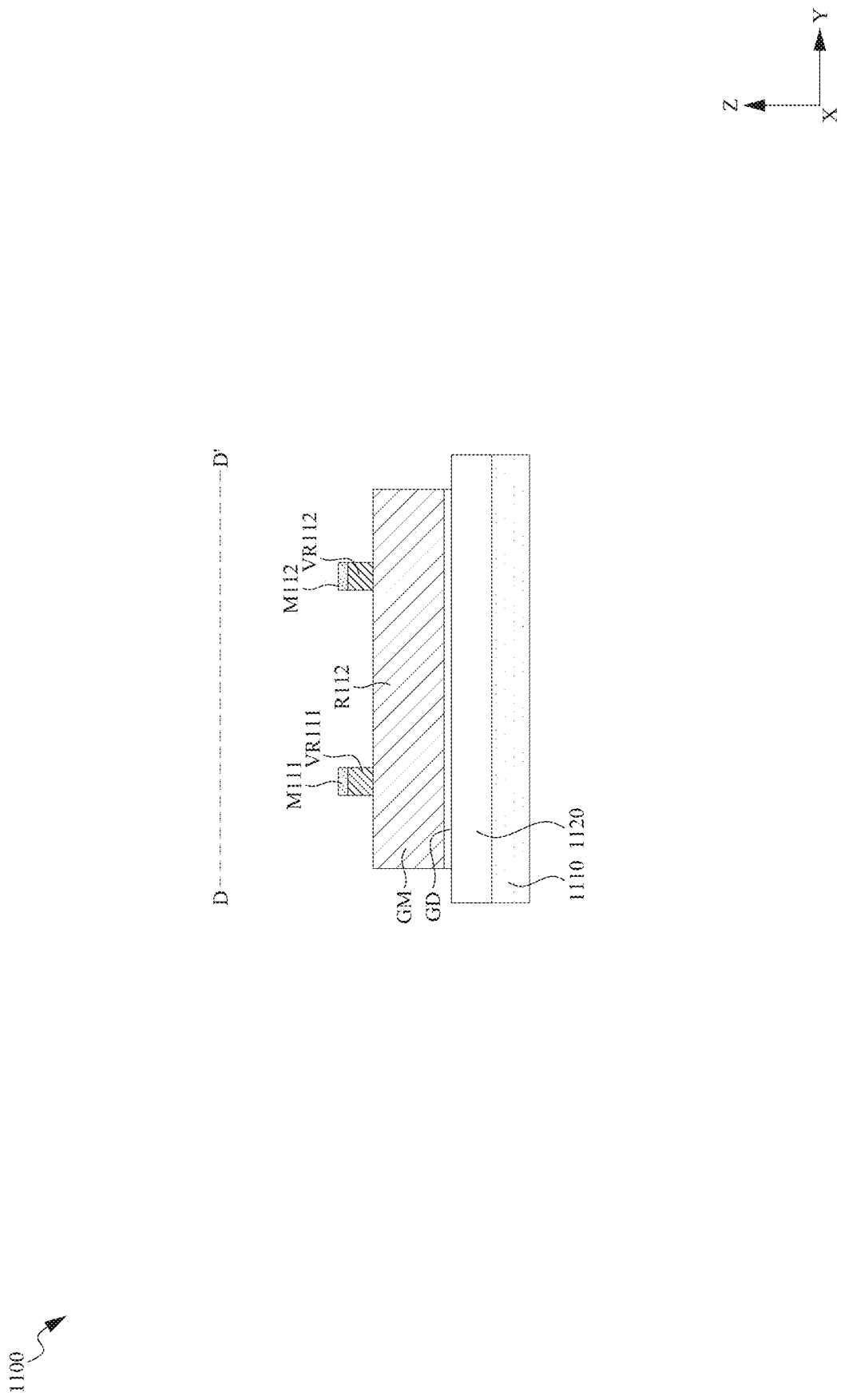

FIGS. 11A-11C illustrate a resistor circuit on STI, and the resistor circuit includes a single dummy gate. FIG. 11A illustrates a top view of an exemplary integrated circuit 1100 having a transistor region 1101 and a resistor region 1102 in accordance with some embodiments of the present disclosure. FIG. 11B illustrates a cross-sectional view of the integrated circuit 1100 in accordance with some embodiments, wherein the cross-sectional view combines a cross-sectional view obtained from the vertical plane containing line B-B' in FIG. 11A and a cross-sectional view obtained from the vertical plane containing line C-C' in FIG. 11A. FIG. 11C illustrates a cross-sectional view of the integrated circuit 1100 obtained from the vertical plane containing line D-D' in FIG. 11A in accordance with some embodiments of the present disclosure. The integrated circuit 1100 is a non-limiting example for facilitating the illustration of the present disclosure.

The integrated circuit 1100 includes a substrate 1110 having an active region OD111 extending along the X-direction within the transistor region 1101 and does not include a passive region extending in resistor region 1102. The active region OD111 is defined by an STI region 1120. In some embodiments, example materials and configurations of the substrate 1110, OD111 and the STI region 1120 can be the same as that of the substrate 100, OD11 and the STI region 110 as described previously, and thus are not repeated for the sake of brevity.

The integrated circuit 1100 further includes metal gate structures G111, G112, G113, G114, G115 and G116 extending within the transistor region 1101 and across the active region OD111 along the Y-direction, and metal resistor structures R111, R112, R113, R114, R115 and R116 extending within the resistor region 1102. In some embodiments, each of metal resistor structures R111-R116 overlap the STI region 1120. By contrast, center regions of the metal gate structures G111-G116 overlap the active region OD111 and upper and lower regions of the metal gate structures G111-G116 overlap the STI region 1120. Example materials of the metal resistor structures R111-R116 and metal gate structures G111-G116 include high-k dielectric layer GD and gate metals GM are similar to those discussed previously with respect to the metal resistor structures R11-R16 and metal gate structures G11-G16, and thus are not repeated for the sake of brevity.

The integrated circuit 1100 further includes a plurality of source/drain regions S/D in the active region OD111. The source/drain regions S/D are doped semiconductor regions located on opposite sides of the corresponding metal gate structures G111-G116. In some embodiments, the source/drain regions S/D include dopants or impurities for forming functional FETs in the active region OD111. Example materials and forming methods of the source/drain regions S/D of FIGS. 11A-11C are similar to those discussed previously with respect to FIG. 1A, and thus are not repeated for the sake of brevity. The integrated circuit 1100 further includes a plurality of source/drain contacts MD landing on the respective source/drain regions S/D within the active region OD111.

The integrated circuit 1100 further includes a plurality of gate contacts VG111, VG112, VG113, VG114, VG115 and VG116 over the corresponding metal gate structures G111-G116, respectively. The integrated circuit 1100 further includes resistor contacts VR111 and VR112 over the metal resistor structure R112. Example materials and forming methods of the gate contacts and resistor contacts of FIGS. 11A-11C are similar to those discussed previously with respect to FIG. 1A, and thus are not repeated for the sake of brevity.

The integrated circuit 1100 further includes metal lines M111 and M112 on a level above the gate contacts G111-G116 and the resistor contacts VR111 and VR112. In some embodiments, the metal lines M111-M112 are on a M0 layer or M1 layer. Other metal layers are within the scope of the present disclosure. The metal lines M111 and M112 extend along the X-direction. The metal line M111 extends across an upper section of the metal resistor structure R112, and is electrically connected to the metal resistor structure R112 by the resistor contact VR111. The metal line M112 extends across a lower section of the metal resistor structure R112, and is electrically connected to the metal resistor structure R112 by the resistor contact VR112. The metal lines M111, M112, the resistor contacts VR111, VR112, and the metal resistor structures R112 are connected in series to form a resistor circuit having a first node N111 at the metal line M111 and a second node N112 at the metal line M112. In this way, the resistor circuit is formed on STI region 1120 by a single dummy gate structure (i.e., dummy gate structure R112).

Figure 12A:
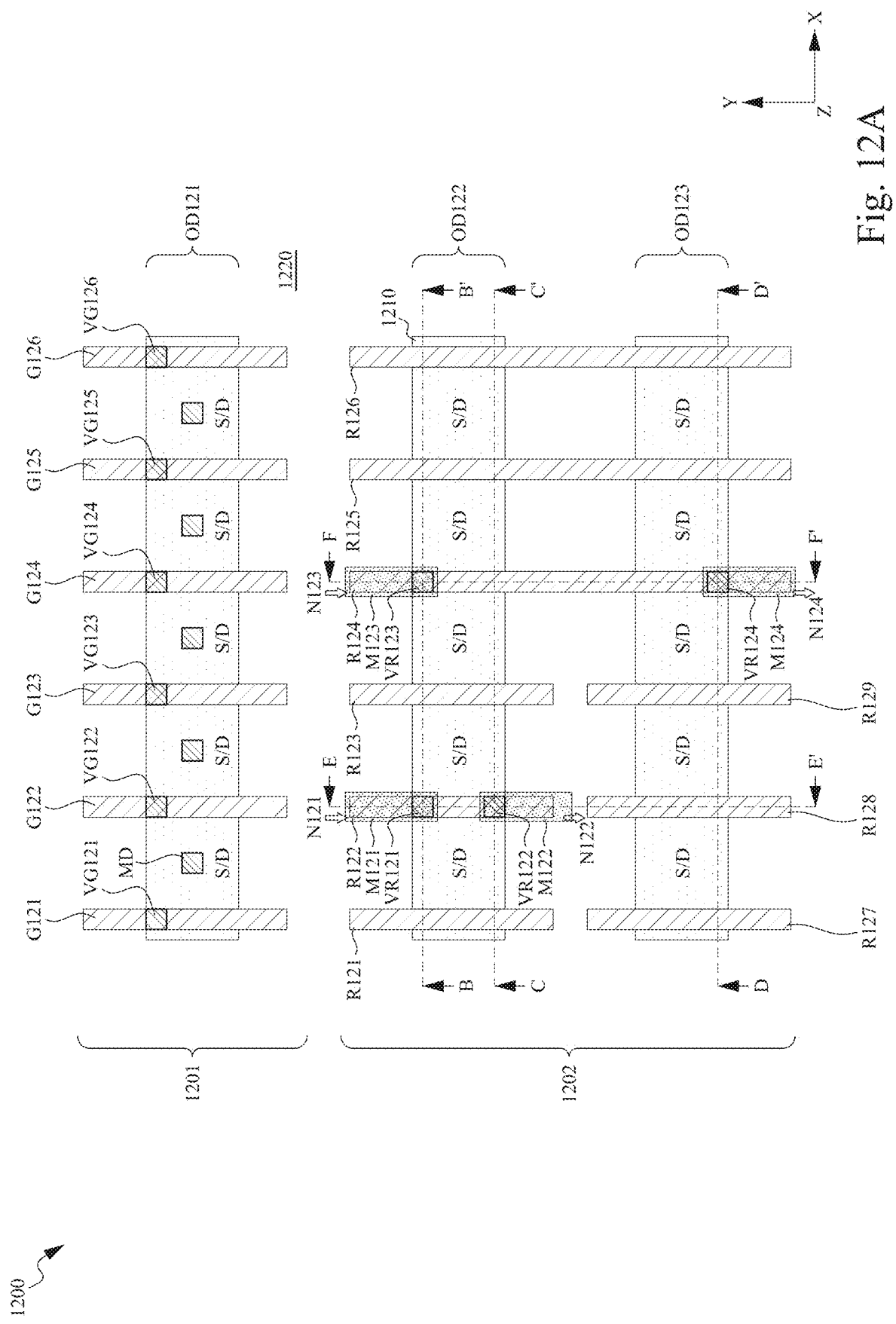
FIGS. 12A-12E illustrate different views of an integrated circuit in accordance with some embodiments of the present disclosure.
Figure 12B:
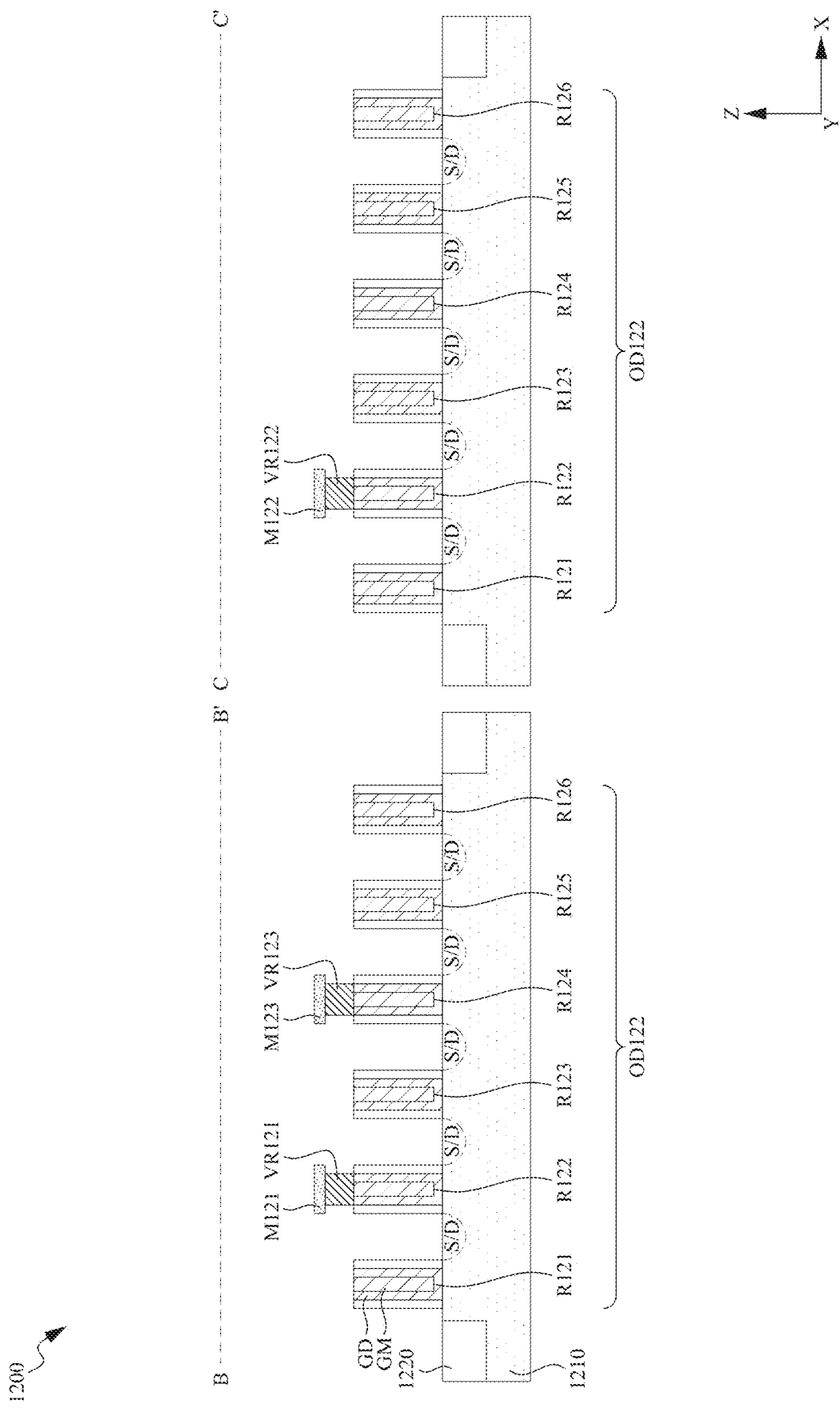
Figure 12C:
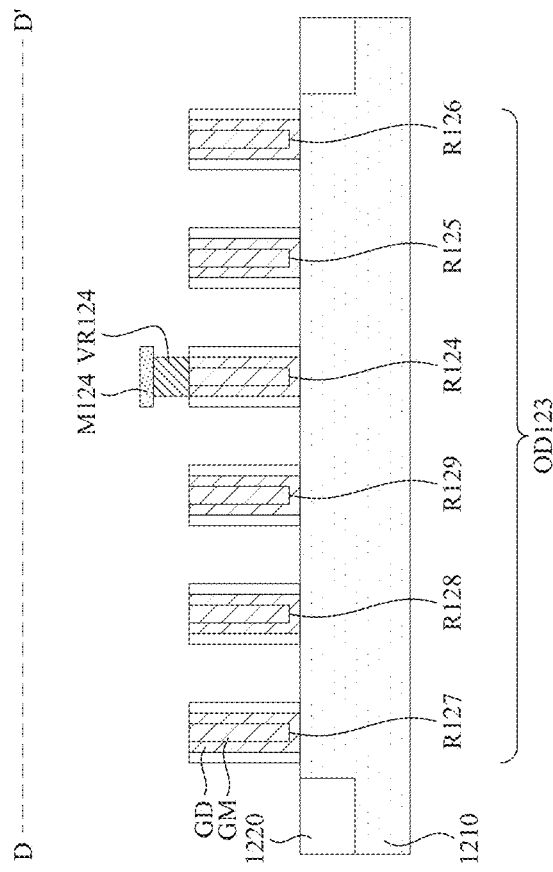
Figure 12D:
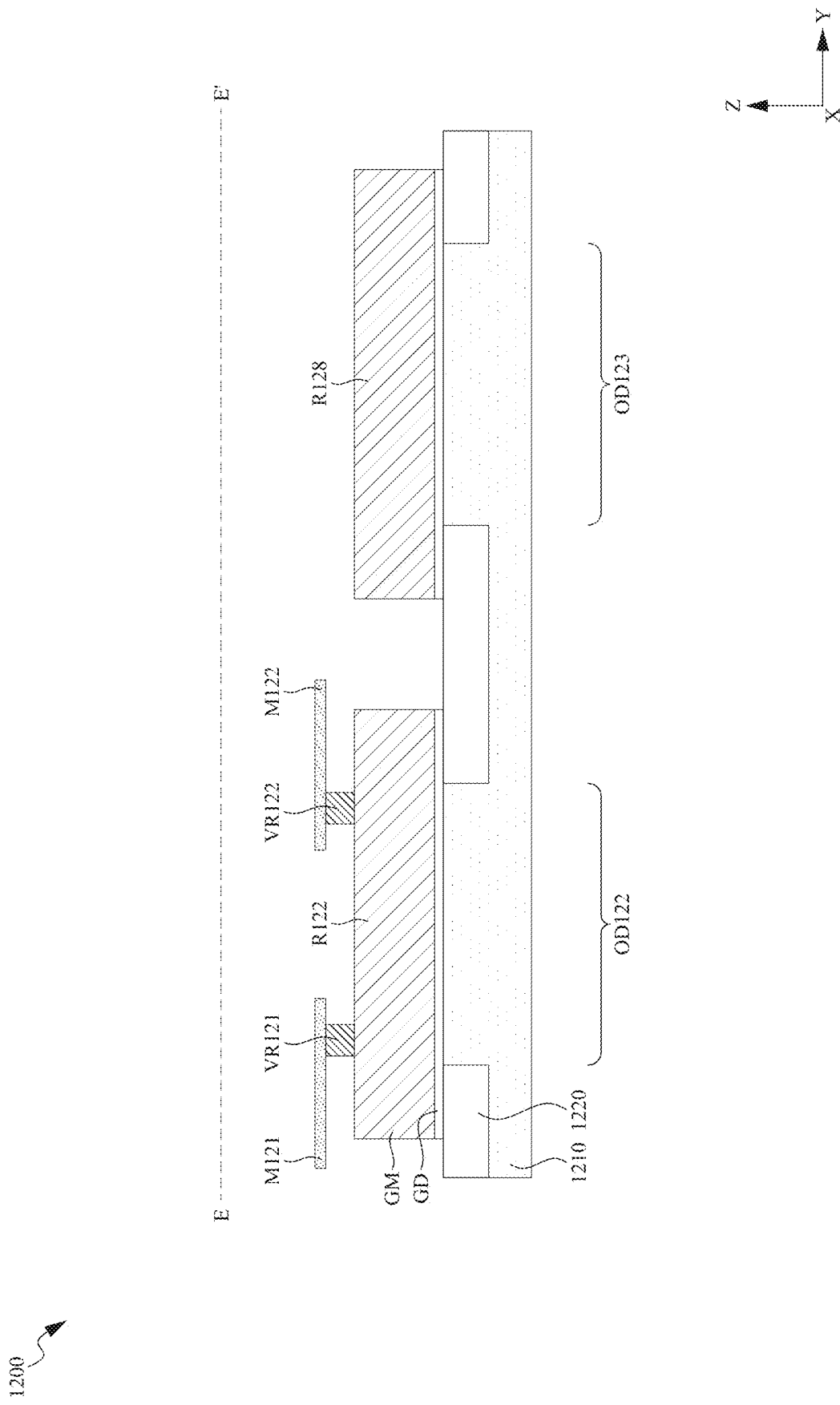
Figure 12E:
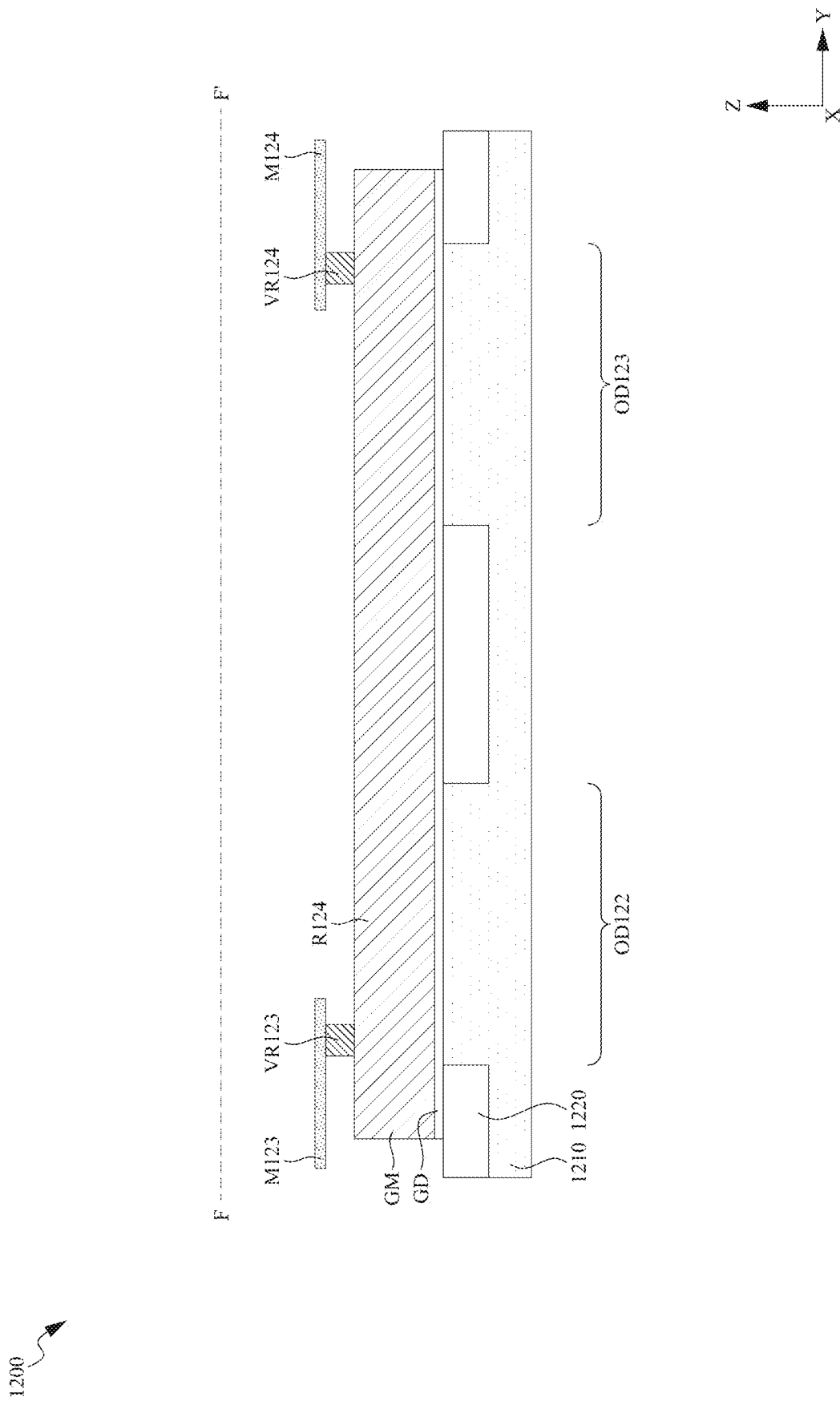

FIGS. 12A-12E illustrate resistor circuits including metal lines extending parallel to the dummy gates, in accordance with some embodiments. FIG. 12A illustrates a top view of an exemplary integrated circuit 1200 having a transistor region 1201 and a resistor region 1202 in accordance with some embodiments of the present disclosure. FIG. 12B illustrates a cross-sectional view of the integrated circuit 1200 in accordance with some embodiments, wherein the cross-sectional view combines a cross-sectional view obtained from the vertical plane containing line B-B' in FIG. 12A and a cross-sectional view obtained from the vertical plane containing line C-C' in FIG. 12A. FIG. 12C illustrates a cross-sectional view of the integrated circuit 1200 obtained from the vertical plane containing line D-D' in FIG. 12A in accordance with some embodiments. FIG. 12D illustrates a cross-sectional view of the integrated circuit 1200 obtained from the vertical plane containing line E-E' in FIG. 12A in accordance with some embodiments. FIG. 12E illustrates a cross-sectional view of the integrated circuit 1200 obtained from the vertical plane containing line F-F' in FIG. 12A in accordance with some embodiments. The integrated circuit 1200 is a non-limiting example for facilitating the illustration of the present disclosure.

The integrated circuit 1200 includes a substrate 1210 having an active region OD121 extending along the X-direction within the transistor region 1201 and an upper passive region OD122 and a lower passive region OD123 extending along the X-direction within the resistor region 1202. The active region OD121 and the passive regions OD122, OD123 are separated and electrically insulated from each other by an STI region 1220. In some embodiments, example materials and configurations of the substrate 1210, OD121, OD122 or OD123 and the STI region 1220 can be the same as that of the substrate 100, OD11 or OD12 and the STI region 110 as described previously, and thus are not repeated for the sake of brevity.

The integrated circuit 1200 further includes metal gate structures G121, G122, G123, G124, G125 and G126 extending within the transistor region 121 and across the active region OD121 along the Y-direction, and metal resistor structures R121, R122, R123, R124, R125, R126, R127, R128 and R129 extending within the resistor region 122. The metal resistor structures R121-R123 extend across the upper passive region OD122 along the Y-direction, and the metal resistor structures R127-R129 extend across the lower passive region OD123 along the Y-direction. The metal resistor structures R121-R123 are respectively aligned with the metal resistor structures R127-R129 in the Y-direction. The metal resistor structures R124-R126 extend across both the upper passive region OD122 and the lower passive region OD123 along the Y-direction.

Example materials of the metal resistor structures R121-R129 and metal gate structures G121-G126 include high-k dielectric layer GD and gate metals GM are similar to those discussed previously with respect to the metal resistor structures R11-R16 and metal gate structures G11-G16, and thus are not repeated for the sake of brevity.

The integrated circuit 1200 further includes a plurality of source/drain regions S/D in the active region OD121 and the passive regions OD122, OD123. The source/drain regions S/D are doped semiconductor regions located on opposite sides of the corresponding metal gate structures G121-G126 and metal resistor structures R121-R129. In some embodiments, the source/drain regions S/D include dopants or impurities for forming functional FETs in the active region OD121 and non-functional or dummy FETs in the passive regions OD122, OD123. Example materials and forming methods of the source/drain regions S/D of FIGS. 11A-11C are similar to those discussed previously with respect to FIG. 1A, and thus are not repeated for the sake of brevity.

In the depicted embodiment as illustrated in FIG. 12A, the integrated circuit 1200 further includes a plurality of source/drain contacts MD landing on the respective source/drain regions S/D within the active region OD121. In some embodiments, one or more of the source/drain regions S/D within the passive region OD122 and OD123 do not include source/drain contacts landing on the corresponding one or more source/drain regions S/D within the passive region OD122 and OD123. In some embodiments, the source/drain regions S/D in the passive regions OD122 and OD123 are not electrically coupled to the metal line(s) in the overlying interconnect structure. Therefore, the source/drain regions S/D within the passive regions OD122 and OD123 are electrically floating while the source/drain regions S/D within the active region OD121 are electrically coupled to metal lines in overlying interconnect structure (not shown for the sake of clarity) by using the source/drain contacts MD. As a result, the source/drain regions S/D in the active region OD121 form functional transistors (i.e., transistors functioned to create channels in the active region OD121) with the corresponding metal gate structures G121-G126, while the electrically floating source/drain regions S/D in the passive regions OD122 and OD123 form non-functional or dummy transistors (i.e., transistor-like structures not functioned to create channels in the passive regions OD122 and OD123) with the metal resistor structures R121-R129.

The integrated circuit 1200 further includes a plurality of gate contacts VG121, VG122, VG123, VG124, VG125 and VG126 over the corresponding metal gate structures G121-G126, respectively. The integrated circuit 1200 further includes resistor contacts VR121 and VR122 over the metal resistor structure R122, and resistor contacts VR123 and VR124 over the metal resistor structure R128. Example materials and forming methods of the gate contacts and resistor contacts of FIGS. 12A-12E are similar to those discussed previously with respect to FIG. 1A, and thus are not repeated for the sake of brevity.

The integrated circuit 1200 further includes a plurality of metal lines M121, M122, M123 and M124 on a level above the gate contacts VG121-VG124 and resistor contacts VR121-VR124. In some embodiments, the metal lines M121-M126 are on a M0 layer or M1 layer. Other metal layers are within the scope of the present disclosure. The metal lines M121-M124 extend along the Y-direction and thus are parallel with the metal resistor structures R121-R129. The metal line M121 extends along an upper section of the metal resistor structure R122. The resistor contact VR121 is located where the metal line M121 overlaps the metal resistor structure R122, thus providing an electrical connection between the metal line M121 and the metal resistor structure R122. The metal line M122 extends along a lower section of the metal resistor structure R122, and is electrically connected to the metal resistor structure R122 by the resistor contact VR122. The metal lines M121, M122, the resistor contacts VR121, VR122, and the metal resistor structure R122 are connected in series to form a resistor circuit having a first node N121 at the metal line M121 and a second node N122 at the metal line M122.

The metal line M123 extends along an upper section of the metal resistor structure R124, and is electrically connected to the metal resistor structure R124 by the resistor contact VR123. The metal line M124 extends along a lower section of the metal resistor structure R124, and is electrically connected to the metal resistor structure R124 by the resistor contact VR124. The metal lines M123, M124, the resistor contacts VR123, VR124, and the metal resistor structure R124 are connected in series to form a resistor circuit having a first node N123 at the metal line M123 and a second node N124 at the metal line M124. The Y-directional distance between the resistor contacts VR121 and VR122 is less than the resistor contacts VR123 and VR124, and thus the resistor circuit between the nodes N121 and N122 has a total resistance lower than a total resistance of the resistor circuit between the nodes N123 and N124.

Figure 13A:
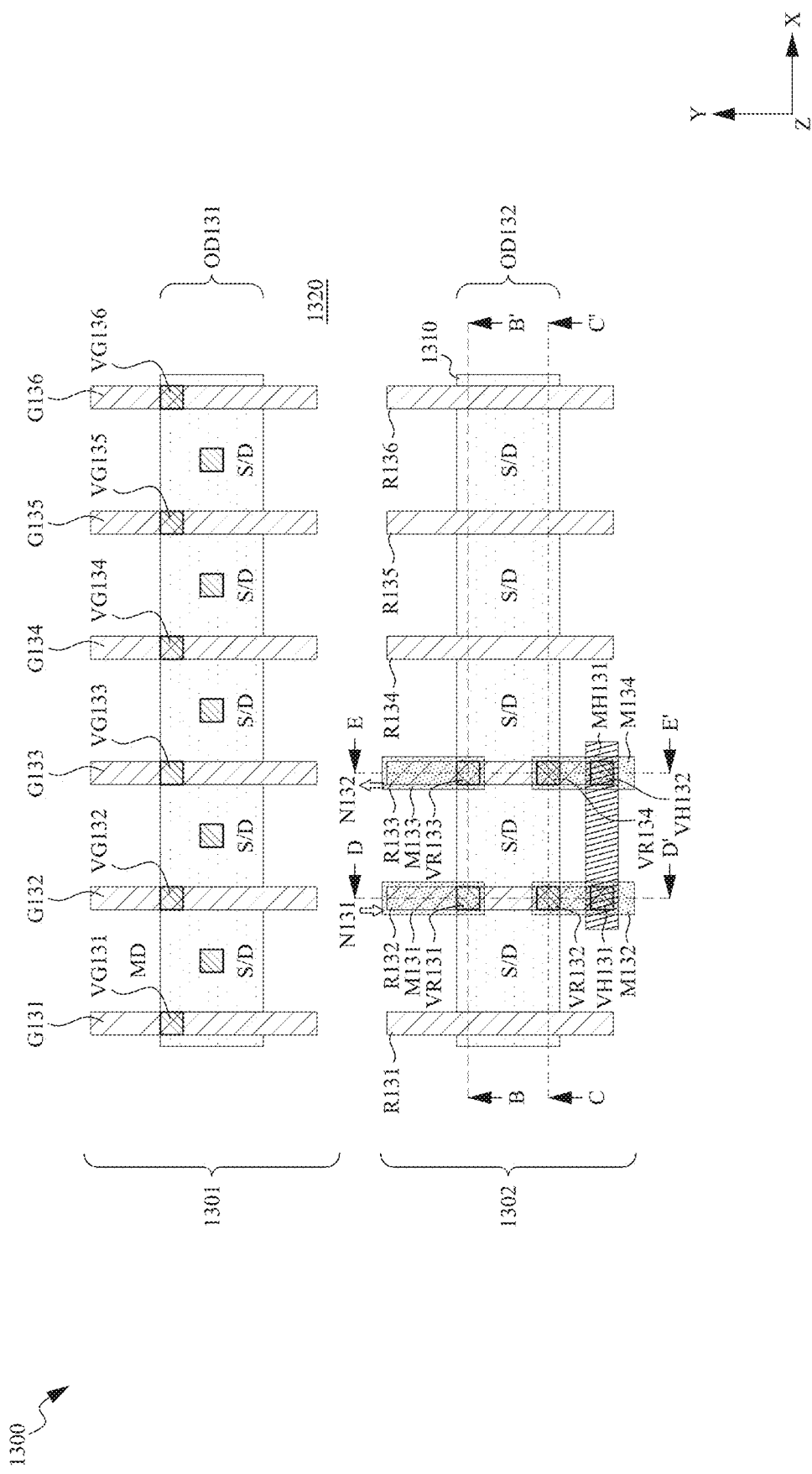
FIGS. 13A-13C illustrate different views of an integrated circuit in accordance with some embodiments of the present disclosure.
Figure 13B:
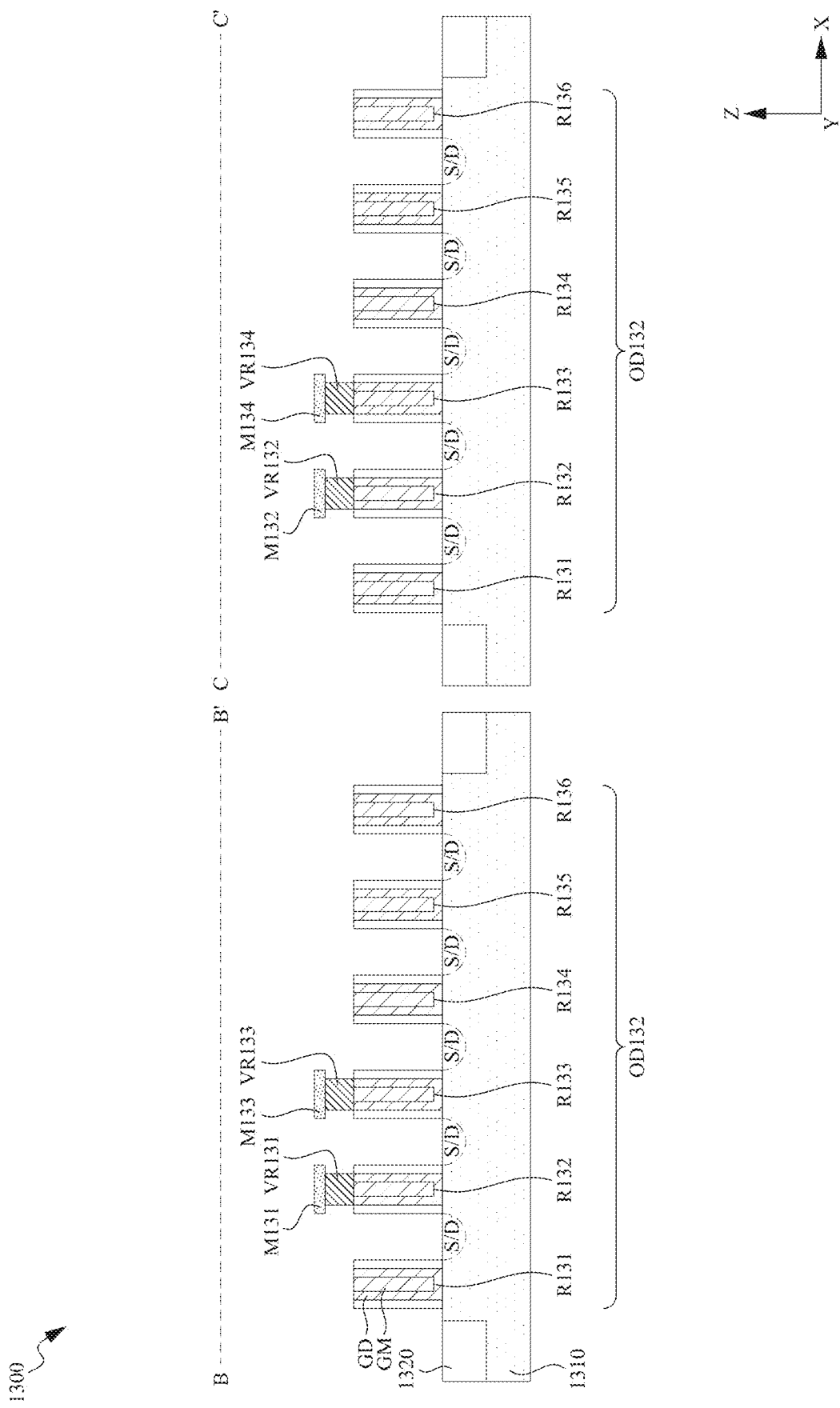
Figure 13C:
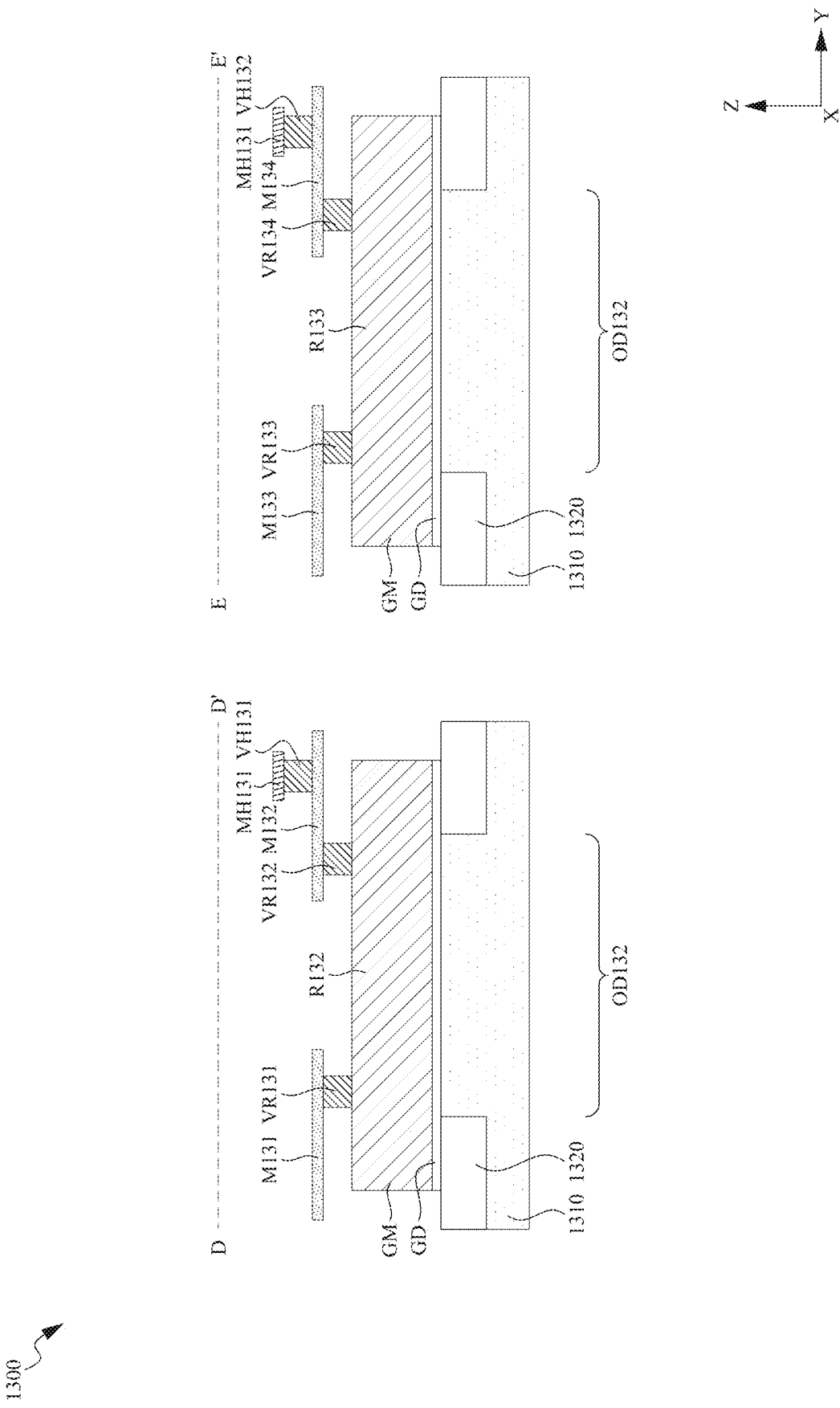

FIGS. 13A-13C illustrates a resistor circuit including lower metal lines extending parallel to the dummy gates and an upper metal line extending perpendicular to the dummy gates, in accordance with some embodiments. FIG. 13A illustrates a top view of an exemplary integrated circuit 1300 having a transistor region 1301 and a resistor region 1302 in accordance with some embodiments of the present disclosure. FIG. 13B illustrates a cross-sectional view of the integrated circuit 1300 in accordance with some embodiments, wherein the cross-sectional view combines a cross-sectional view obtained from the vertical plane containing line B-B' in FIG. 13A and a cross-sectional view obtained from the vertical plane containing line C-C' in FIG. 13A. FIG. 13C illustrates a cross-sectional view of the integrated circuit 1300 in accordance with some embodiments, wherein the cross-sectional view combines a cross-sectional view obtained from the vertical plane containing line D-D' in FIG. 13A and a cross-sectional view obtained from the vertical plane containing line E-E' in FIG. 13A. The integrated circuit 1300 is a non-limiting example for facilitating the illustration of the present disclosure.

The integrated circuit 1300 includes a substrate 1310 having an active region OD131 extending along the X-direction within the transistor region 1301 and a passive region OD132 extending along the X-direction within the resistor region 1302. The active region OD131 is separated and electrically insulated from the passive region OD132 by an STI region 1320. In some embodiments, example materials and configurations of the substrate 1310, OD131, OD132 and the STI region 1320 can be the same as that of the substrate 100, OD11, OD12 and the STI region 110 as described previously, and thus are not repeated for the sake of brevity.

The integrated circuit 1300 further includes metal gate structures G131, G132, G133, G134, G135 and G136 extending within the transistor region 1301 and across the active region OD131 along the Y-direction, and metal resistor structures R131, R132, R133, R134, R135 and R136 extending within the resistor region 1302 and across the passive region OD132 along the Y-direction. Example materials of the metal resistor structures R131-R136 and metal gate structures G131-G136 include high-k dielectric layer GD and gate metals GM similar to those discussed previously with respect to the metal resistor structures R11-R16 and metal gate structures G11-G16, and thus are not repeated for the sake of brevity.

The integrated circuit 1300 further includes a plurality of source/drain regions S/D in the active region OD131 and the passive region OD132. The source/drain regions S/D are doped semiconductor regions located on opposite sides of the corresponding metal gate structures G131-G136 and metal resistor structures R131-R136. In some embodiments, the source/drain regions S/D include dopants or impurities for forming functional FETs in the active region OD131 and non-functional or dummy FETs in the passive region OD132. Example materials and forming methods of the source/drain regions S/D are similar to those discussed previously with respect to FIG. 1A, and thus are not repeated for the sake of brevity.

In the depicted embodiment as illustrated in FIG. 13A, the integrated circuit 1300 further includes a plurality of source/drain contacts MD landing on the respective source/drain regions S/D within the active region OD131. In some embodiments, one or more of the source/drain regions S/D within the passive region OD132 do not include source/drain contacts landing on the corresponding one or more source/drain regions S/D within the passive region OD132. In some embodiments, the source/drain regions S/D in the passive region OD132 are not electrically coupled to the metal line(s) in the overlying interconnect structure. Therefore, the source/drain regions S/D within the passive region OD132 are electrically floating while the source/drain regions S/D within the active region OD131 are electrically coupled to metal lines in overlying interconnect structure (not shown for the sake of clarity) by using the source/drain contacts MD. As a result, the source/drain regions S/D in the active region OD131 form functional transistors (i.e., transistors functioned to create channels in the active region OD131) with the corresponding metal gate structures G131-G136, while the electrically floating source/drain regions S/D in the passive region OD132 form non-functional or dummy transistors (i.e., transistor-like structures not functioned to create channels in the passive region OD132) with the metal resistor structures R131-R136.

The integrated circuit 1300 further includes a plurality of gate contacts VG131, VG132, VG133, VG134, VG135 and VG136 over the corresponding metal gate structures G131-G136, respectively. The integrated circuit 1300 further includes resistor contacts VR131 and VR132 over the metal resistor structure R132, and resistor contacts VR133 and VR134 over the metal resistor structure R133. Example materials and forming methods of the gate contacts and resistor contacts of FIGS. 13A-13C are similar to those discussed previously with respect to FIG. 1A, and thus are not repeated for the sake of brevity.

The integrated circuit 1300 further includes a plurality of metal lines M131, M132, M133 and M134 on a level above the gate contacts VG131-VG136 and resistor contacts VR131-VR134. In some embodiments, the metal lines M131-M134 are on a M0 layer or M1 layer. Other metal layers are within the scope of the present disclosure. The metal lines M131-M134 extend along the Y-direction and thus are parallel with the metal resistor structures R131-R136. The metal line M131 extends along an upper section of the metal resistor structure R132. The resistor contact VR131 is located where the metal line M131 overlaps the metal resistor structure R132, thus providing an electrical connection between the metal line M131 and the metal resistor structure R132. The metal line M132 extends along a lower section of the metal resistor structure R132, and is electrically connected to the metal resistor structure R132 by the resistor contact VR132. The metal line M133 extends along an upper section of the metal resistor structure R133, and is electrically connected to the metal resistor structure R133 by the resistor contact VR133. The metal line M134 extends along a lower section of the metal resistor structure R133, and is electrically connected to the metal resistor structure R133 by the resistor contact VR134.

The integrated circuit 1300 further includes metal vias VH131 and VH132 on a level above the metal lines M131-M134, and a metal line MH131 on a level above the metal vias VH131 and VH132. In some embodiments, metal line MH131 is on a M1, M2, M3, M4, M5, M6, M7 or M8 layer. Other metal layers are within the scope of the present disclosure. The upper metal line MH131 extends along the X-direction and across both the lower metal lines M132 and M134. The metal via VH131 is between the upper metal line MH131 and the lower metal line M132, and provides an electrical connection between the metal line MH131 and the metal line M132. The metal via VH132 is between the upper metal line MH131 and the lower metal line M134, thus providing an electrical connection between the metal line MH131 and the metal line M134. In this configuration, the higher metal line MH131, the metal vias VH131, VH132, the lower metal lines M131-M134, the resistor contacts VR131-VR134, and the metal resistor structures R132-R133 are connected in series to form a resistor circuit having a first node N131 at the metal line M131 and a second node N132 at the metal line M133.

Figure 14:
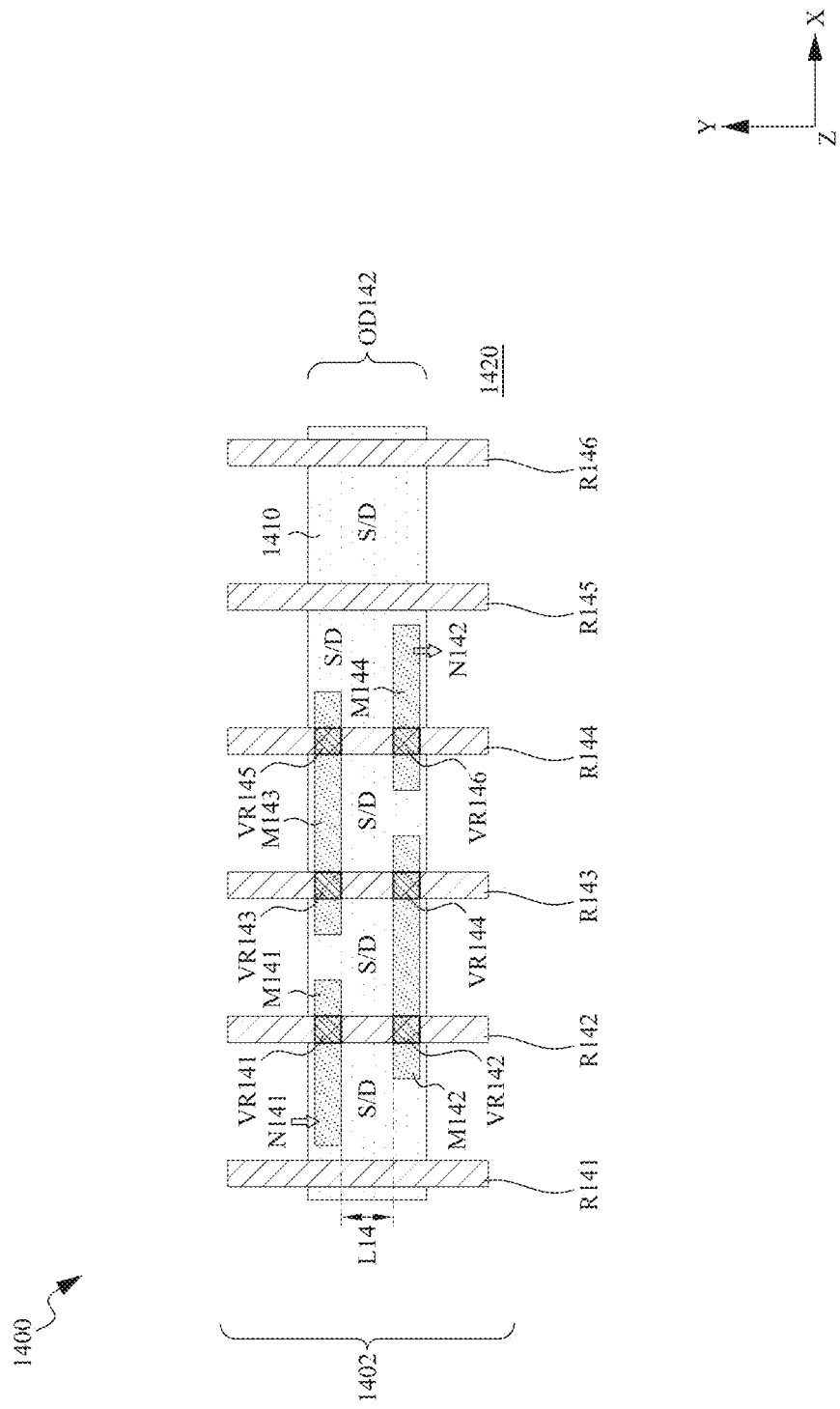
FIGS. 14 and 15 illustrate top views of different integrated circuits in accordance with some embodiments of the present disclosure.
Figure 15:
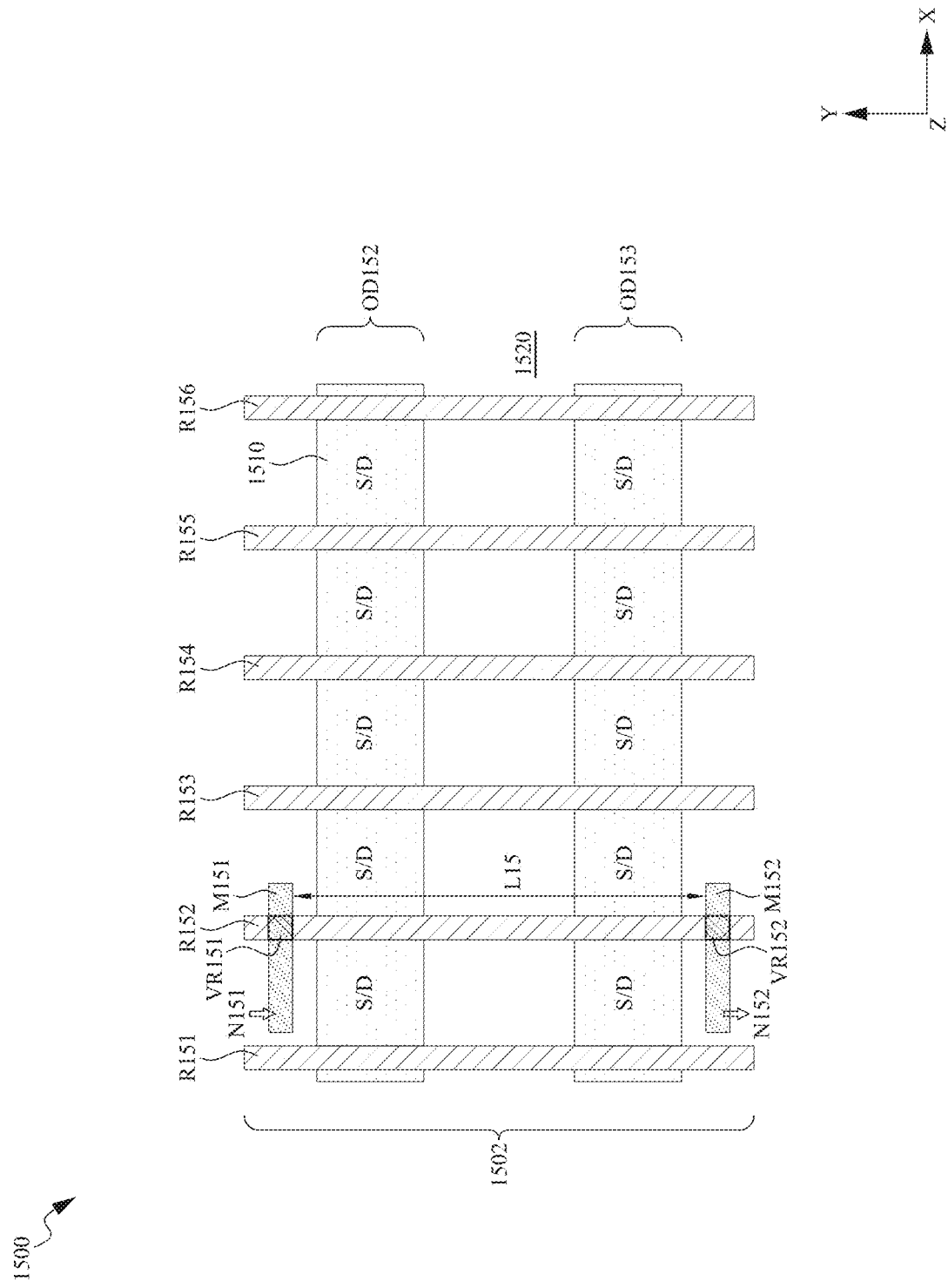

FIG. 14 illustrates a resistor circuit having dummy gate contacts overlapping the passive region and set back from upper and lower boundaries of the passive region, in accordance with some embodiments. FIG. 15 illustrates a resistor circuit including a single dummy gate and dummy gate contacts on STI. FIG. 14 illustrates a top view of an exemplary integrated circuit 1400 in accordance with some embodiments, and FIG. 15 illustrates a top view of an exemplary integrated circuit 1500 in accordance with some embodiments. FIGS. 14 and 15 are used to explain different dominant components in different resistor circuits.

As illustrated in FIG. 14, the integrated circuit 1400 includes a substrate 1410 having a passive region OD142 extending along the X-direction within the resistor region 1402. The passive region OD142 is defined by an STI region 1420. In some embodiments, example materials and configurations of the substrate 1410, OD 142 and the STI region 1420 can be the same as that of the substrate 100, OD12 and the STI region 110 as described previously, and thus are not repeated for the sake of brevity. The integrated circuit 1400 further includes metal resistor structures R141, R142, R143, R144, R145 and R146 extending within the resistor region 1402 and across the passive region OD142. The metal resistor structures R141-R146 each include a high-k dielectric material and one or more gate metals are similar to those discussed previously. The integrated circuit 1400 further includes source/drain regions S/D in the passive region OD142. In some embodiments, one or more of the source/drain regions S/D within the passive region OD142 do not include source/drain contacts landing on the corresponding one or more source/drain regions S/D within the passive region OD142. As a result, the source/drain regions S/D within the passive region OD142 are electrically floating, and are source/drain regions of non-functional or dummy transistors.

The integrated circuit 1400 further includes resistor contacts VR141 and VR142 over the metal resistor structure R142, resistor contacts VR143 and VR144 over the metal resistor structure R143, and resistor contacts VR145 and VR146 over the metal resistor structure R144.

The integrated circuit 1400 further includes metal lines M141, M142, M143 and M144 on a level above the resistor contacts VR141-VR146. In some embodiments, the metal lines M141-M143 are on a M0 layer or M1 layer. Other metal layers are within the scope of the present disclosure. The metal lines M141-M144 extend along the X-direction. The metal line M141 extends across an upper section of the metal resistor structure R142, and the resistor contact VR141 is between the metal line M141 and the metal resistor structure R142, thus providing an electrical connection between the metal line M141 and the metal resistor structure R142. The metal line M142 extends across both lower sections of the metal resistor structures R142 and R143, and is electrically connected to the metal resistor structure R142 by the resistor contact VR142 and to the metal resistor structure R143 by the resistor contact VR144. The metal line M143 extends across both upper sections of the metal resistor structures R143 and R144, and is electrically connected to the metal resistor structure R143 by the resistor contact VR143 and to the metal resistor structure R144 by the resistor contact VR145. The metal line M144 extends across a lower section of the metal resistor structure R144, and is electrically connected to the metal resistor structure R144 by the resistor contact VR146. The metal resistor structures R142-R144, the resistor contacts VR141-VR146, and the metal lines M141-M144 are connected in series to form a resistor circuit having a first node N141 at the metal line M141 and a second node N142 at the metal line M144.

Reference is made to FIG. 15. The integrated circuit 1500 includes a substrate 1510 having an upper passive region OD152 and a lower passive region OD153 extending along the X-direction within the resistor region 1502. The passive regions OD152 and OD153 are defined by an STI region 1520. In some embodiments, example materials and configurations of the substrate 1510, OD152, OD153 and the STI region 1520 can be the same as that of the substrate 100, OD11, OD12 and the STI region 110 as described previously, and thus are not repeated for the sake of brevity. The integrated circuit 1500 further includes metal resistor structures R151, R152, R153, R154, R155 and R156 extending within the resistor region 1502 and across both the passive regions OD152 and OD153. The metal resistor structures R151-R156 each include a high-k dielectric material and one or more gate metals are similar to those discussed previously. The integrated circuit 1500 further includes source/drain regions S/D in the passive regions OD152, OD153. In some embodiments, one or more of the source/drain regions S/D within the passive region OD152, OD153 do not include source/drain contacts landing on the corresponding one or more source/drain regions S/D within the passive region OD152, OD153. As a result, the source/drain regions S/D within the passive region OD152 are electrically floating, and are source/drain regions of non-functional or dummy transistors.

The integrated circuit 1500 further includes resistor contacts VR151 and VR152 over the metal resistor structure R152, and metal lines M151, M152 extending along the X-direction on a level above the resistor contacts R151 and VR152. In some embodiments, the metal lines M151-M152 are on a M0 layer or M1 layer. Other metal layers are within the scope of the present disclosure. The metal line M151 extends across an upper section of the metal resistor structure R152, and is electrically connected to the metal resistor structure R152 by the resistor contact VR151. The metal line M152 extends across a lower section of the metal resistor structure R152, and is electrically connected to the metal resistor structure R152 by the resistor contact VR152. The metal lines M151, M152, the resistor contacts VR151, VR152, and the metal resistor structure R152 are connected in series to form a resistor circuit having a first node N151 at the metal line M151 and a second node at the metal line M152.

As illustrated in FIGS. 14 and 15, the Y-directional distance L14 of FIG. 14 between upper-row resistor contacts VR141/VR143/VR145 and the lower-row resistor contacts VR142/VR144/VR146 is less than the Y-directional distance L15 of FIG. 15 between the resistor contacts VR151 and VR152, and thus the resistance of each of the metal resistor structures R142-R144 is lower than the resistance of the metal resistor structure R152. As a result, the resistances of the resistor contacts VR141-VR146 are the dominant resistances in the total resistance of the resistor circuit shown in FIG. 14, and the resistances of the metal resistor structure R152 is the dominant resistance in the total resistance of the resistor structure shown in FIG. 15.

Moreover, each of the resistor contacts VR141-VR146 overlap the passive region OD142, but both the resistor contacts VR151 and VR152 overlap the STI region 1520.

Therefore, in some embodiments, each of the resistor contacts VR141-VR146 may be different from each of the resistor contacts VR151 and VR152. By way of example and not limitation, in some embodiments, each of the resistor contacts VR141-VR146 may be lower than each of the resistor contacts VR151 and VR152. Based on the discussion about FIGS. 14 and 15, in some embodiments, locations of the resistor contacts can be selected depending on desired resistances of metal resistor structures as well as desired resistances of resistor contacts.

Figure 16:
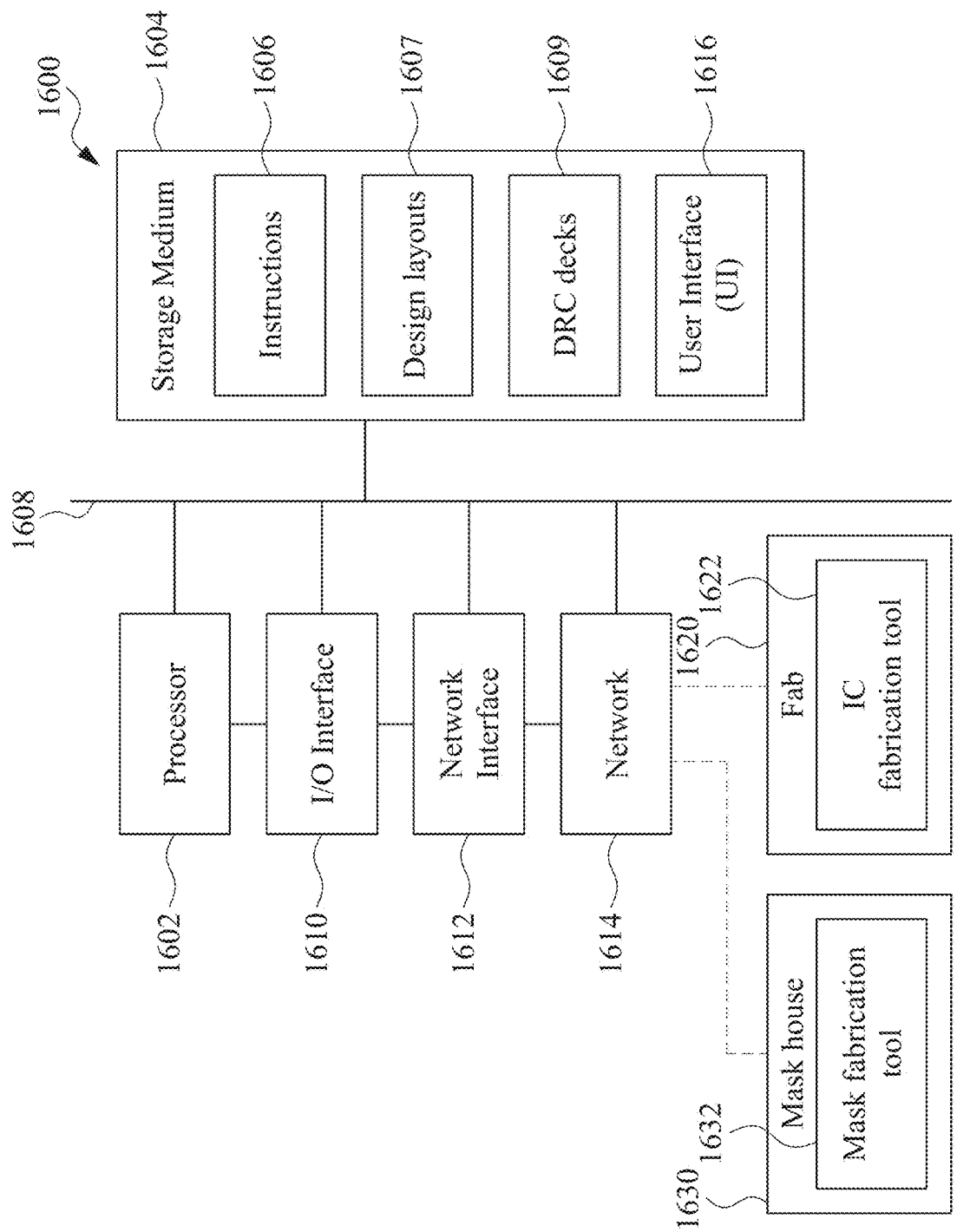
FIG. 16 is a schematic diagram of an electronic design automation (EDA) system in accordance with some embodiments of the present disclosure.

FIG. 16 is a schematic diagram of an electronic design automation (EDA) system 1600, in accordance with some embodiments. Methods described herein of generating design layouts, e.g., layouts of the integrated circuits 10, 20, 30, 40, 50, 60, 70, 80, 90, 1000, 1100, 1200, 1300, 1400 and/or 1500 with resistor circuits as discussed above, in accordance with one or more embodiments, are implementable, for example, using EDA system 1600, in accordance with some embodiments. At least integrated circuit 10, 20, 30, 40, 50, 60, 70, 80, 90, 1000, 1100, 1200, 1300, 1400 and/or 1500 is manufactured by a corresponding layout design similar to the corresponding integrated circuit. For brevity FIGS. 1A-15 are described as corresponding integrated circuits, but in some embodiments, FIGS. 1A-15 also correspond to layout designs with corresponding patterns similar to integrated circuit 10, 20, 30, 40, 50, 60, 70, 80, 90, 1000, 1100, 1200, 1300, 1400 and/or 1500 with corresponding structures, and pattern relationships including alignment, lengths and widths, as well as configurations and layers of a corresponding layout design are similar to the structural relationships and configurations and layers of the corresponding integrated circuit, and similar detailed description will not be described for brevity. In some embodiments, EDA system 1600 is a computing device that is capable of executing one or more automatic placement & routing (APR) operations. The EDA system 1600 including a hardware processor 1602 and a non-transitory, computer-readable storage medium 1604. Computer-readable storage medium 1604, amongst other things, is encoded with, i.e., stores, a set of executable instructions 1606, design layouts 1607, design rule check (DRC) decks 1609 or any intermediate data for executing the set of instructions. Each design layout 1607 comprises a graphical representation of an integrated chip, such as for example, a GSII file. Each DRC deck 1609 comprises a list of design rules specific to a semiconductor process chosen for fabrication of a design layout 1607. Execution of instructions 1606, design layouts 1607 and DRC decks 1609 by hardware processor 1602 represents (at least in part) an EDA tool which implements a portion or all of, e.g., the methods described herein in accordance with one or more (hereinafter, the noted processes and/or methods).

Processor 1602 is electrically coupled to computer-readable storage medium 1604 via a bus 1608. Processor 1602 is also electrically coupled to an I/O interface 1610 by bus 1608. A network interface 1612 is also electrically connected to processor 1602 via bus 1608. Network interface 1612 is connected to a network 1614, so that processor 1602 and computer-readable storage medium 1604 are capable of connecting to external elements via network 1614. Processor 1602 is configured to execute instructions 1606 encoded in computer-readable storage medium 1604 in order to cause EDA system 1600 to be usable for performing a portion or all of the noted processes and/or methods. In one or more embodiments, processor 1602 is a central processing unit (CPU), a multi-processor, a distributed processing system, an application specific integrated circuit (ASIC), and/or a suitable processing unit.

In one or more embodiments, computer-readable storage medium 1604 is an electronic, magnetic, optical, electromagnetic, infrared, and/or a semiconductor system (or apparatus or device). For example, computer-readable storage medium 1604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1604 includes a compact disk-read only memory (CD-ROM), a compact disk-read/write (CD-R/W), and/or a digital video disc (DVD).

In one or more embodiments, computer-readable storage medium 1604 stores instructions 1606, design layouts 1607 (e.g., layouts of the integrated circuits 10, 20, 30, 40, 50, 60, 70, 80, 90, 1000, 1100, 1200, 1300, 1400 and/or 1500 with resistor circuits as discussed previously) and DRC decks 1609 configured to cause EDA system 1600 (where such execution represents (at least in part) the EDA tool) to be usable for performing a portion or all of the noted processes and/or methods. In one or more embodiments, storage medium 1604 also stores information which facilitates performing a portion or all of the noted processes and/or methods.

EDA system 1600 includes I/O interface 1610. I/O interface 1610 is coupled to external circuitry. In one or more embodiments, I/O interface 1610 includes a keyboard, keypad, mouse, trackball, trackpad, touchscreen, and/or cursor direction keys for communicating information and commands to processor 1602.

EDA system 1600 also includes network interface 1612 coupled to processor 1602. Network interface 1612 allows EDA system 1600 to communicate with network 1614, to which one or more other computer systems are connected. Network interface 1612 includes wireless network interfaces such as BLUETOOTH, WIFI, WIMAX, GPRS, or WCDMA; or wired network interfaces such as ETHERNET, USB, or IEEE-1388. In one or more embodiments, a portion or all of noted processes and/or methods, is implemented in two or more EDA systems 1600.

EDA system 1600 is configured to receive information through I/O interface 1610. The information received through I/O interface 1610 includes one or more of instructions, data, design rules, libraries of standard cells, and/or other parameters for processing by processor 1602. The information is transferred to processor 1602 via bus 1608. EDA system 1600 is configured to receive information related to a user interface (UI) 1616 through I/O interface 1610. The information is stored in computer-readable medium 1604 as UI 1616.

Also illustrated in FIG. 16 are fabrication tools associated with the EDA system 1600. For example, a mask house 1630 receives a design layout from the EDA system 1600 by, for example, the network 1614, and the mask house 1630 has a mask fabrication tool 1632 (e.g., a mask writer) for fabricating one or more photomasks (e.g., photomasks used for fabricating integrated circuits 10, 20, 30, 40, 50, 60, 70, 80, 90, 1000, 1100, 1200, 1300, 1400 and/or 1500 with resistor circuits as discussed above) based on the design layout generated from the EDA system 1600. An IC fabricator ("Fab") 1620 may be connected to the mask house 1630 and the EDA system 1600 by, for example, the network 1614. Fab 1620 includes an IC fabrication tool 1622 for fabricating IC chips (e.g., layouts of the integrated circuits 10, 20, 30, 40, 50, 60, 70, 80, 90, 1000, 1100, 1200, 1300, 1400 and/or 1500 with resistor circuits as discussed above) using the photomasks fabricated by the mask house 1630. By way of example and not limitation, the IC fabrication tool 1622 includes one or more cluster tools for fabricating IC chips. The cluster tool may be a multiple reaction chamber type composite equipment which includes a polyhedral transfer chamber with a wafer handling robot inserted at the center thereof, a plurality of process chambers (e.g., CVD chamber, PVD chamber, etching chamber, annealing chamber or the like) positioned at each wall face of the polyhedral transfer chamber; and a loadlock chamber installed at a different wall face of the transfer chamber.

Figure 17:
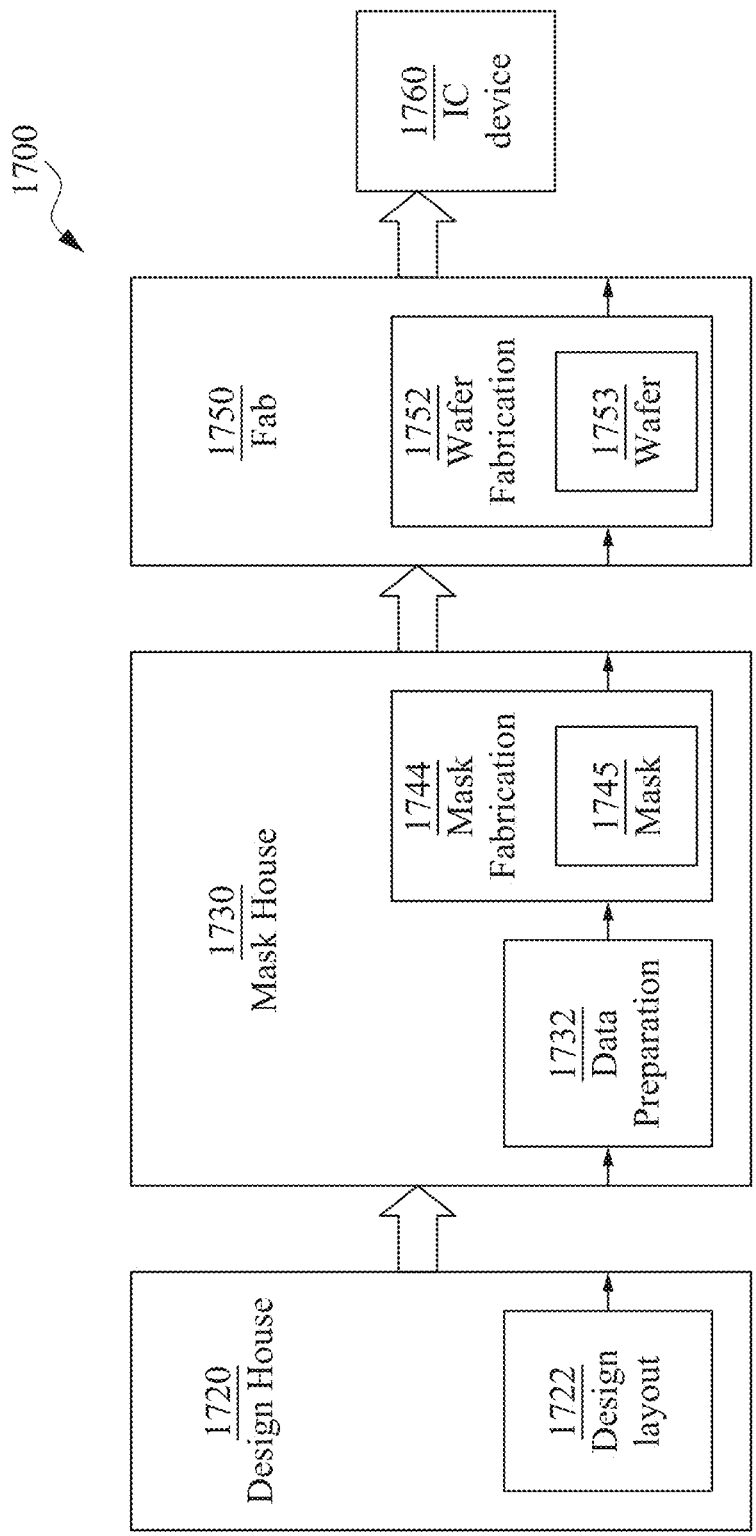
FIG. 17 is a block diagram of an IC manufacturing system and an IC manufacturing flow associated therewith, in accordance with some embodiments of the present disclosure.

FIG. 17 is a block diagram of an IC manufacturing system 1700, and an IC manufacturing flow associated therewith, in accordance with some embodiments. In some embodiments, based on one or more design layouts, e.g., layouts of the integrated circuits 10, 20, 30, 40, 50, 60, 70, 80, 90, 1000, 1100, 1200, 1300, 1400 and/or 1500 with resistor circuits as discussed above, one or more photomasks and one or more integrated circuits are fabricated using manufacturing system 1700.

In FIG. 17, an IC manufacturing system 1700 includes entities, such as a design house 1720, a mask house 1730, and a Fab 1750, that interact with one another in the design, development, and manufacturing cycles and/or services related to manufacturing ICs 1760. The entities in IC manufacturing system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and Fab 1750 is owned by a single larger company. In some embodiments, two or more of design house 1720, mask house 1730, and Fab 1750 coexist in a common facility and use common resources.

Design house (or design team) 1720 generates design layouts 1722 (e.g., layouts of the integrated circuits 10, 20, 30, 40, 50, 60, 70, 80, 90, 1000, 1100, 1200, 1300, 1400 and/or 1500 with resistor circuits as discussed above). Design layouts 1722 include various geometrical patterns designed for ICs 1760 (e.g., integrated circuits 10, 20, 30, 40, 50, 60, 70, 80, 90, 1000, 1100, 1200, 1300, 1400 and/or 1500 with resistor circuits as discussed above). The geometrical patterns correspond to patterns of metal, oxide, or semiconductor layers that make up the various components of ICs 1760 to be fabricated. The various layers combine to form various device features. For example, a portion of design layout 1722 includes various circuit features, such as active regions, passive regions, functional gate structures, resistor structures, gate contacts, resistor contacts, source/drain contacts, and/or metal lines, to be formed on a semiconductor wafer. Design house 1720 implements a proper design procedure to form design layout 1722. The design procedure includes one or more of logic design, physical design or place and route. Design layout 1722 is presented in one or more data files having information of the geometrical patterns and a netlist of various nets. For example, design layout 1722 can be expressed in a GDSII file format or DFII file format.

Mask house 1730 includes data preparation 1732 and mask fabrication 1744. Mask house 1730 uses design layout 1722 (e.g., layout of the integrated circuit 10, 20, 30, 40, 50, 60, 70, 80, 90, 1000, 1100, 1200, 1300, 1400 or 1500 as discussed above) to manufacture one or more photomasks 1745 to be used for fabricating the various layers of IC 1760 according to design layout 1722. Mask house 1730 performs mask data preparation 1732, where design layout 1722 is translated into a representative data file ("RDF"). Mask data preparation 1732 provides the RDF to mask fabrication 1744. Mask fabrication 1744 includes a mask writer. A mask writer converts the RDF to an image on a substrate, such as a photomask (reticle) 1745. Design layout 1722 is manipulated by mask data preparation 1732 to comply with particular characteristics of the mask writer and/or rules of fab 1750. In FIG. 17, mask data preparation 1732 and mask fabrication 1744 are illustrated as separate elements. In some embodiments, mask data preparation 1732 and mask fabrication 1744 can be collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts design layout 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks design layout 1722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies design layout 1722 diagram to compensate for limitations during mask fabrication 1744, which may undo part of the modifications performed by OPC in order to meet mask creation rules.

In some embodiments, mask data preparation 1732 includes lithography process checking (LPC) that simulates processing that will be implemented by Fab 1750 to fabricate ICs 1760. LPC simulates this processing based on design layout 1722 to create a simulated manufactured integrated circuit, such as IC 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine design layout 1722.

After mask data preparation 1732 and during mask fabrication 1744, a photomask 1745 or a group of photomasks 1745 are fabricated based on the design layout 1722. In some embodiments, mask fabrication 1744 includes performing one or more lithographic exposures based on the design layout 1722. In some embodiments, an electron-beam (e-beam) or a mechanism of multiple e-beams is used to form a pattern on a photomask 1745 based on design layout 1722. Photomask 1745 can be formed in various technologies. In some embodiments, photomask 1745 is formed using binary technology. In some embodiments, a mask pattern includes opaque regions and transparent regions. A radiation beam, such as an ultraviolet (UV) beam, used to expose the radiation sensitive material layer (e.g., photoresist) which has been coated on a wafer, is blocked by the opaque regions and transmits through the transparent regions. In one example, a binary mask version of photomask 1745 includes a transparent substrate (e.g., fused quartz) and an opaque material (e.g., chromium) coated in the opaque regions of the binary mask. In another example, photomask 1745 is formed using a phase shift technology. In a phase shift mask (PSM) version of photomask 1745, various features in the pattern formed on the phase shift photomask are configured to have proper phase difference to enhance the resolution and imaging quality. In various examples, the phase shift photomask can be attenuated PSM or alternating PSM. The photomask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1753, and/or in other suitable processes.

Fab 1750 includes wafer fabrication 1752. Fab 1750 is an IC fabrication business that includes one or more manufacturing facilities for the fabrication of a variety of different IC products. In some embodiments, Fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (BEOL fabrication), and a third manufacturing facility may provide other services for the foundry business.

Fab 1750 uses photomask(s) 1745 fabricated by mask house 1730 to fabricate ICs 1760. Thus, fab 1750 at least indirectly uses design layout(s) 1722 (e.g., layouts of the integrated circuits 10, 20, 30, 40, 50, 60, 70, 80, 90, 1000, 1100, 1200, 1300, 1400 and/or 1500 with resistor circuits as discussed above) to fabricate ICs 1760. In some embodiments, wafer 1753 is processed by fab 1750 using photomask(s) 1745 to form ICs 1760. In some embodiments, the device fabrication includes performing one or more photolithographic exposures based at least indirectly on design layout 1722.

Figure 18:
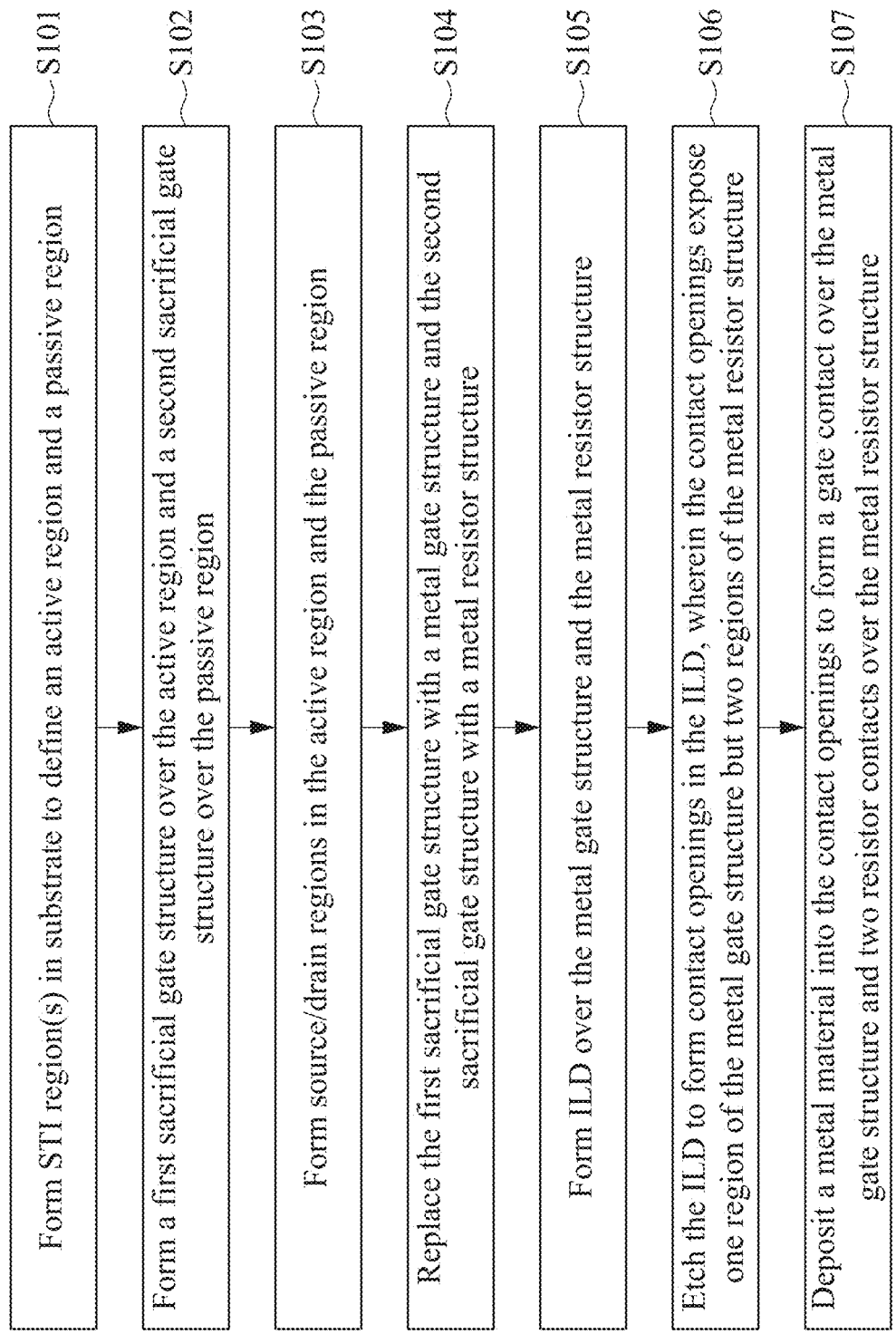
FIG. 18 is a flow chart illustrating a method of forming an integrated circuit structure in accordance with some embodiments of the present disclosure.

FIG. 18 is a flow chart illustrating a method 1800 of forming an integrated circuit structure in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. In some embodiments, method 1800 is useable to form an integrated circuit, such as integrated circuits 10, 20, 30, 40, 50, 60, 70, 80, 90, 1000, 1100, 1200, 1300, 1400 and/or 1500 with resistor circuits as discussed above.

At operation S101 of method 1800, STI region(s) is formed in substrate to define an active region and a passive region. FIG. 1F illustrates a cross-sectional view according to some embodiments of operation S101.

At operation S102 of method 1800, a first sacrificial gate structure is formed over the active region, and a second sacrificial gate structure over the passive region. FIG. 1G illustrates a cross-sectional view according to some embodiments of operation S102.

At operation S103 of method 1800, source/drain regions are formed in the active region and the passive region. FIG. 1I illustrates a cross-sectional view according to some embodiments of operation S103.

At operation S104 of method 1800, the first sacrificial gate structure is replaced with a metal gate structure, and the second sacrificial gate structure is replaced with a metal resistor structure. FIG. 1J illustrates a cross-sectional view according to some embodiments of operation S104.

At operation S105 of method 1800, ILD is formed over the metal gate structure and the metal resistor structure.

At operation S106 of method 1800, the ILD is etched to form contact openings in the ILD, wherein the contact openings expose one region of the metal gate structure but two regions of the metal resistor structure.

At operation S107 of method 1800, metal material is deposited into the contact openings to form a gate contact over the metal gate structure and two resistor contacts over the metal resistor structure. FIG. 1K illustrates a cross-sectional view according to some embodiments of operations S105-S107. FIG. 1A illustrates a top view of the resultant gate contact and resistor contacts according to some embodiments of operation S107.

In some embodiments, a method includes forming an STI region in a semiconductor substrate to define an active region and a passive region in the semiconductor substrate and spaced apart each other by the STI region; forming a first sacrificial gate structure over the active region and a second sacrificial gate structure over the passive region; forming first source/drain regions in the active region and second source/drain regions in the passive region; after forming the first and second source/drain regions, replacing the first sacrificial gate structure with a metal gate structure and the second sacrificial gate structure with a metal resistor structure; forming an ILD layer over the metal gate structure and the metal resistor structure; etching the ILD layer to form contact openings in the ILD layer, wherein the contact openings expose one region of the meal gate structure but two regions of the metal resistor structure; and depositing a metal material into the contact openings to form a gate contact over the metal gate structure and two resistor contacts over the metal resistor structure.

In some embodiments, a method includes forming a first sacrificial gate structure over an active region in a semiconductor substrate and a second sacrificial gate structure over a passive region, forming first source/drain regions in the active region and second source/drain regions in the passive region, after forming the first and second source/drain regions, replacing the first sacrificial gate structure with a metal gate structure and the second sacrificial gate structure with a metal resistor structure, the metal resistor structure corresponding to a dummy gate, forming a first interlayer dielectric (ILD) layer over the metal gate structure and the metal resistor structure, etching the first ILD layer to form contact openings in the ILD layer, wherein the contact openings expose one region of the metal gate structure and two regions of the metal resistor structure, and depositing a metal material into the contact openings to form a gate contact over the metal gate structure and two resistor contacts over the metal resistor structure.

In some embodiments, a method includes forming a shallow trench isolation (STI) region in a semiconductor substrate thereby defining an active region and a passive region in the semiconductor substrate and spaced apart from each other by the STI region, forming a first sacrificial gate structure over the active region and a second sacrificial gate structure over the passive region, forming first source/drain regions in the active region and second source/drain regions in the passive region, after forming the first and second source/drain regions, replacing the first sacrificial gate structure with a metal gate structure and the second sacrificial gate structure with a metal resistor structure, the metal resistor structure corresponding to a dummy gate, forming a first gate contact over the metal gate structure, and a pair of resistor contacts over the metal resistor structure, and electrically coupling a set of metal lines with the metal resistor structure by the pair of resistor contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a shallow trench isolation (STI) region in a semiconductor substrate to define an active region and a passive region in the semiconductor substrate and spaced apart from each other by the STI region;
forming a first sacrificial gate structure over the active region and a second sacrificial gate structure over the passive region;
forming first source/drain regions in the active region and second source/drain regions in the passive region;
after forming the first and second source/drain regions, replacing the first sacrificial gate structure with a metal gate structure and the second sacrificial gate structure with a metal resistor structure, the metal resistor structure corresponding to a dummy gate;
forming an interlayer dielectric (ILD) layer over the metal gate structure and the metal resistor structure;
etching the ILD layer to form contact openings in the ILD layer, wherein the contact openings expose one region of the metal gate structure but two regions of the metal resistor structure; and
depositing a metal material into the contact openings to form a gate contact over the metal gate structure and two resistor contacts over the metal resistor structure.

2. The method of claim 1, further comprising:
forming source/drain contacts on the first source/drain regions but not on the second source/drain regions.

3. The method of claim 1, further comprising:
forming a first metal line over a first one of the two resistor contacts and a second metal line over a second one of the two resistor contacts.

4. The method of claim 1, wherein after forming the first and second source/drain regions, replacing the first sacrificial gate structure with the metal gate structure and the second sacrificial gate structure with the metal resistor structure comprises:
forming a single continuous metal gate strip extending along a first direction, and overlapping the active region and the passive region; and
performing a gate cut process on the single continuous metal gate strip thereby forming the metal gate structure and the metal resistor structure.

5. The method of claim 4, wherein the performing the gate cut process on the single continuous metal gate strip thereby forming the metal gate structure and the metal resistor structure comprises:
etching the single continuous metal gate strip.

6. The method of claim 1, wherein the two resistor contacts are formed of tungsten or copper.

7. The method of claim 1, wherein the metal resistor structure comprises a high-k dielectric layer and a metal structure over the high-k dielectric layer.

8. The method of claim 7, wherein the metal gate structure comprises a high-k gate dielectric layer, and the high-k gate dielectric layer is formed of a same material as the high-k dielectric layer of the metal resistor structure.

9. The method of claim 7, wherein the high-k dielectric layer lines a bottom surface and opposite sidewalls of the metal structure.

10. The method of claim 7, wherein the high-k dielectric layer of the metal resistor structure has a U-shaped cross section.

11. A method, comprising:
forming a first sacrificial gate structure over an active region in a semiconductor substrate and a second sacrificial gate structure over a passive region;
forming first source/drain regions in the active region and second source/drain regions in the passive region;
after forming the first and second source/drain regions, replacing the first sacrificial gate structure with a metal gate structure and the second sacrificial gate structure with a metal resistor structure, the metal resistor structure corresponding to a dummy gate;
forming a first interlayer dielectric (ILD) layer over the metal gate structure and the metal resistor structure;
etching the first ILD layer to form contact openings in the ILD layer, wherein the contact openings expose one region of the metal gate structure and two regions of the metal resistor structure; and
depositing a metal material into the contact openings to form a gate contact over the metal gate structure and two resistor contacts over the metal resistor structure.

12. The method of claim 11, further comprising:
forming source/drain contacts on the first source/drain regions but not on the second source/drain regions.

13. The method of claim 11, further comprising:
forming a second ILD layer over the two resistor contacts and the gate contact.

14. The method of claim 13, further comprising:
forming a first metal line in the second ILD layer over a first one of the two resistor contacts and a second metal line over a second one of the two resistor contacts.

15. The method of claim 14, further comprising:
removing, by a planarization process, a top surface of the metal material from above a top surface of the second ILD layer.

16. A method, comprising:
forming a shallow trench isolation (STI) region in a semiconductor substrate thereby defining an active region and a passive region in the semiconductor substrate and spaced apart from each other by the STI region;

forming a first sacrificial gate structure over the active region and a second sacrificial gate structure over the passive region;

forming first source/drain regions in the active region and second source/drain regions in the passive region;

after forming the first and second source/drain regions, replacing the first sacrificial gate structure with a metal gate structure and the second sacrificial gate structure with a metal resistor structure, the metal resistor structure corresponding to a dummy gate;

forming a first gate contact over the metal gate structure, and a pair of resistor contacts over the metal resistor structure; and electrically coupling a set of metal lines with the metal resistor structure by the pair of resistor contacts;

wherein forming the first gate contact over the metal gate structure, and the pair of resistor contacts over the metal resistor structure comprises:
  forming an interlayer dielectric (ILD) layer over the metal gate structure and the metal resistor structure;
  etching the ILD layer thereby forming contact openings in the ILD layer, wherein the contact openings expose one region of the metal gate structure and two regions of the metal resistor structure; and
  depositing a metal material into the contact openings thereby forming the first gate contact over the metal gate structure and the pair of resistor contacts over the metal resistor structure.

17. The method of claim 16, further comprising:
  forming source/drain contacts on the first source/drain regions but not on the second source/drain regions.

18. The method of claim 16, wherein electrically coupling the set of metal lines with the metal resistor structure by the pair of resistor contacts comprises:
  forming a first metal line of the set of metal lines over a first one of the pair of resistor contacts and a second metal line of the set of metal lines over a second one of the pair of resistor contacts.

19. The method of claim 16, wherein after forming the first and second source/drain regions, replacing the first sacrificial gate structure with the metal gate structure and the second sacrificial gate structure with the metal resistor structure comprises:
  forming a single continuous metal gate strip extending along a first direction, and overlapping the active region and the passive region; and
  etching the single continuous metal gate strip thereby forming the metal gate structure and the metal resistor structure.

20. The method of claim 16, wherein the pair of resistor contacts are formed of tungsten or copper.

* * * * *